(12) United States Patent
Park et al.

(10) Patent No.: US 11,239,394 B2
(45) Date of Patent: Feb. 1, 2022

(54) SEMICONDUCTOR DEVICE AND DISPLAY DEVICE INCLUDING THE SAME

(71) Applicant: LG INNOTEK CO., LTD., Seoul (KR)

(72) Inventors: Sun Woo Park, Seoul (KR); Myung Ho Han, Seoul (KR); Hyeon Min Cho, Seoul (KR); June O Song, Seoul (KR); Chung Song Kim, Seoul (KR); Ji Hyung Moon, Seoul (KR); Sang Youl Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 259 days.

(21) Appl. No.: 16/085,930

(22) PCT Filed: Mar. 17, 2017

(86) PCT No.: PCT/KR2017/002903
§ 371 (c)(1),
(2) Date: Sep. 17, 2018

(87) PCT Pub. No.: WO2017/160119
PCT Pub. Date: Sep. 21, 2017

(65) Prior Publication Data
US 2020/0127173 A1    Apr. 23, 2020

(30) Foreign Application Priority Data

Mar. 18, 2016   (KR) .......................... 10-2016-0032819
Jun. 9, 2016    (KR) .......................... 10-2016-0071810
Jun. 21, 2016   (KR) .......................... 10-2016-0077444

(51) Int. Cl.
*H01L 33/50*         (2010.01)
*H01L 25/075*        (2006.01)
(Continued)

(52) U.S. Cl.
CPC ........ *H01L 33/504* (2013.01); *H01L 25/0753* (2013.01); *H01L 33/28* (2013.01);
(Continued)

(58) Field of Classification Search
CPC ......... H01L 33/52; H01L 33/12; H01L 33/32; H01L 33/62; H01L 33/28; H01L 33/504; H01L 33/405; H01L 25/0753
See application file for complete search history.

(56) References Cited

U.S. PATENT DOCUMENTS 6,366,018 B1 *   4/2002  Garbuzov ............... H01L 33/50
                                                         313/542
9,236,526 B2 *   1/2016  Choi ..................... H01L 33/145
(Continued)

FOREIGN PATENT DOCUMENTS

JP          3758562 B2     3/2006
KR     10-2010-0055747 A    5/2010
(Continued)

*Primary Examiner* — Vongsavanh Sengdara
(74) *Attorney, Agent, or Firm* — Birch, Stewart, Kolasch & Birch, LLP

(57) ABSTRACT

Disclosed herein is a semiconductor device including a light emitting structure including a first conductive type semiconductor layer, a plurality of active layers disposed to be spaced apart on the first conductive type semiconductor layer, and a plurality of second conductive type semiconductor layers disposed on the plurality of active layers, respectively, a first electrode electrically connected to the first conductive type semiconductor layer, and a plurality of second electrodes electrically connected to the plurality of second conductive type semiconductor layers, respectively, wherein the plurality of active layers include a first active layer, a second active layer, and a third active layer, the light emitting structure includes a first light emitter including the first active layer, a second light emitter including the second active layer, and a third light emitter including the third
(Continued)

active layer, the first active layer emits light in a blue wavelength band, the second active layer emits light in a green wavelength band, and a height of the second active layer differs from a height of the first active layer.

17 Claims, 80 Drawing Sheets

(51) Int. Cl.
    *H01L 33/28*     (2010.01)
    *H01L 33/32*     (2010.01)
    *H01L 33/40*     (2010.01)
    *H01L 33/52*     (2010.01)
    *H01L 33/62*     (2010.01)

(52) U.S. Cl.
    CPC ............ *H01L 33/32* (2013.01); *H01L 33/405* (2013.01); *H01L 33/52* (2013.01); *H01L 33/62* (2013.01)

(56) References Cited

U.S. PATENT DOCUMENTS

| | | | | |
|---|---|---|---|---|
| 2001/0050531 | A1* | 12/2001 | Ikeda | G11B 7/1275 313/498 |
| 2005/0179027 | A1* | 8/2005 | Kim | B82Y 20/00 257/14 |
| 2006/0284195 | A1* | 12/2006 | Nagai | H01L 33/10 257/98 |
| 2008/0272712 | A1* | 11/2008 | Jalink | H01L 27/153 315/291 |
| 2010/0123145 | A1* | 5/2010 | Lee | H01L 27/153 257/89 |
| 2011/0272712 | A1 | 11/2011 | Jeong et al. | |
| 2012/0273816 | A1 | 11/2012 | Yoshida et al. | |
| 2013/0277642 | A1* | 10/2013 | Kneissl | H01L 33/06 257/13 |

FOREIGN PATENT DOCUMENTS

| | | |
|---|---|---|
| KR | 10-2011-0123118 A | 11/2011 |
| KR | 10-2014-0083488 A | 7/2014 |

* cited by examiner

[FIG. 1]
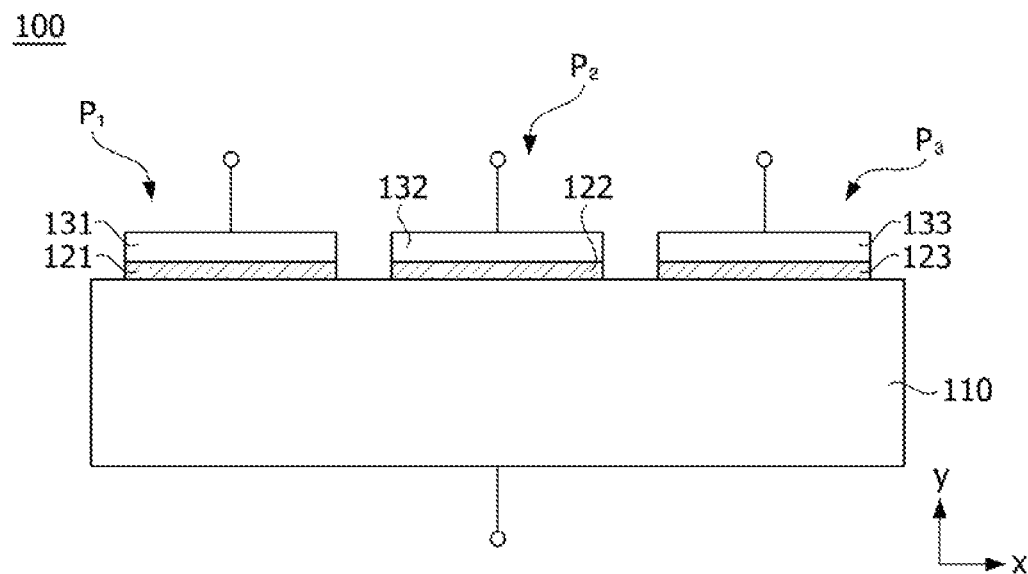
[FIG. 2]
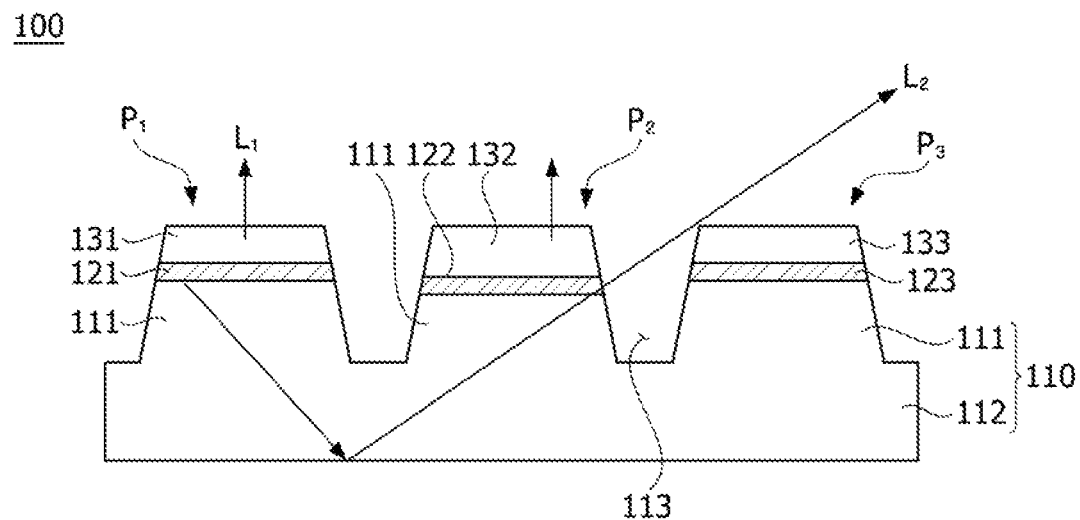

[FIG. 3]
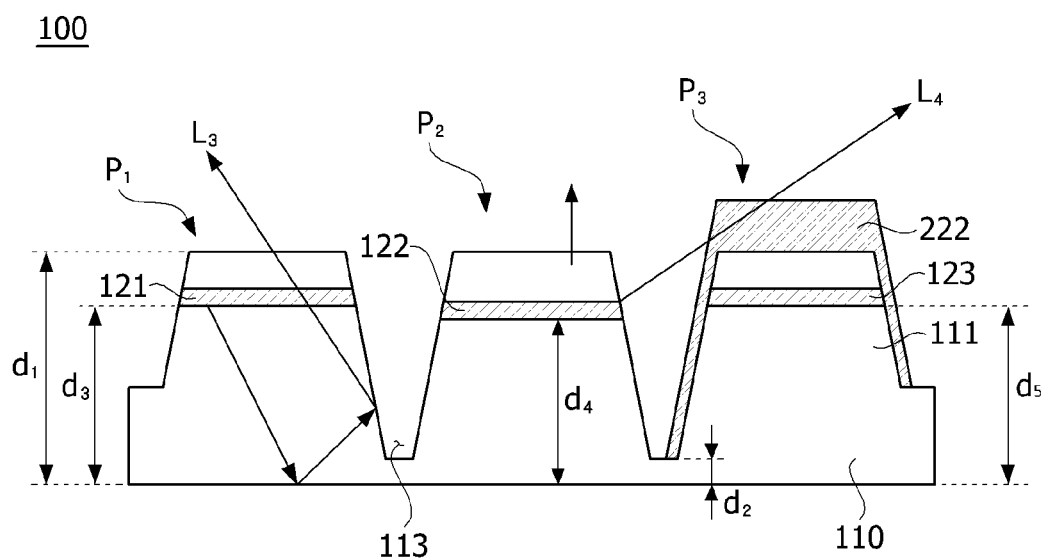
[FIG. 4]
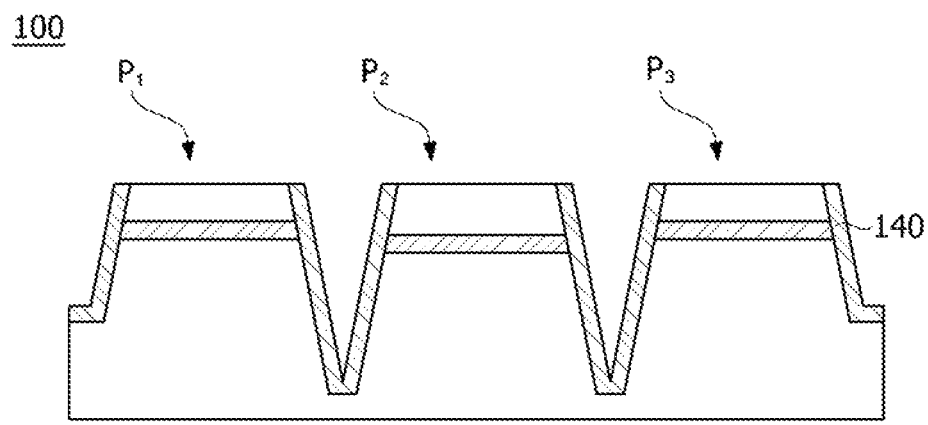

[FIG. 5]
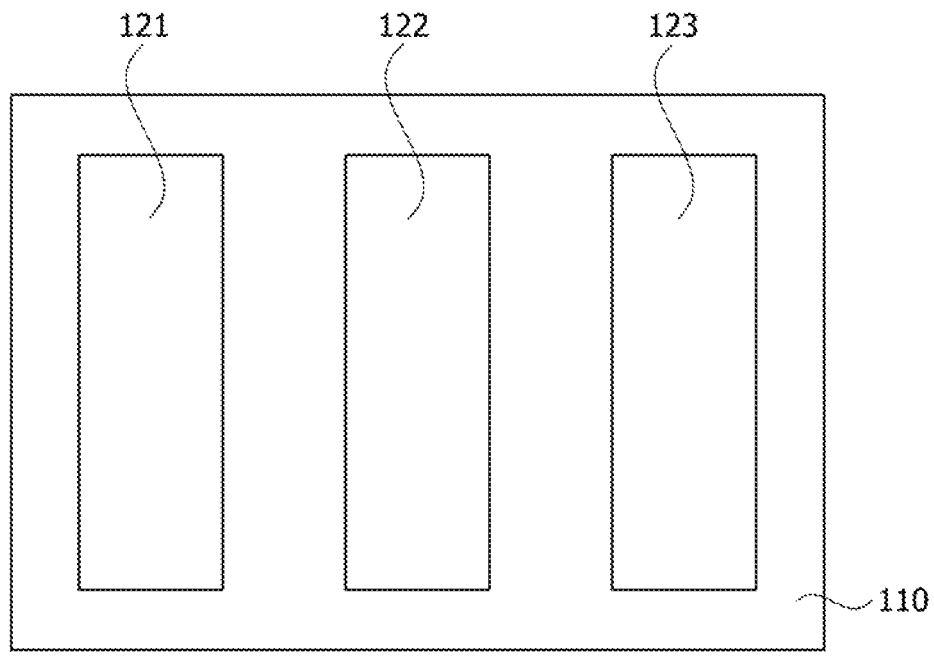
[FIG. 6A]
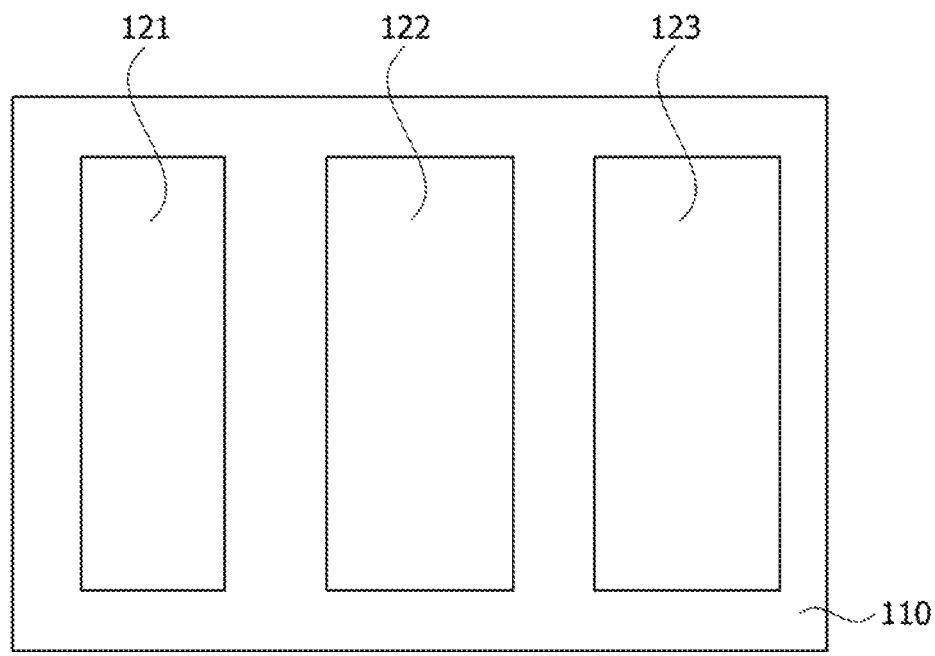

[FIG. 6B]
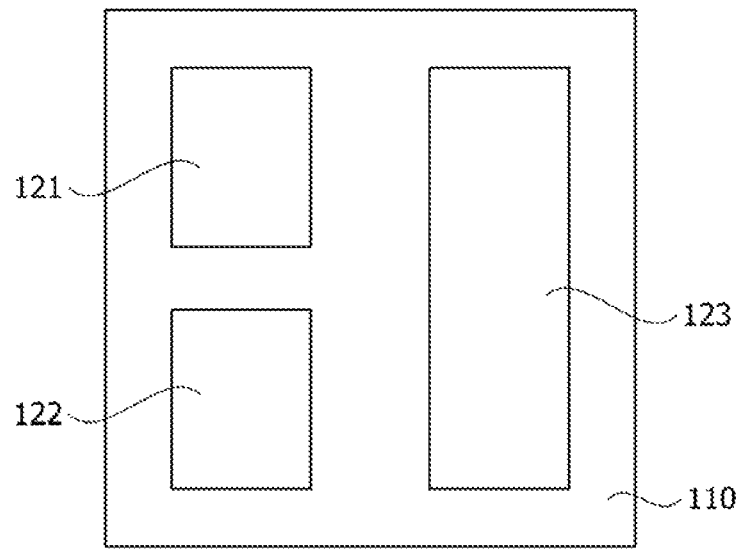
[FIG. 6C]
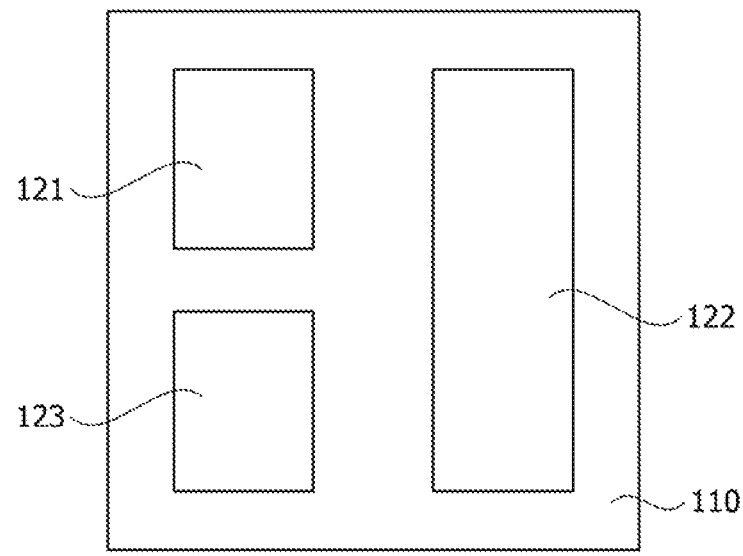

[FIG. 7A]
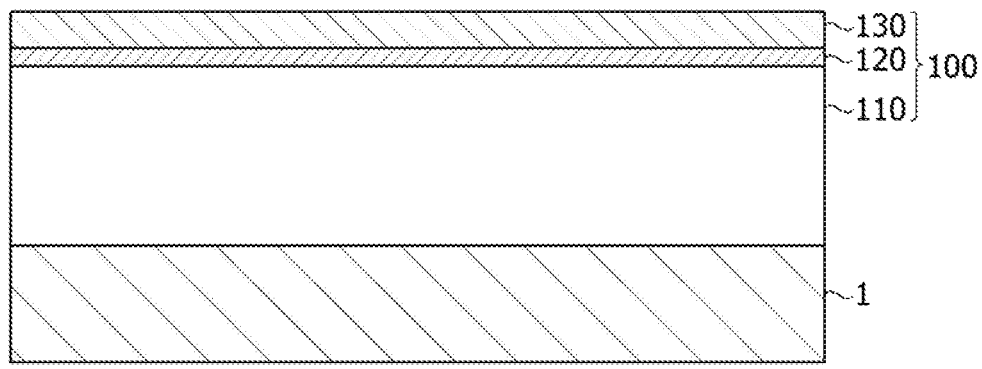
[FIG. 7B]
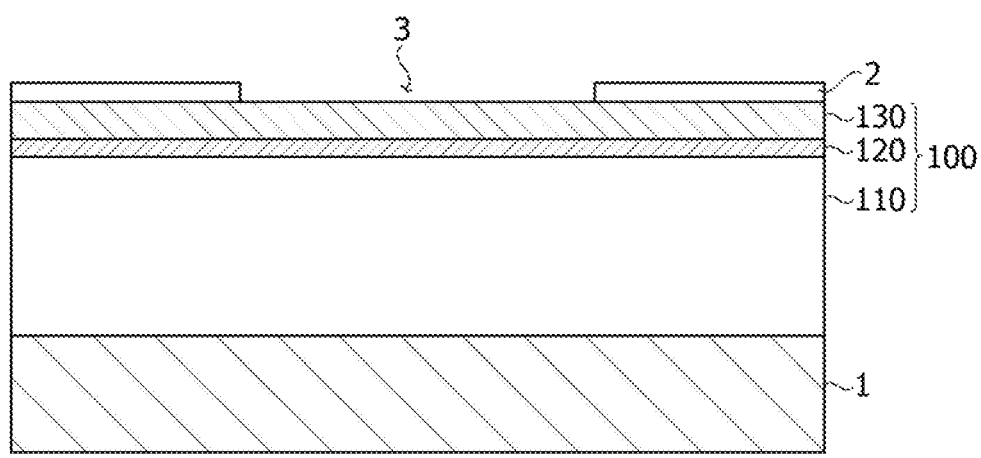

【FIG. 7C】
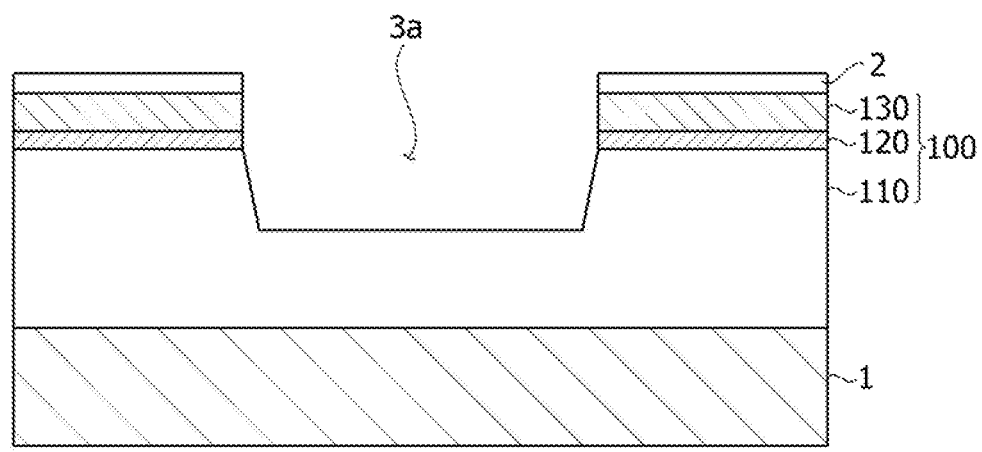
【FIG. 7D】
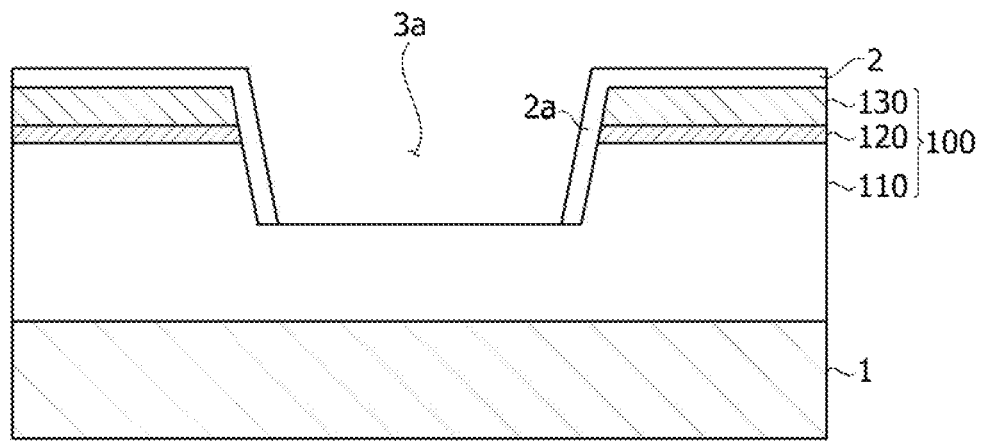

[FIG. 7E]
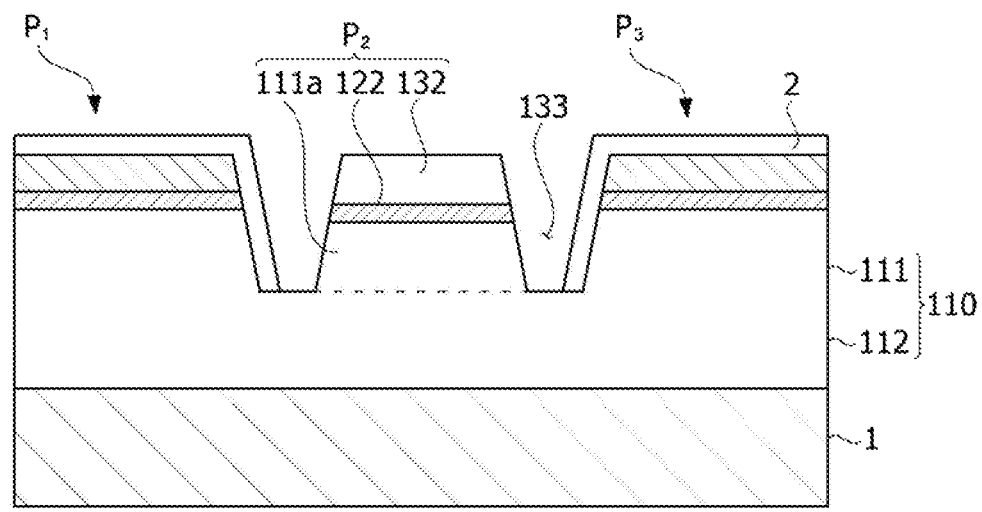
[FIG. 7F]
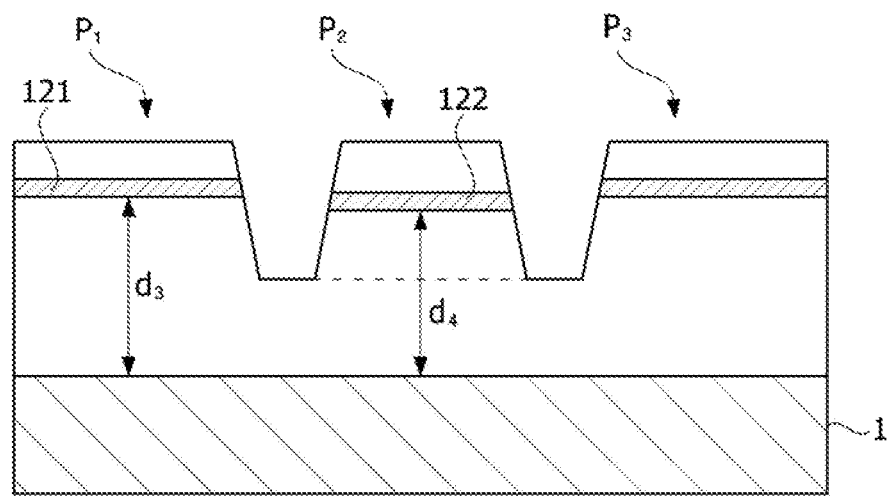

[FIG. 8A]
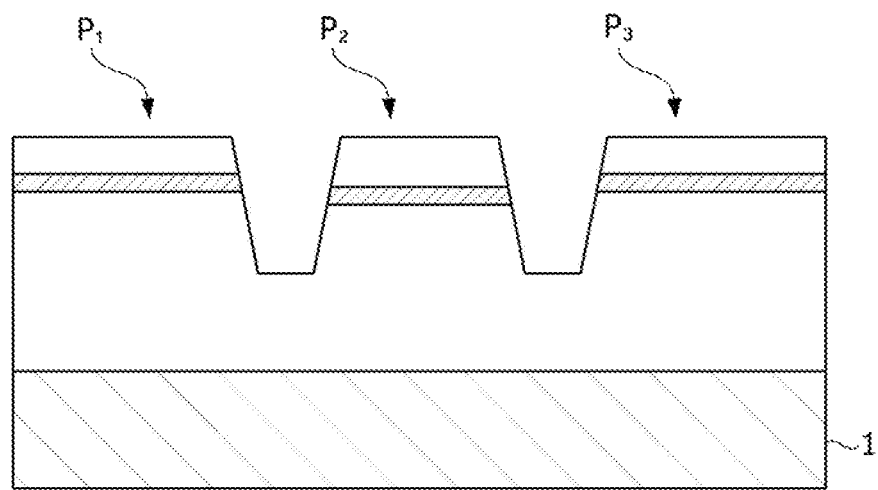
[FIG. 8B]
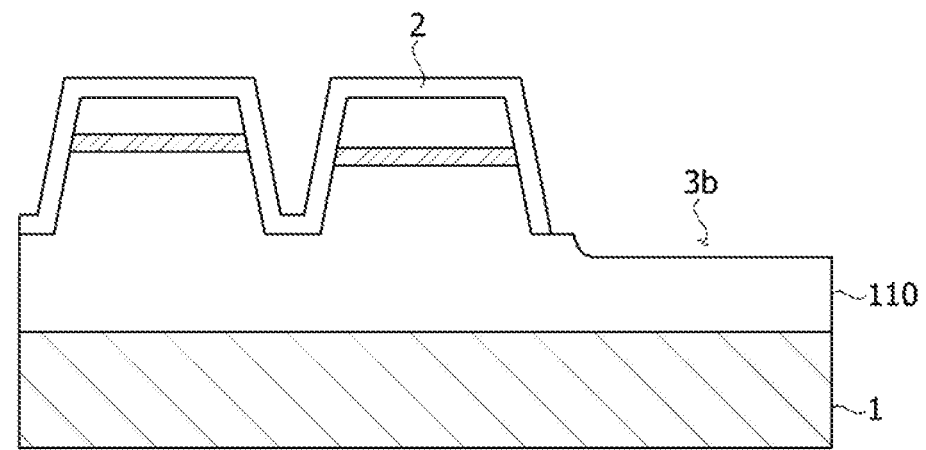

[FIG. 8C]
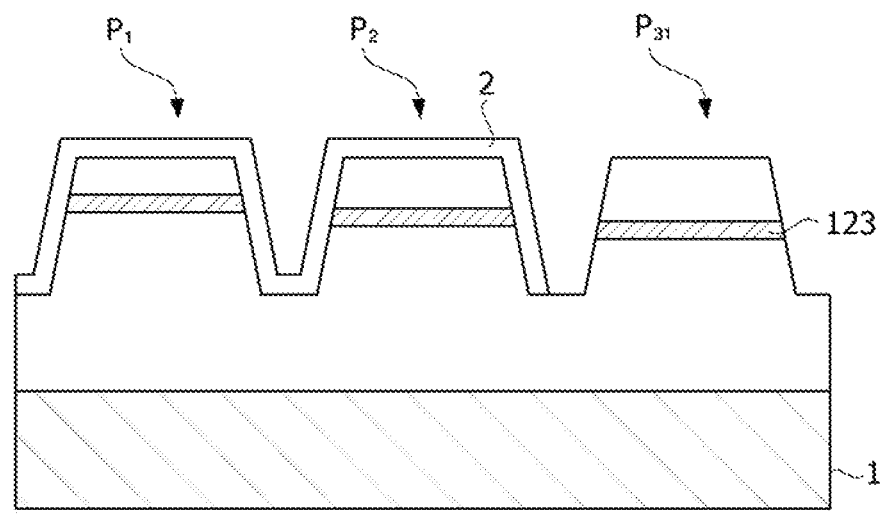
[FIG. 8D]
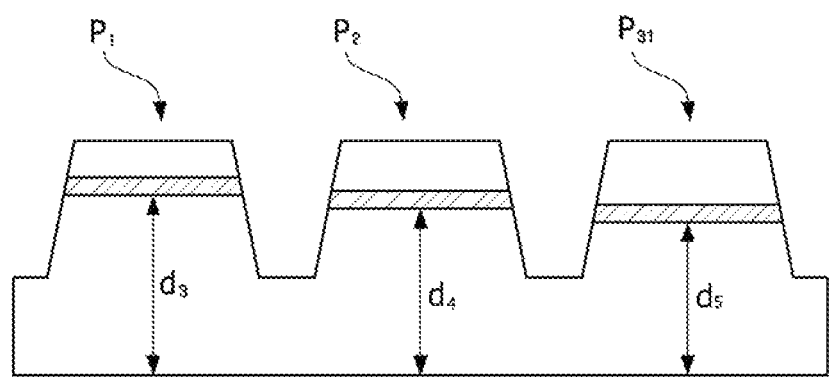

[FIG. 9A]
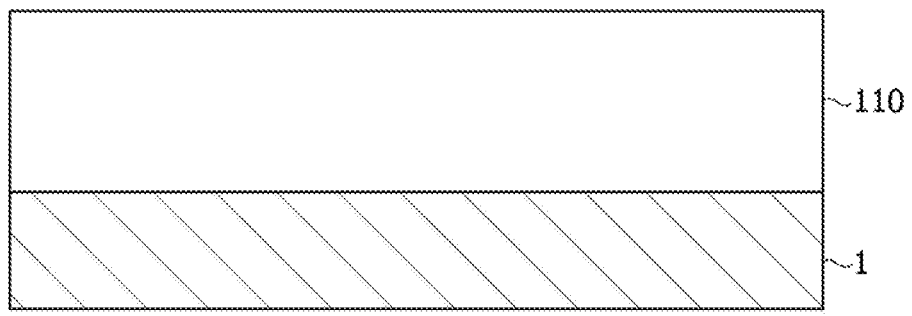
[FIG. 9B]
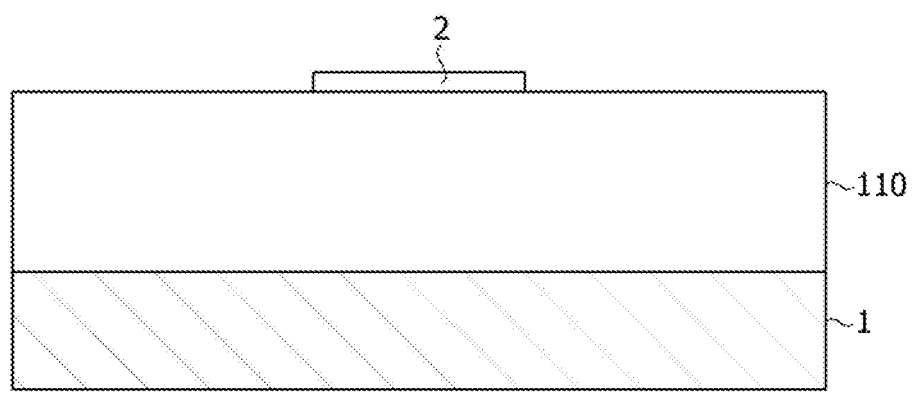

【FIG. 9C】
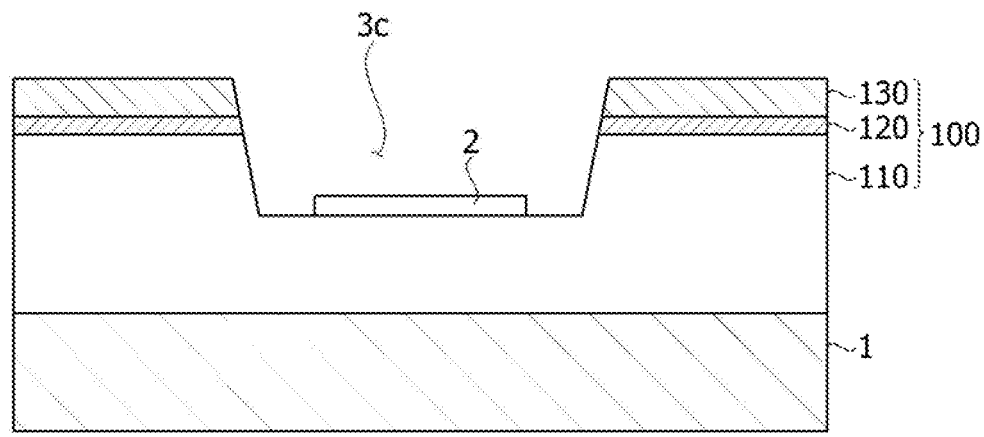
【FIG. 9D】
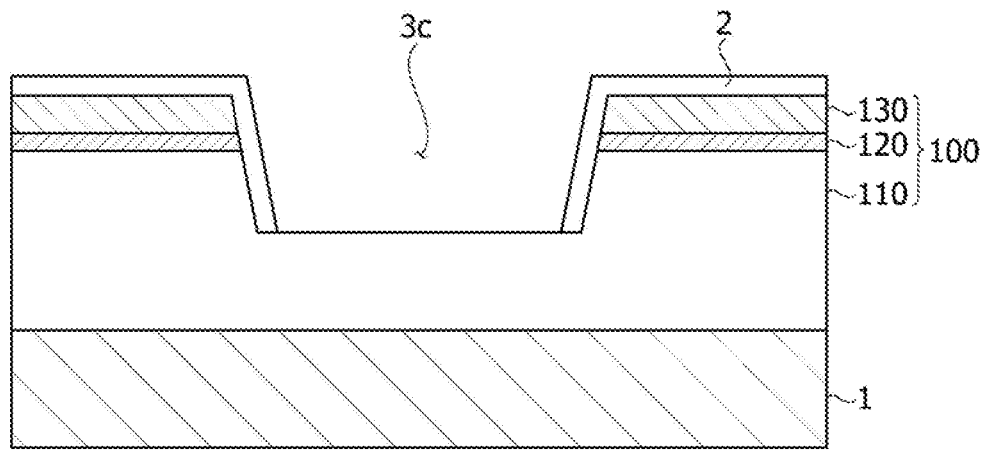

【FIG. 9E】
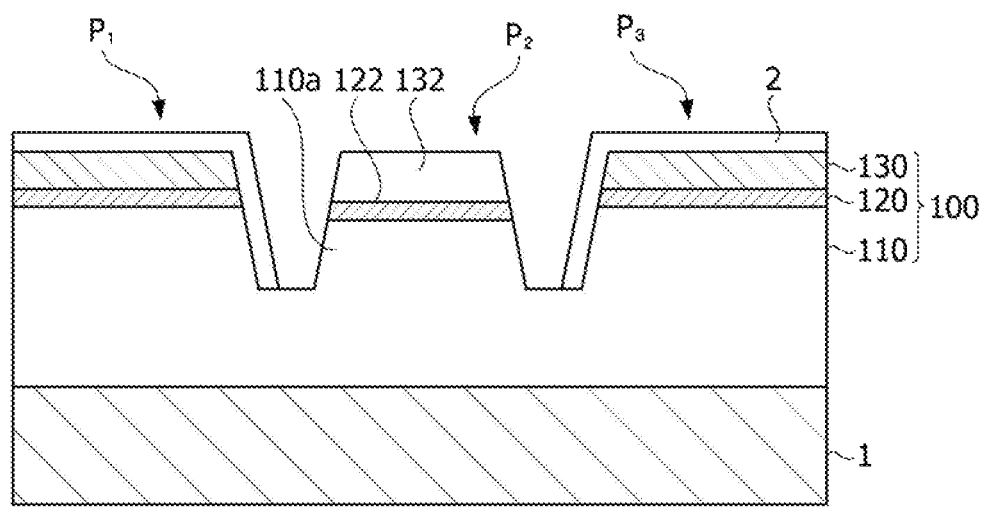
【FIG. 9F】
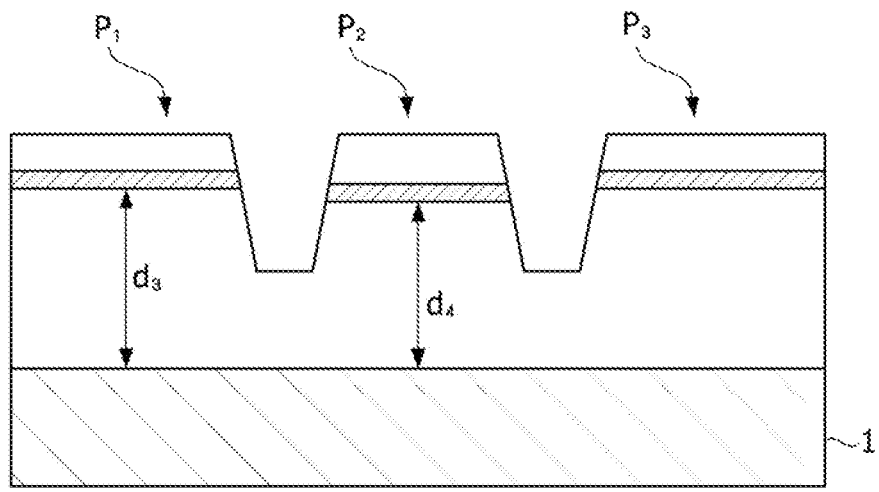

[FIG. 10A]
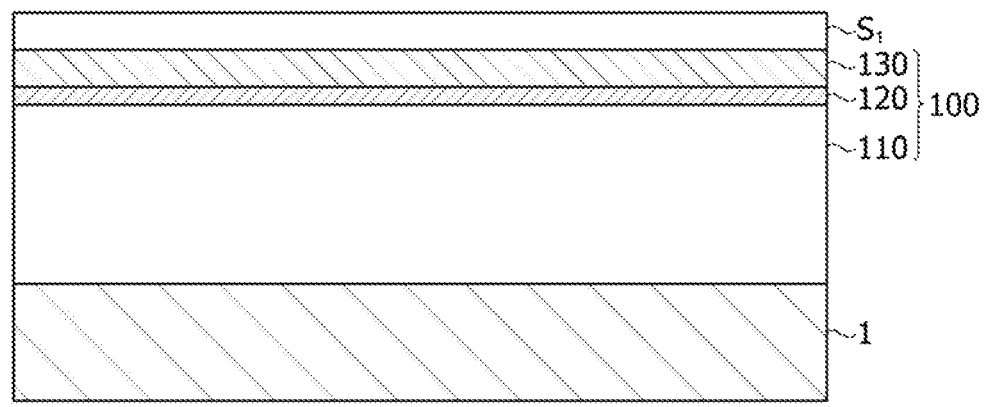
[FIG. 10B]
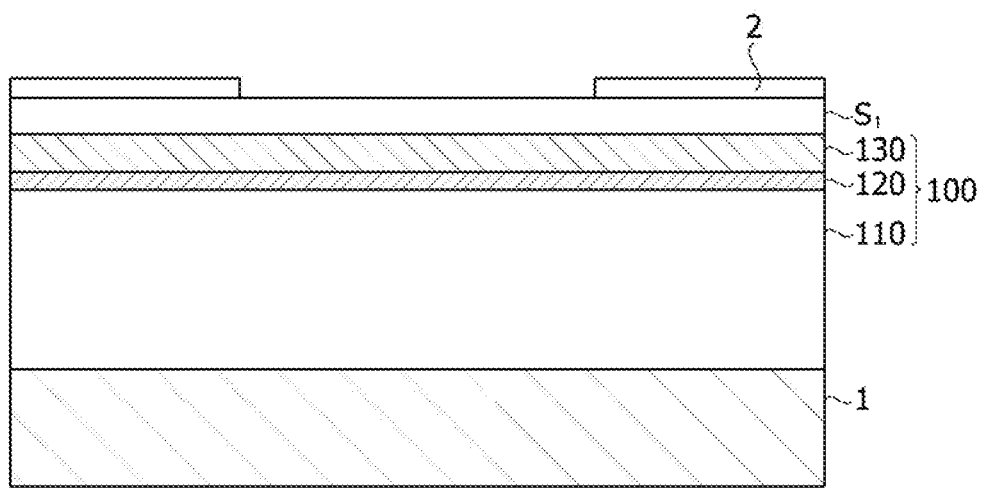

[FIG. 10C]
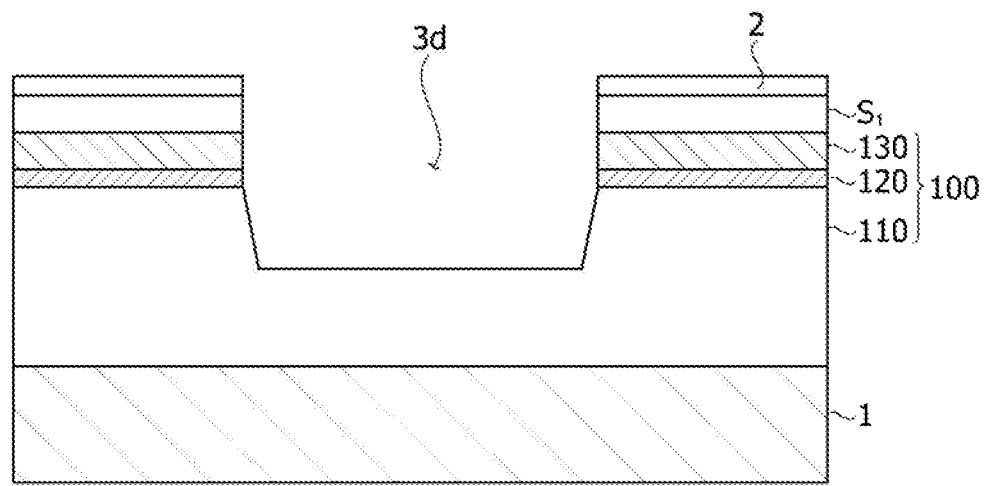
[FIG. 10D]
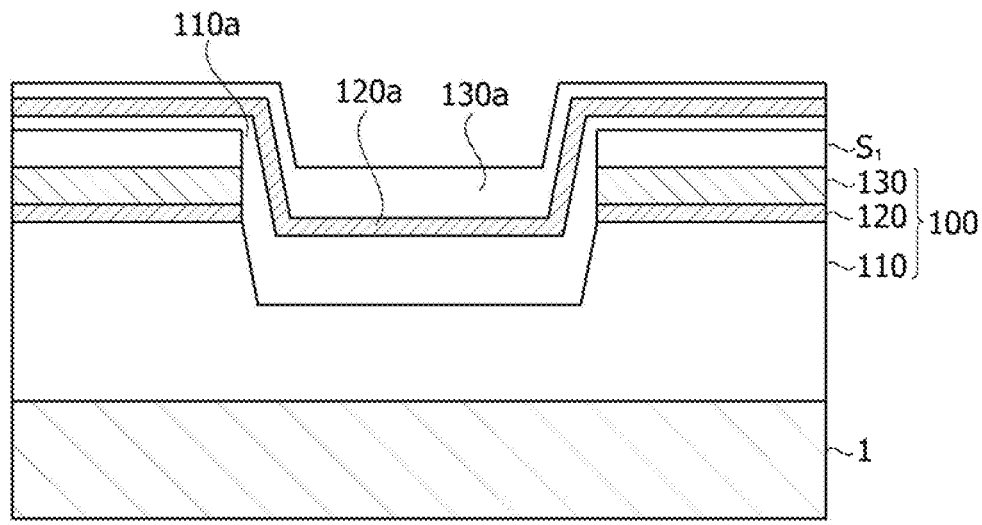

[FIG. 10E]
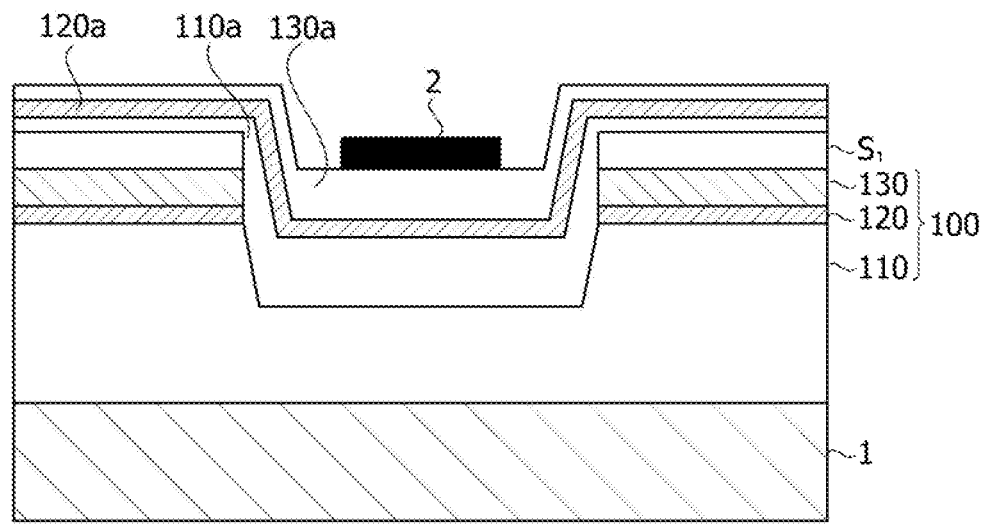
[FIG. 10F]
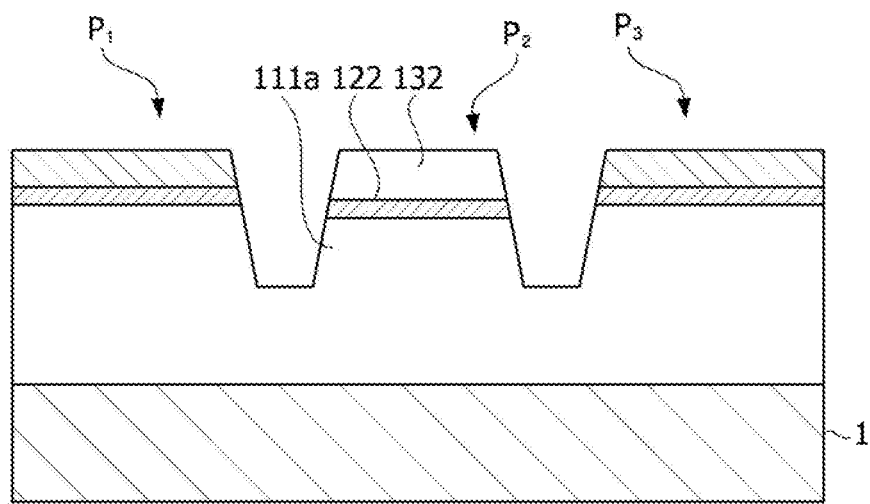

[FIG. 11]
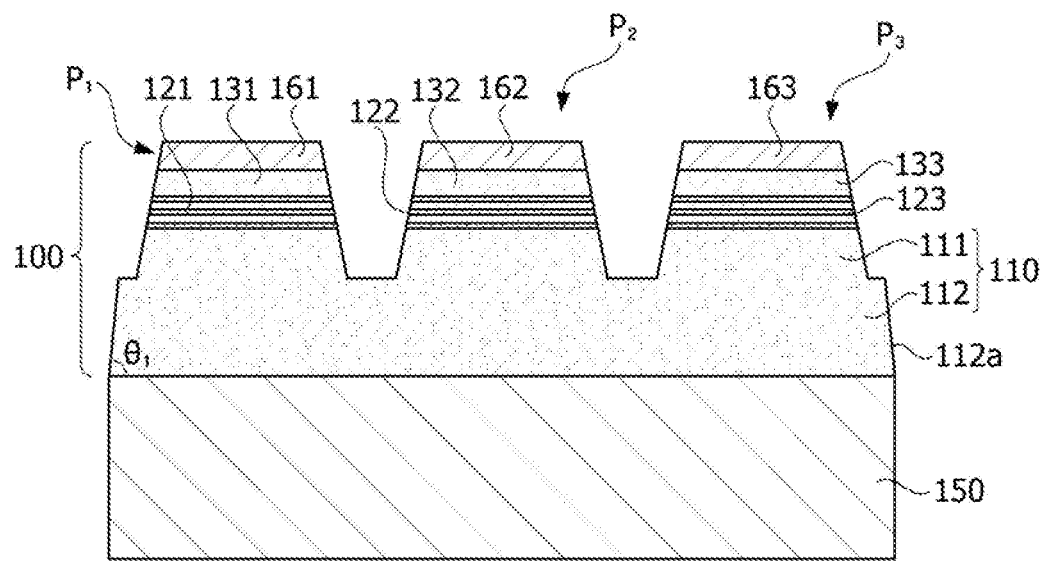
[FIG. 12A]
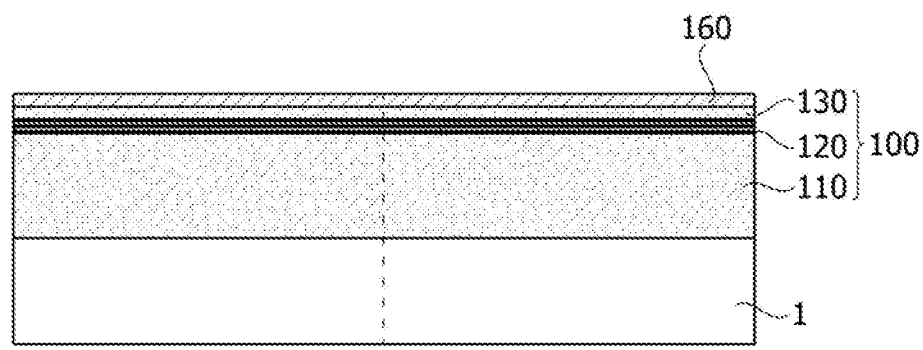

[FIG. 12B]
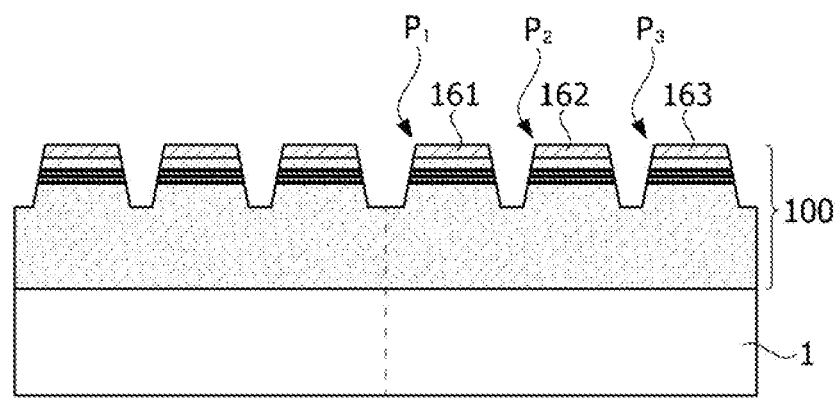
[FIG. 12C]
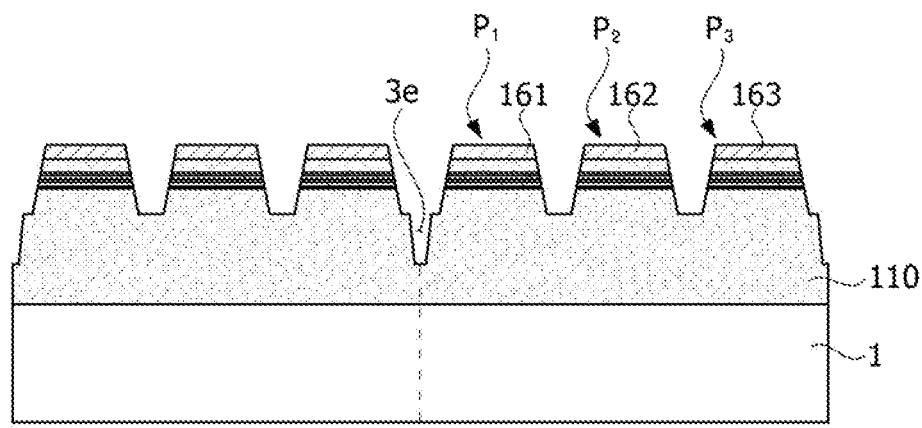

【FIG. 12D】
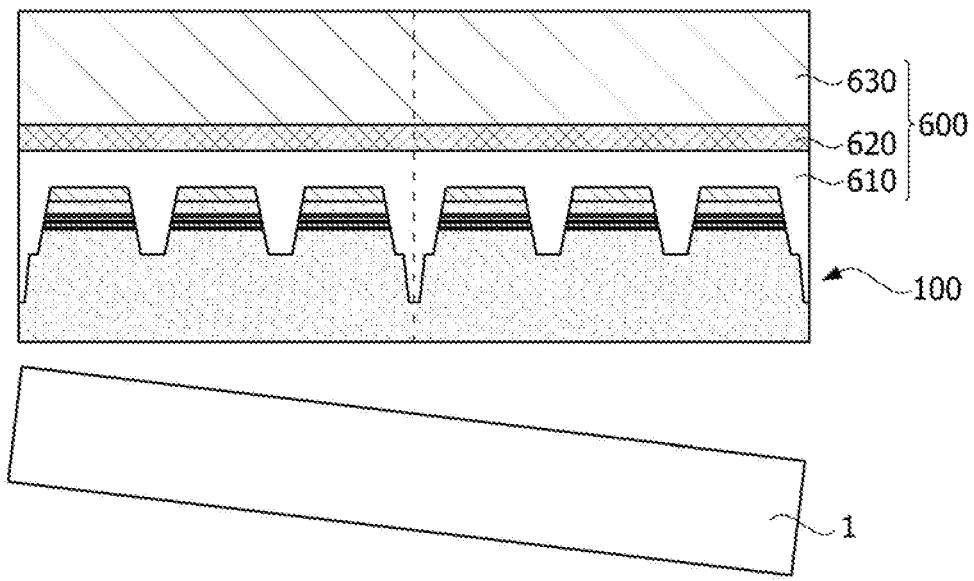
【FIG. 12E】
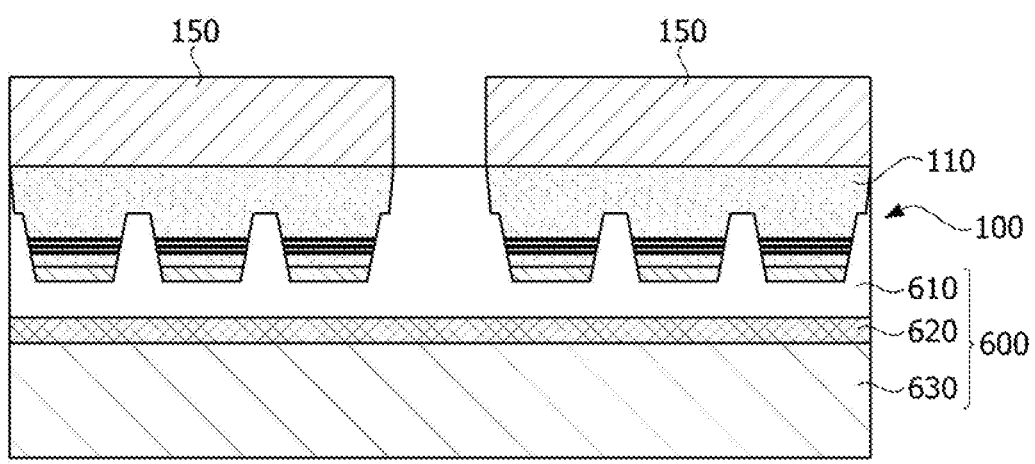

[FIG. 12F]
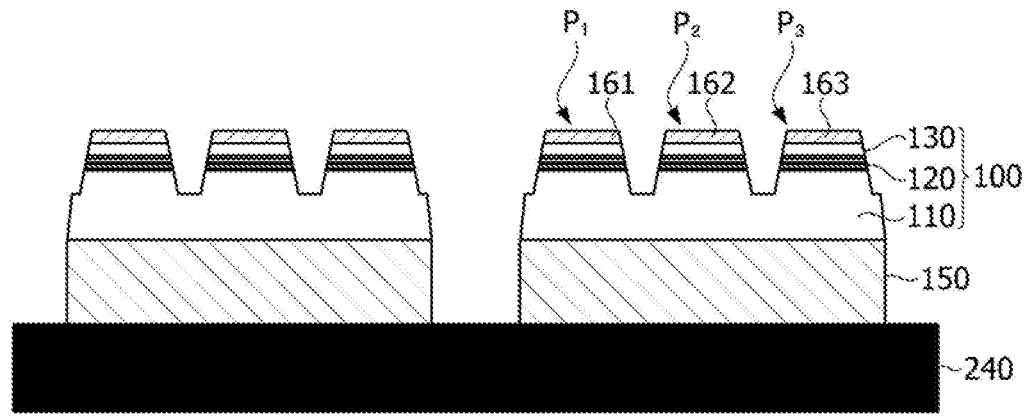
[FIG. 13]
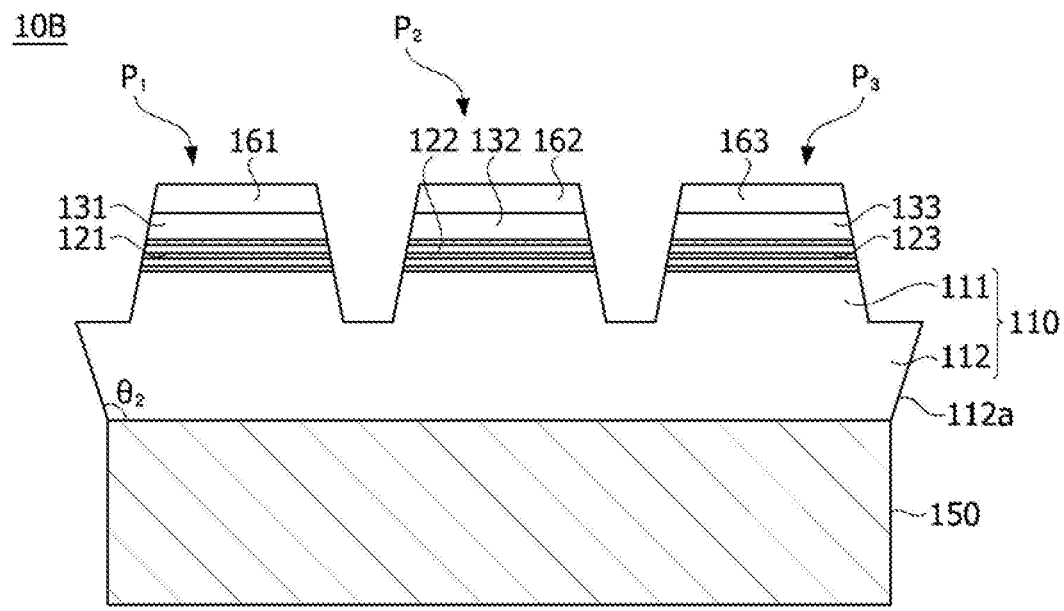

[FIG. 14A]
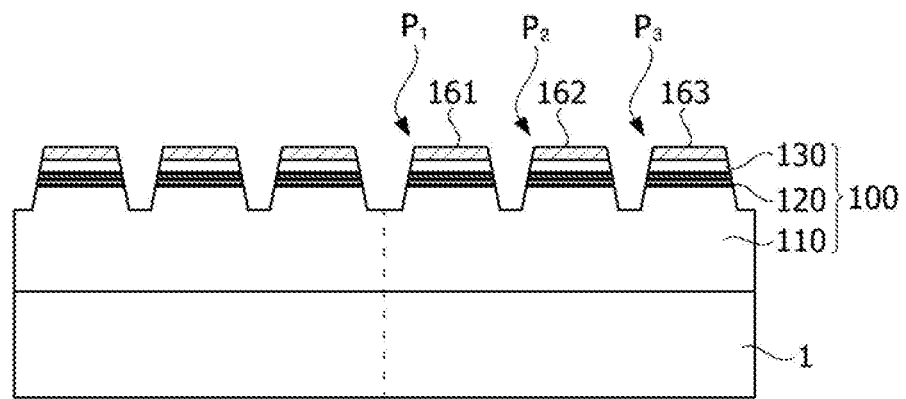
[FIG. 14B]
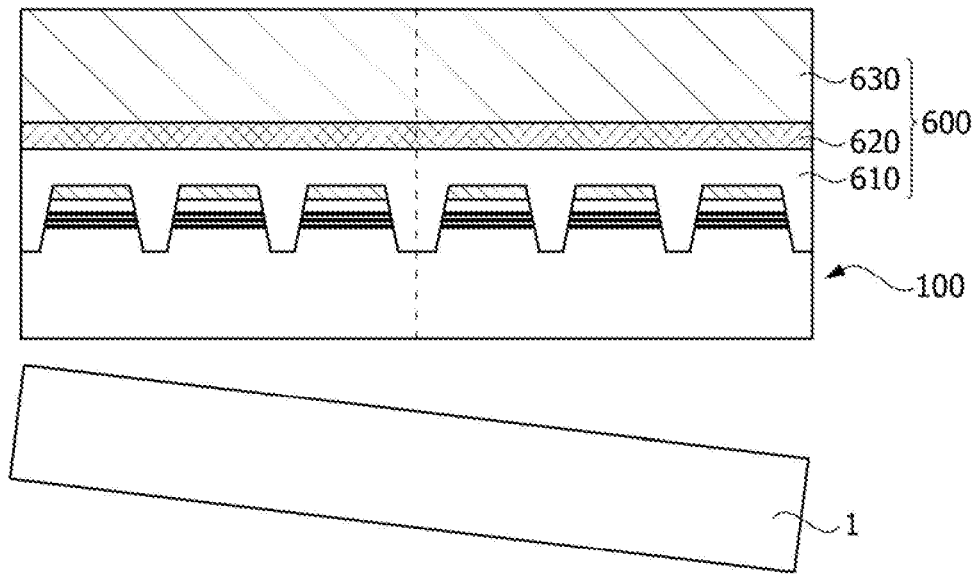

[FIG. 14C]
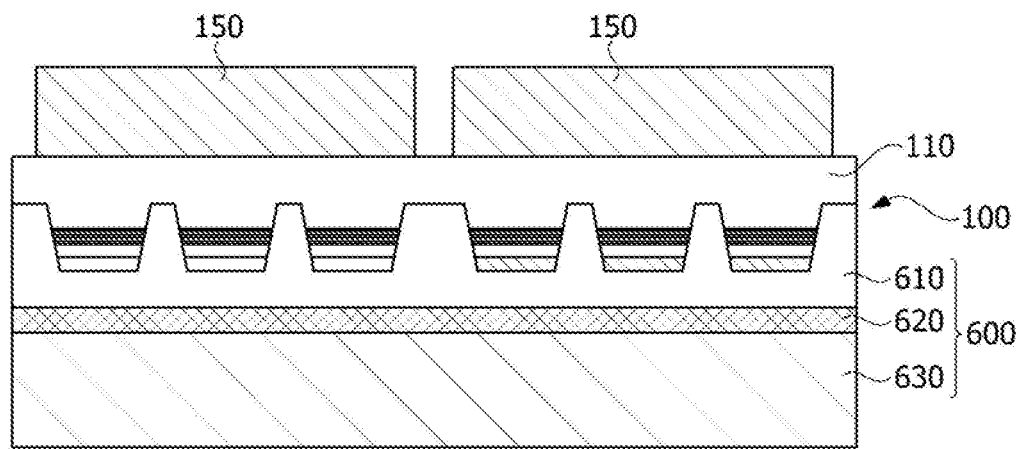
[FIG. 14D]
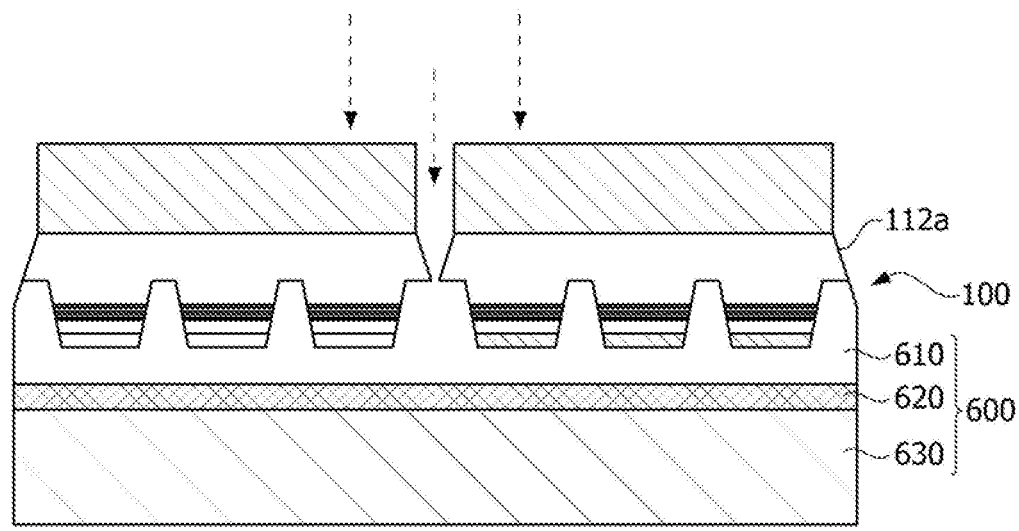

[FIG. 14E]
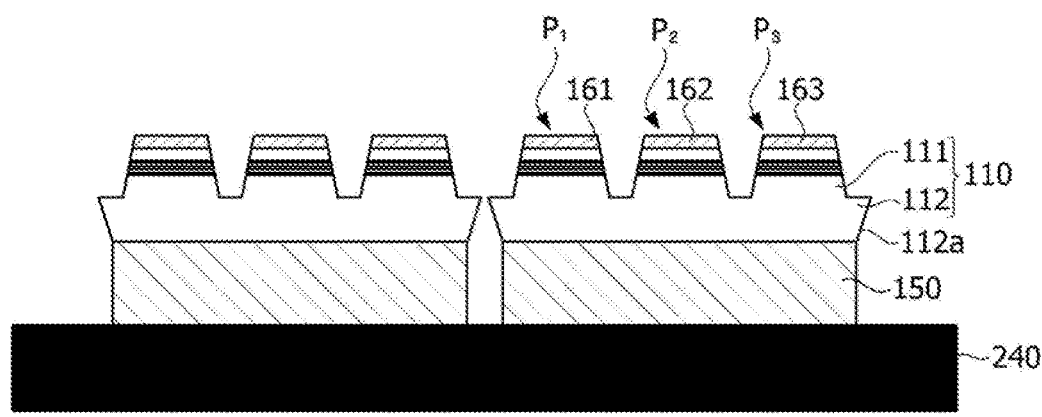
[FIG. 15]
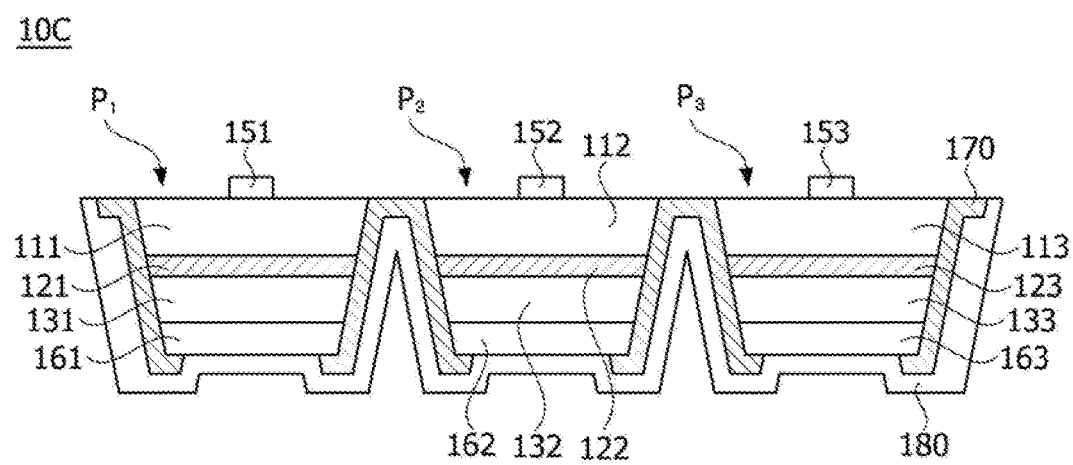

[FIG. 16A]
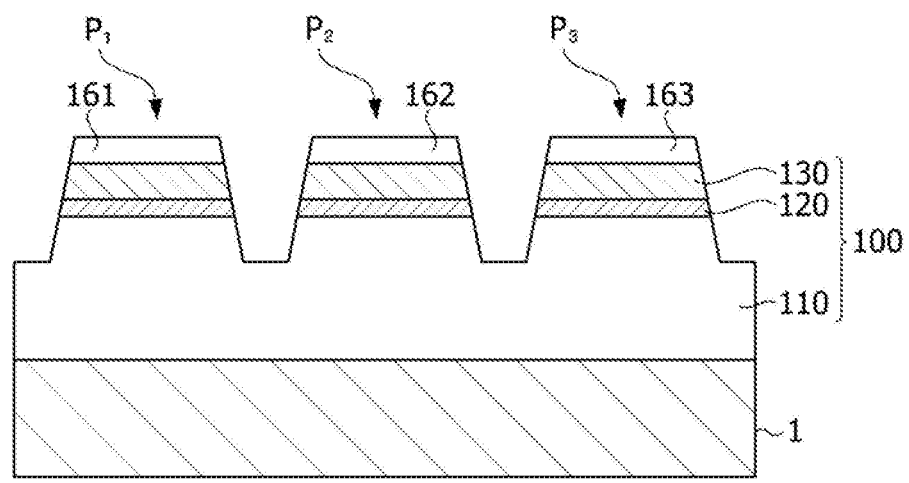
[FIG. 16B]
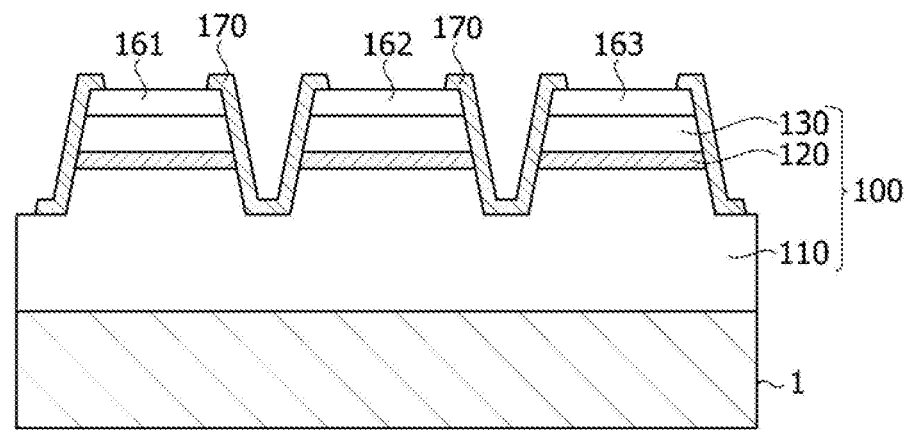

[FIG. 16C]
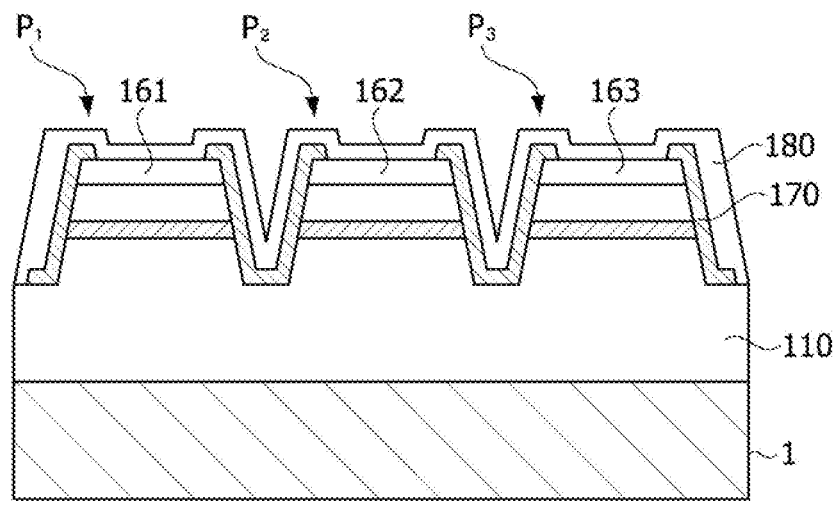
[FIG. 16D]
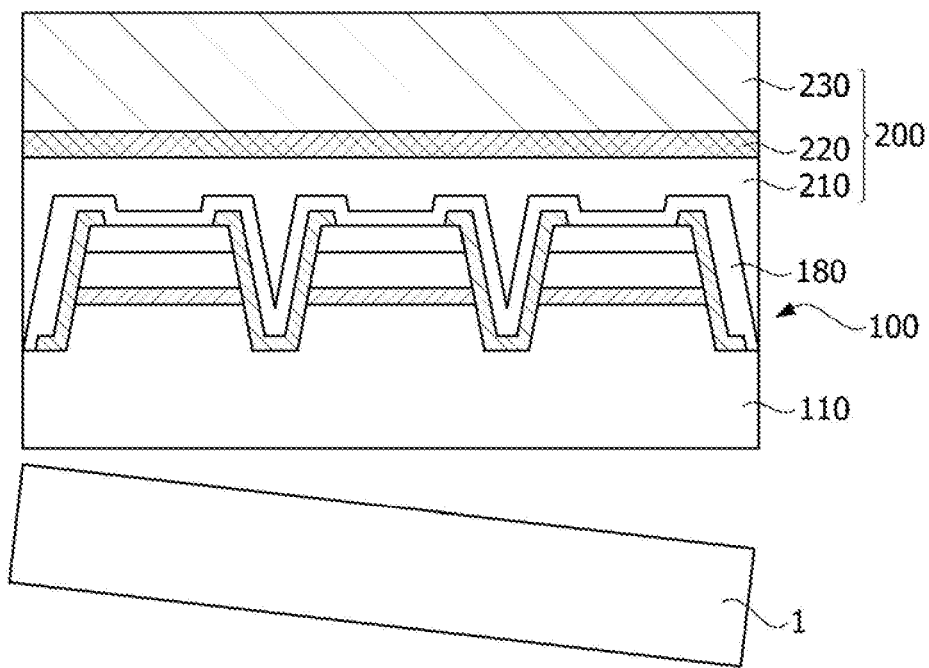

[FIG. 16E]
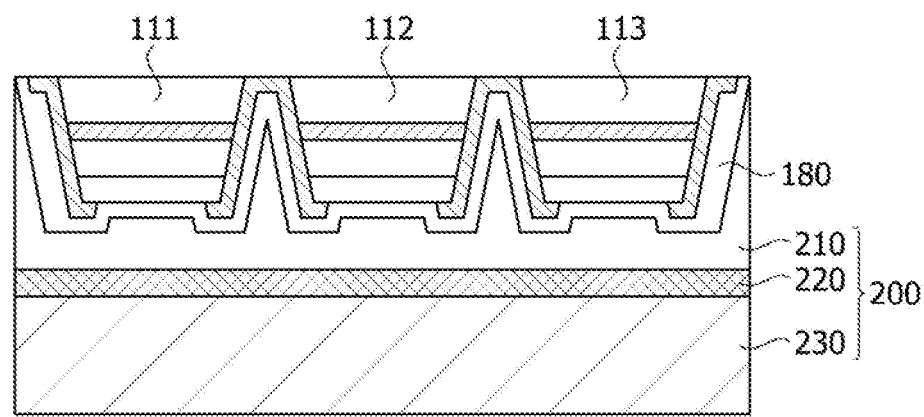
[FIG. 16F]
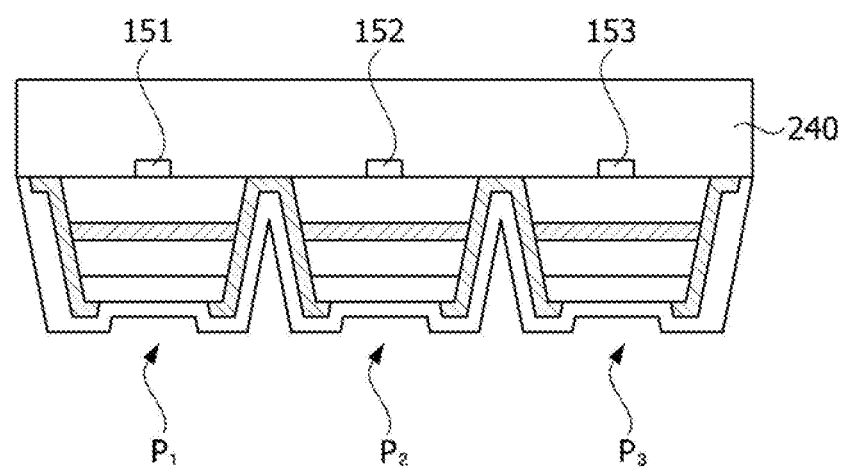

[FIG. 17]
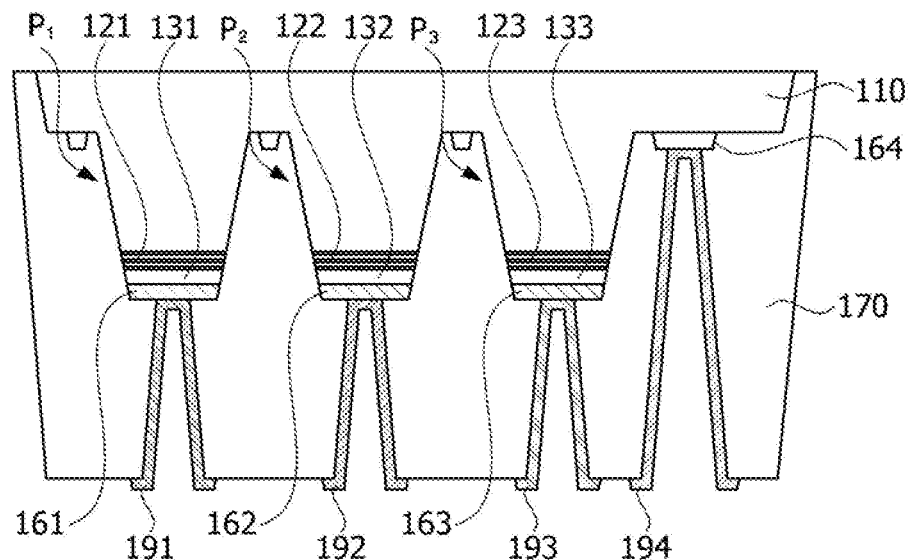
[FIG. 18]
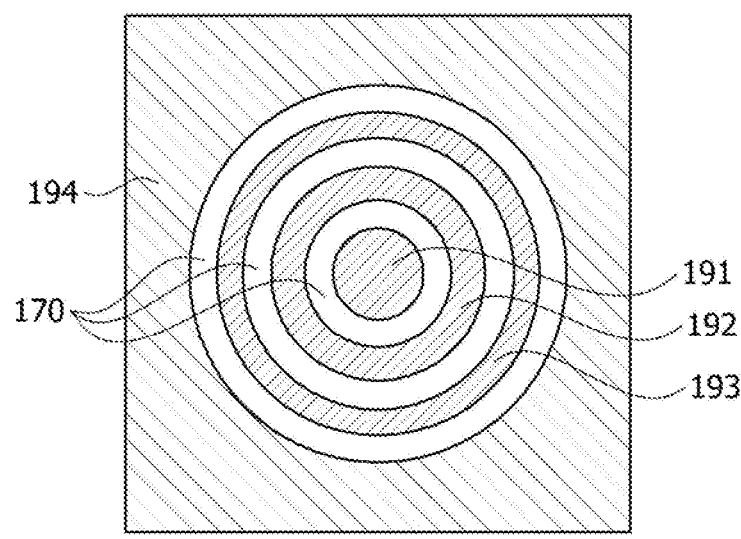

[FIG. 19]
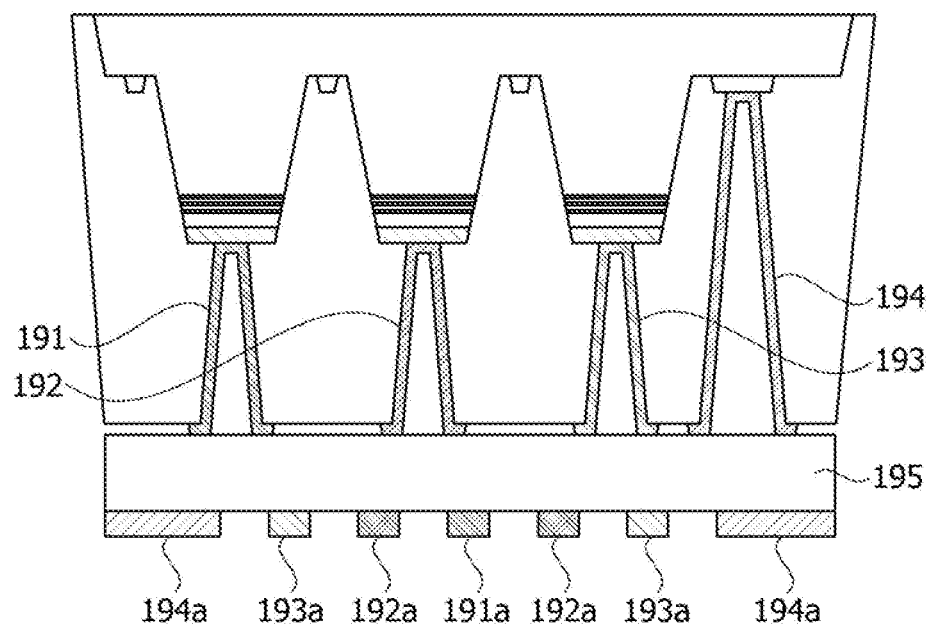
[FIG. 20A]
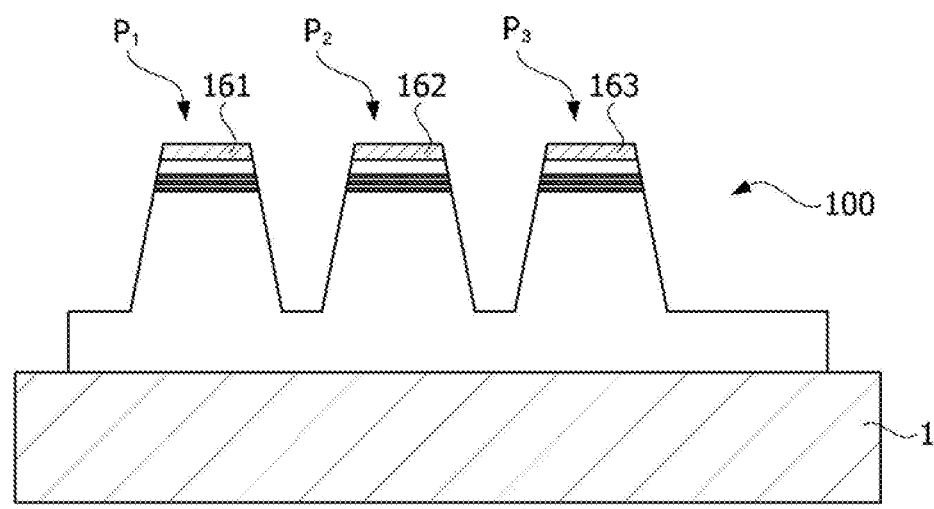

[FIG. 20B]
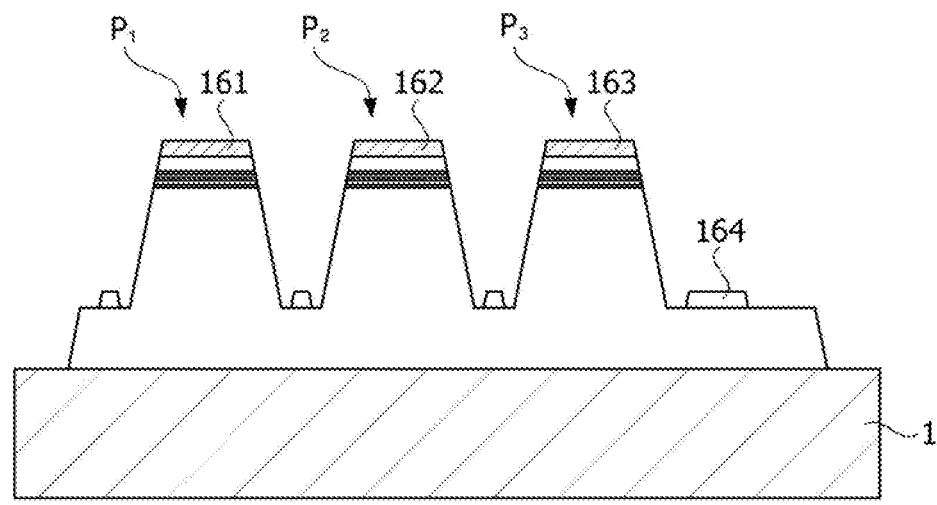
[FIG. 20C]
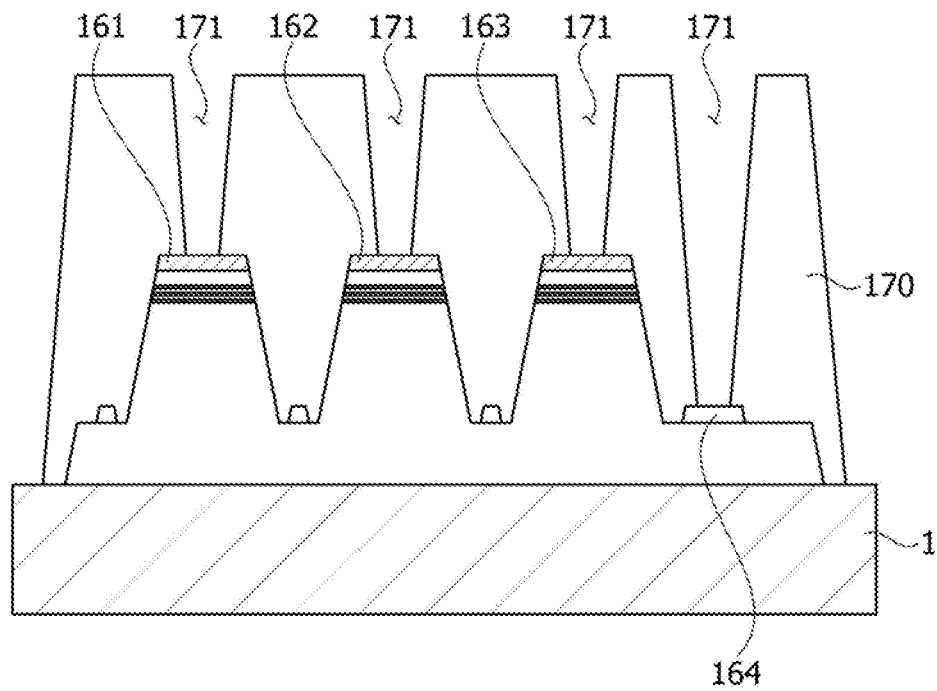

[FIG. 20D]
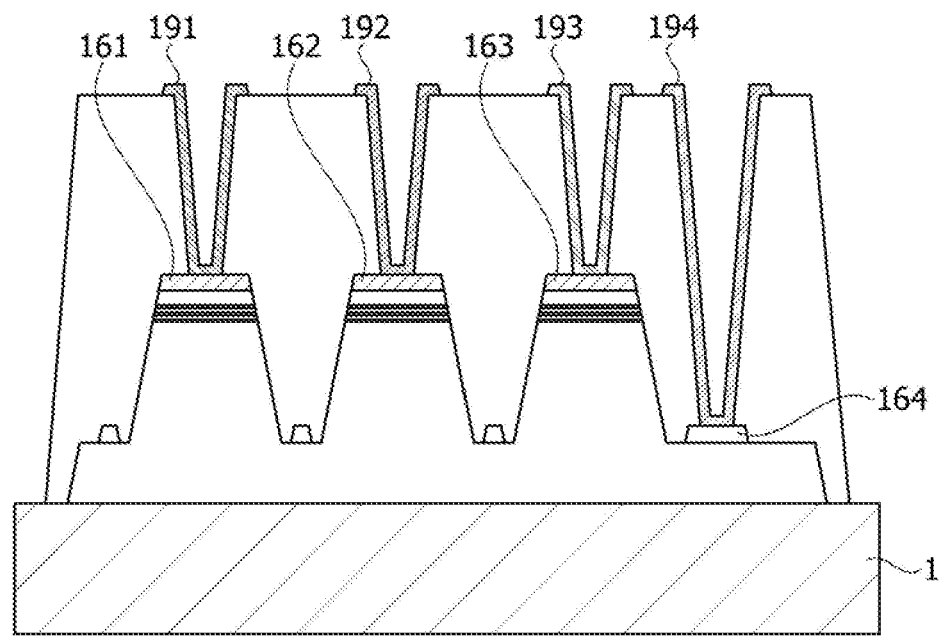

[FIG. 20E]
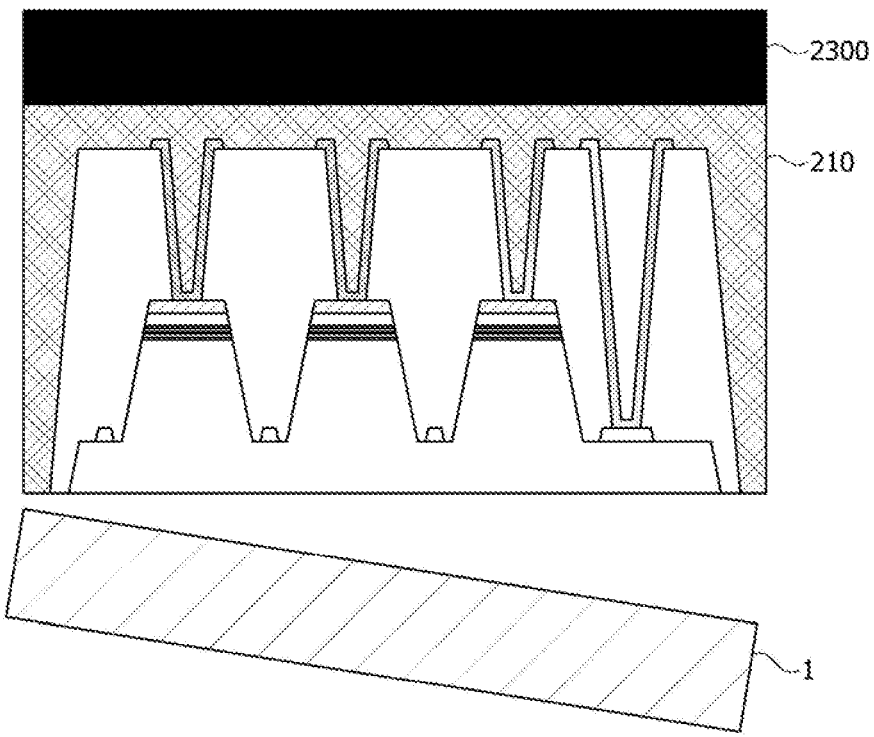
[FIG. 20F]
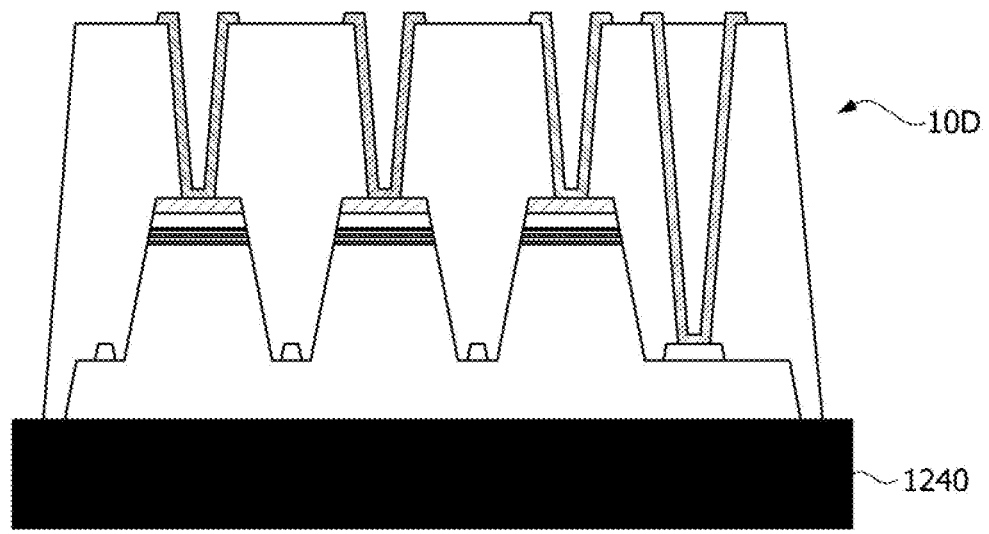

[FIG. 21]
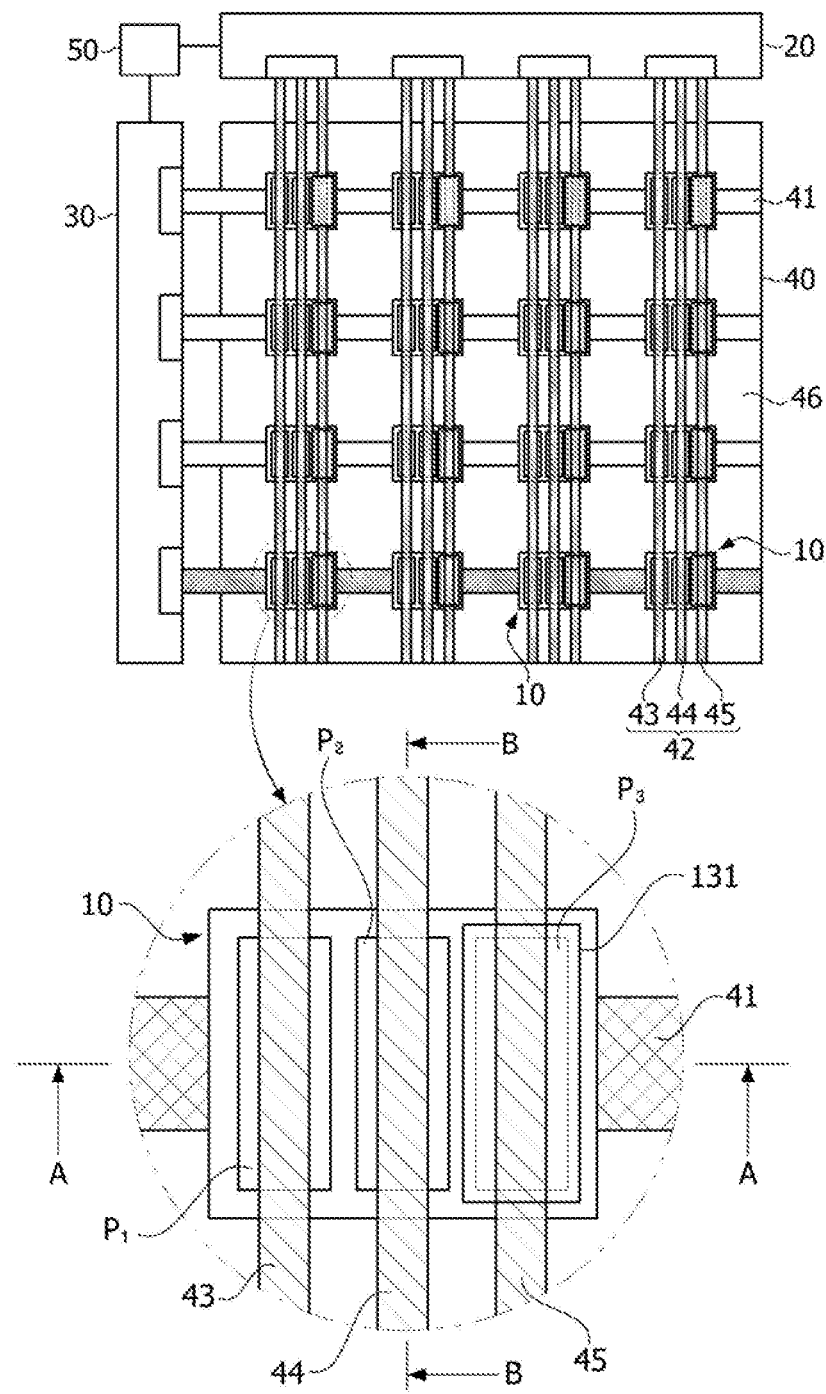

[FIG. 22]
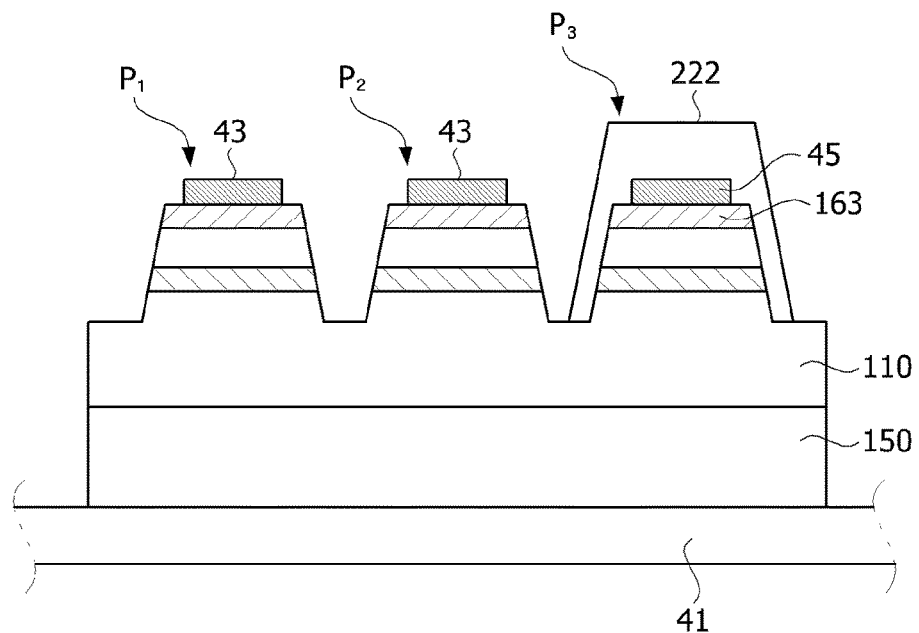
[FIG. 23]
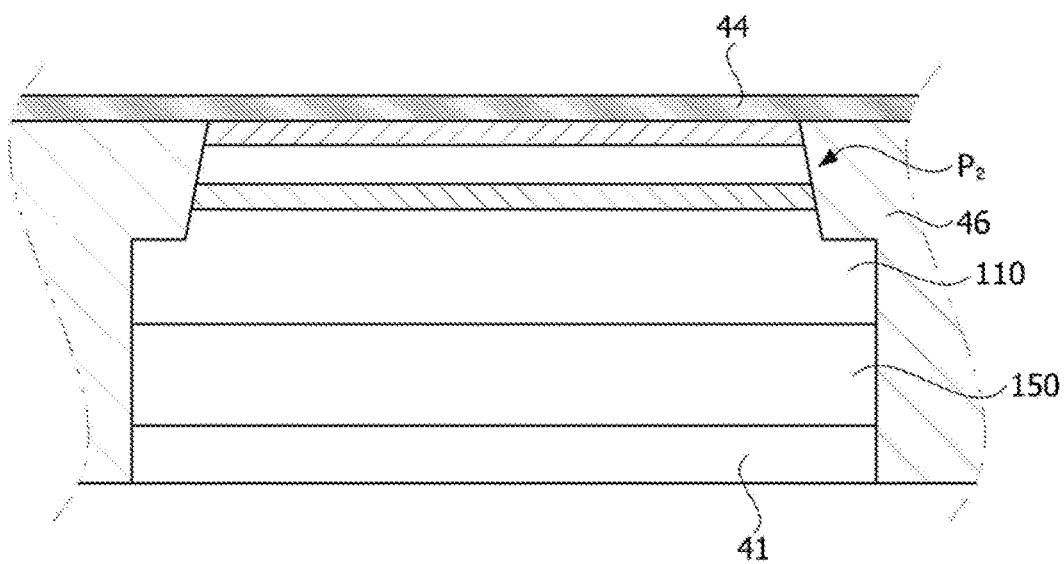

[FIG. 24A]
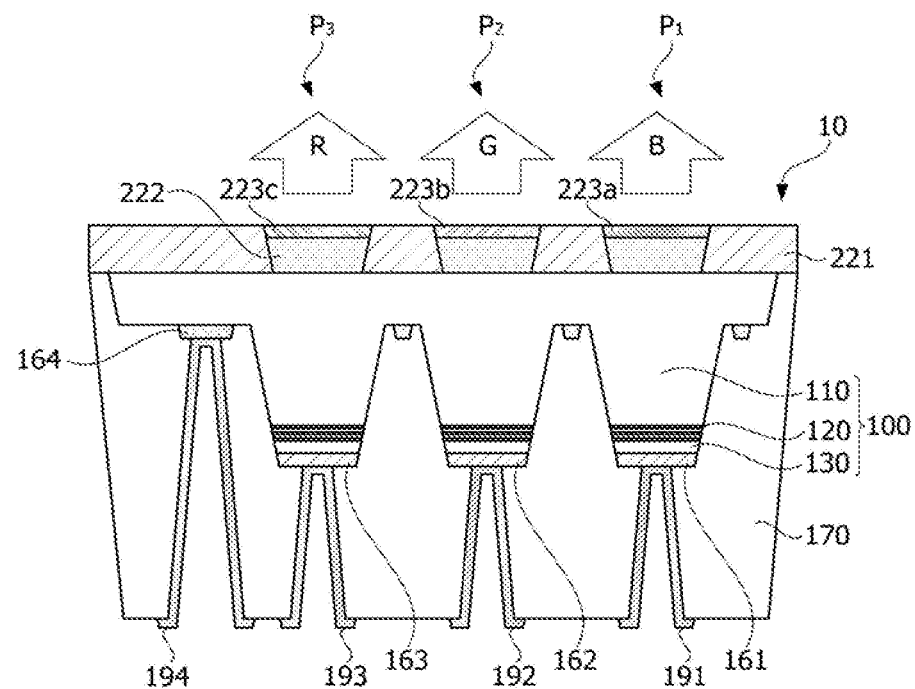

[FIG. 24B]
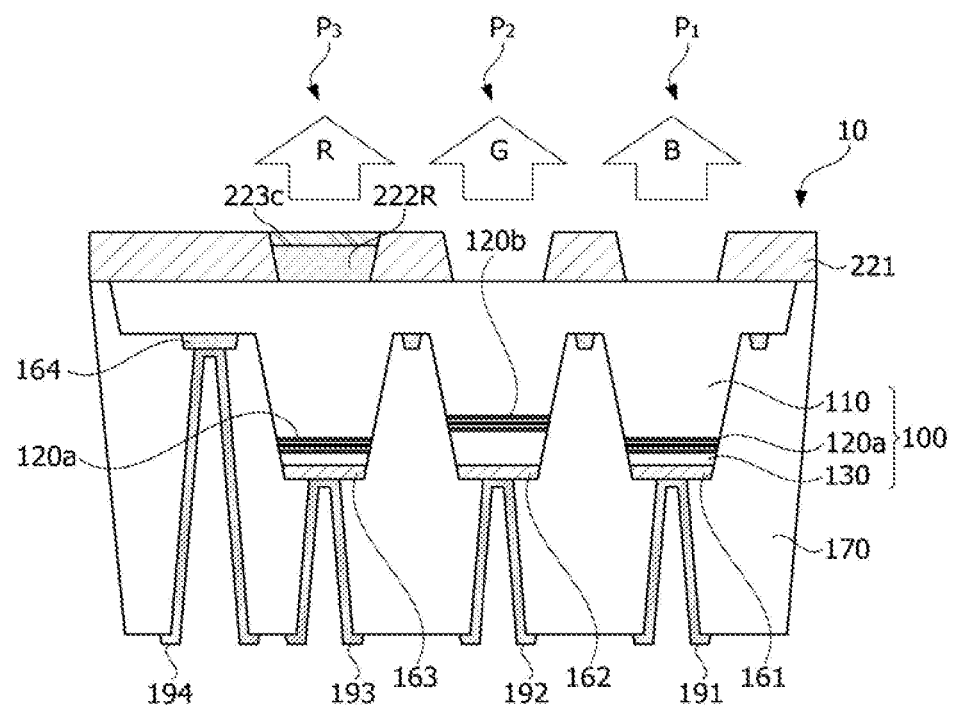
[FIG. 24C]
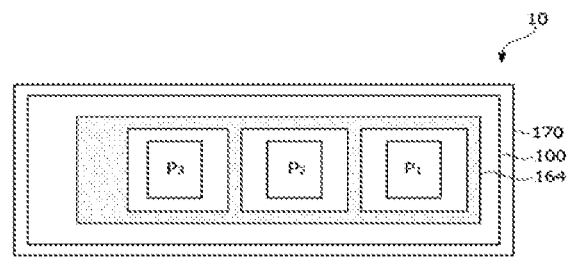

[FIG. 25A]
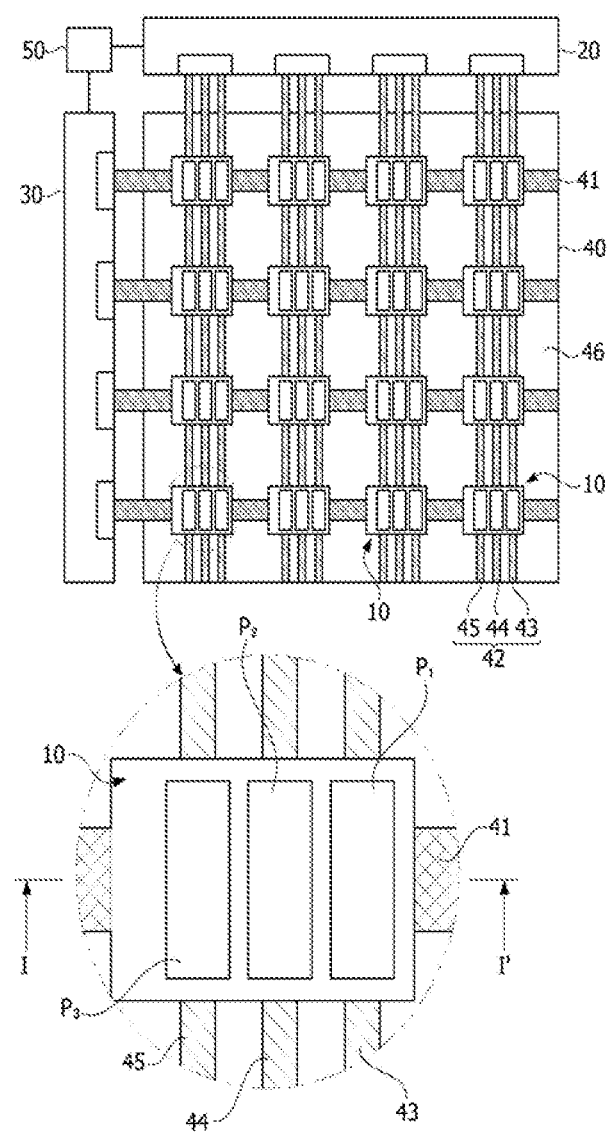

[FIG. 25B]
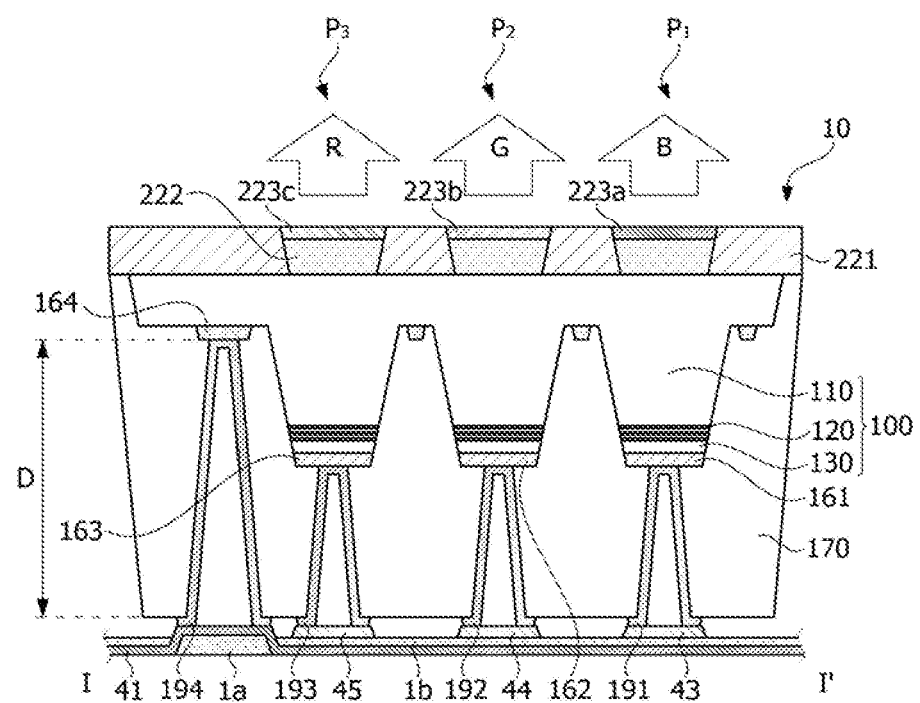

[FIG. 25C]
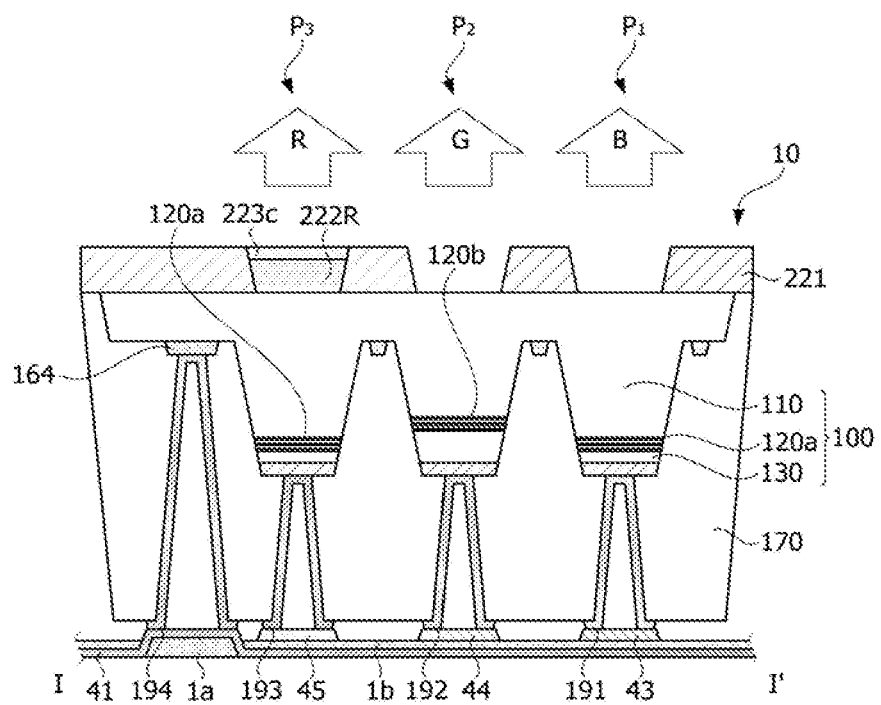

[FIG. 26A]
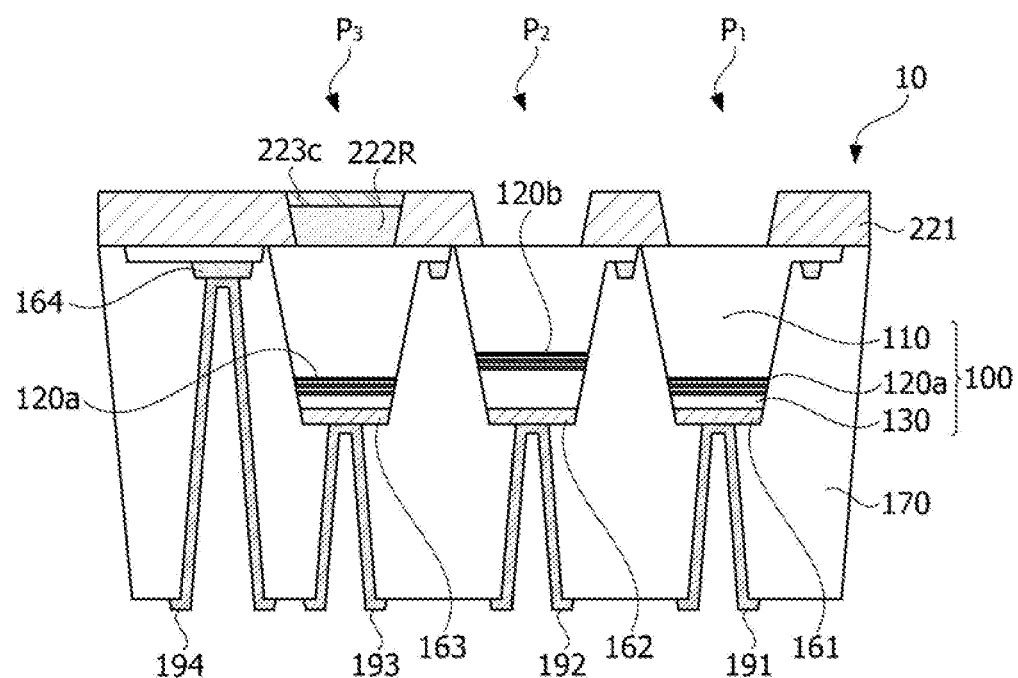

[FIG. 26B]
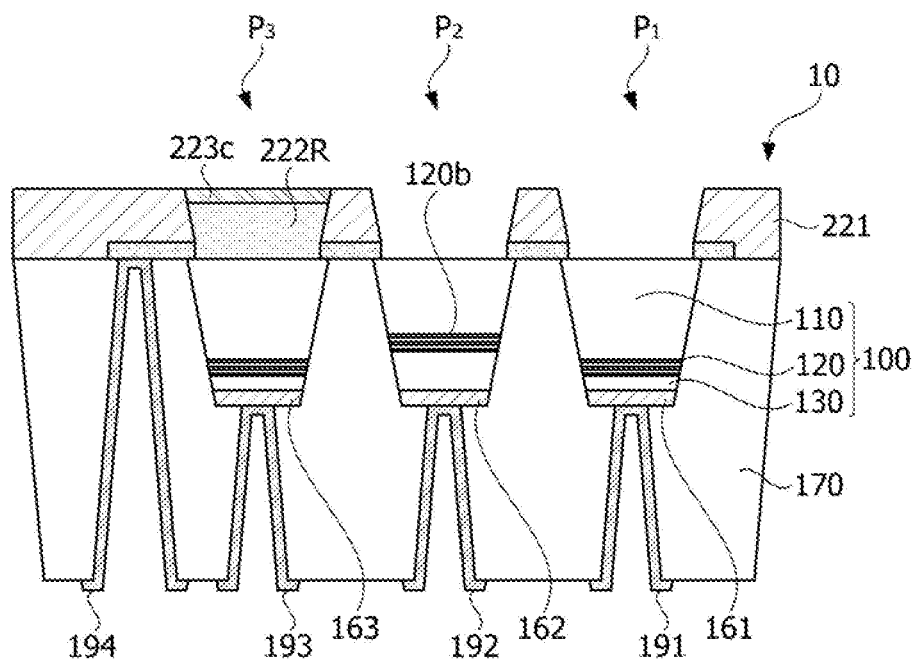
[FIG. 27A]
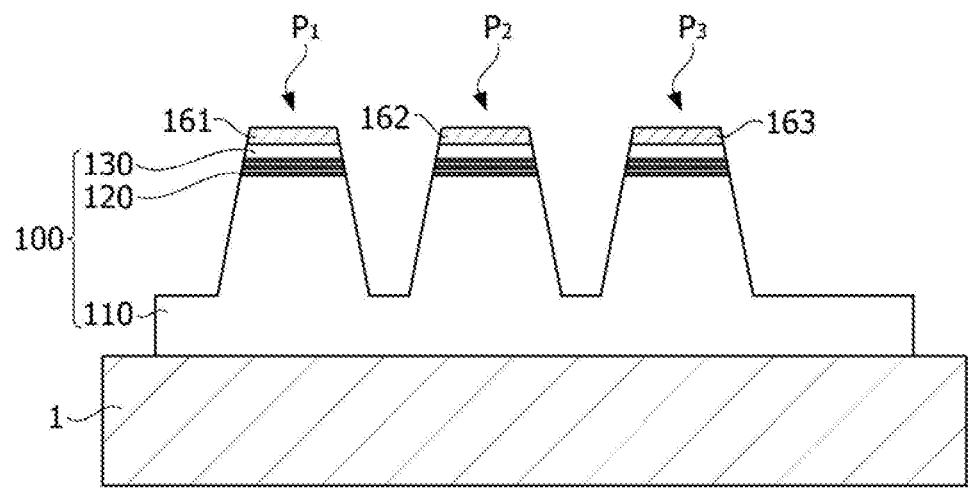

[FIG. 27B]
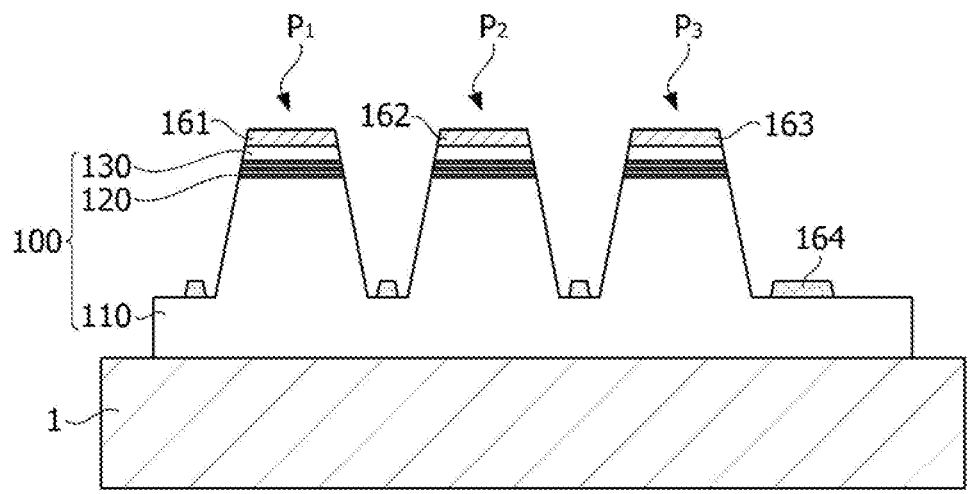
[FIG. 27C]
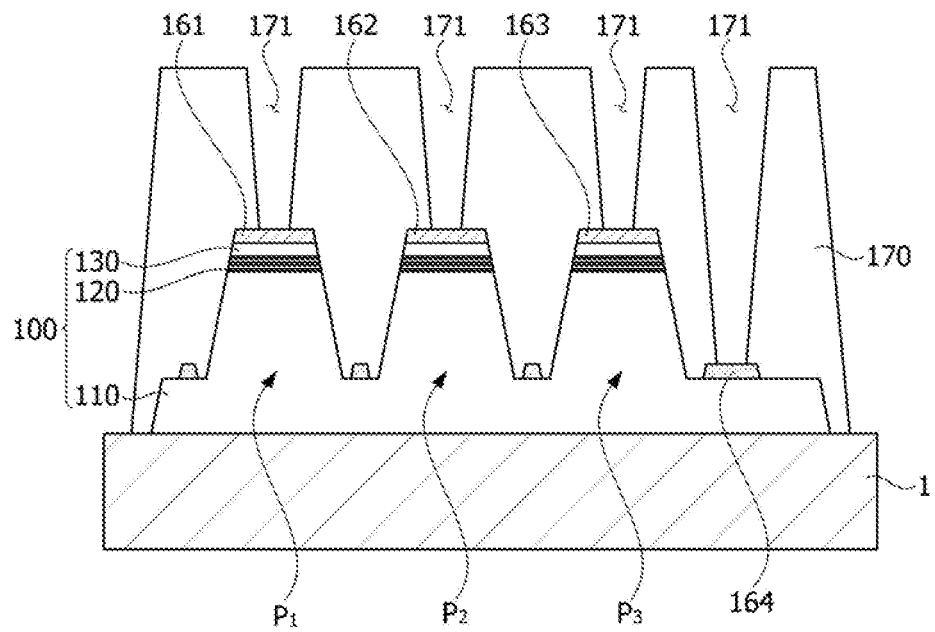

[FIG. 27D]
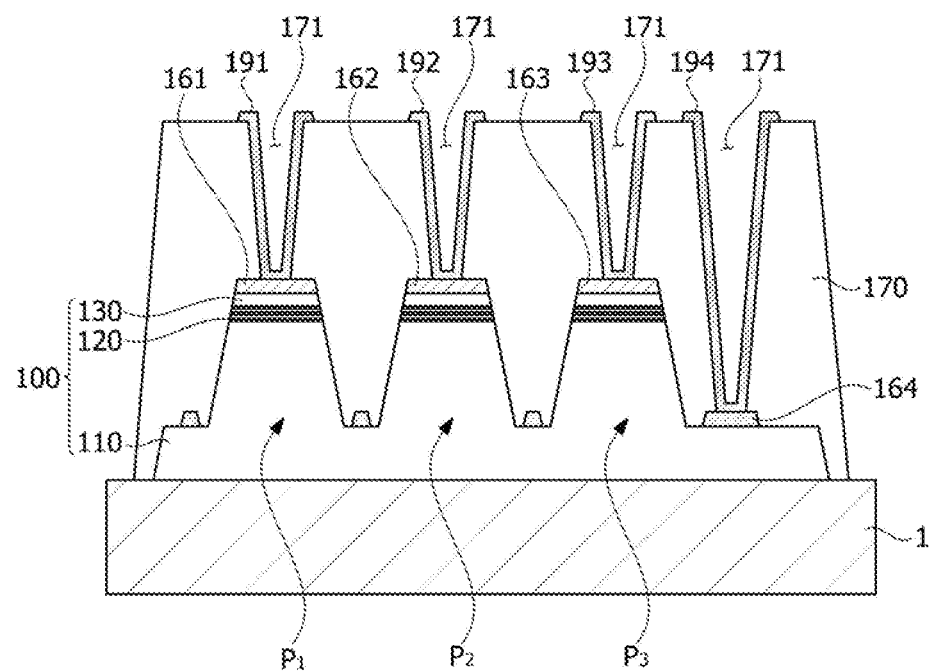

[FIG. 27E]
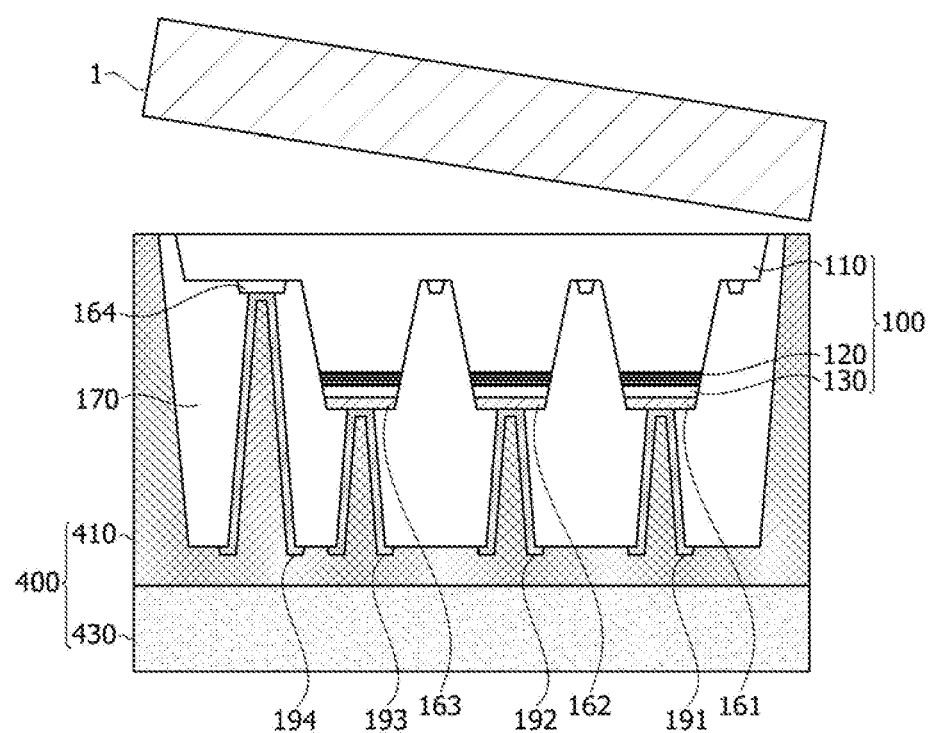

[FIG. 27F]
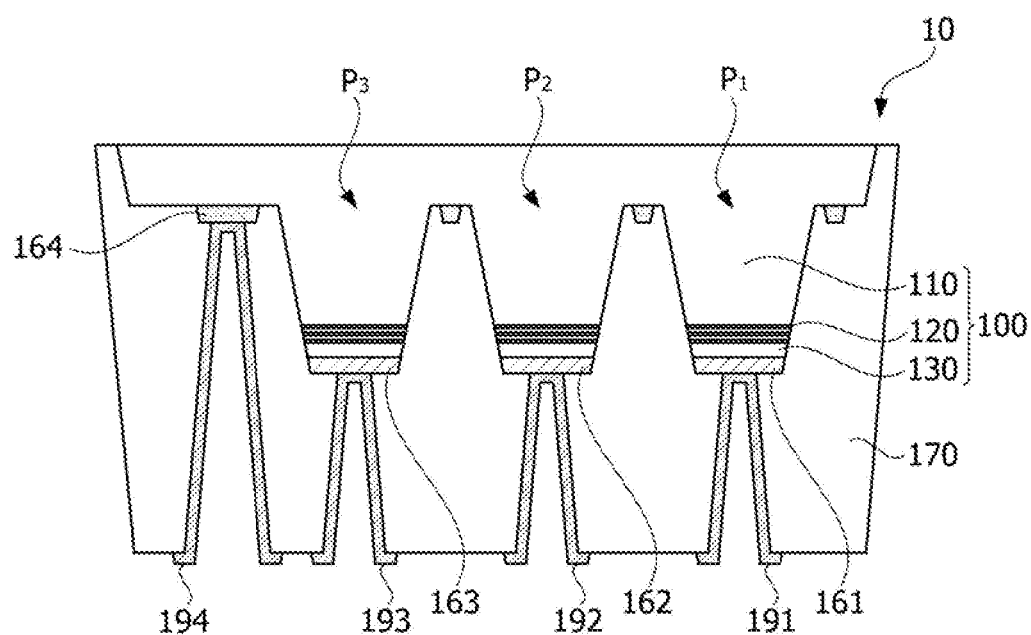

[FIG. 27G]
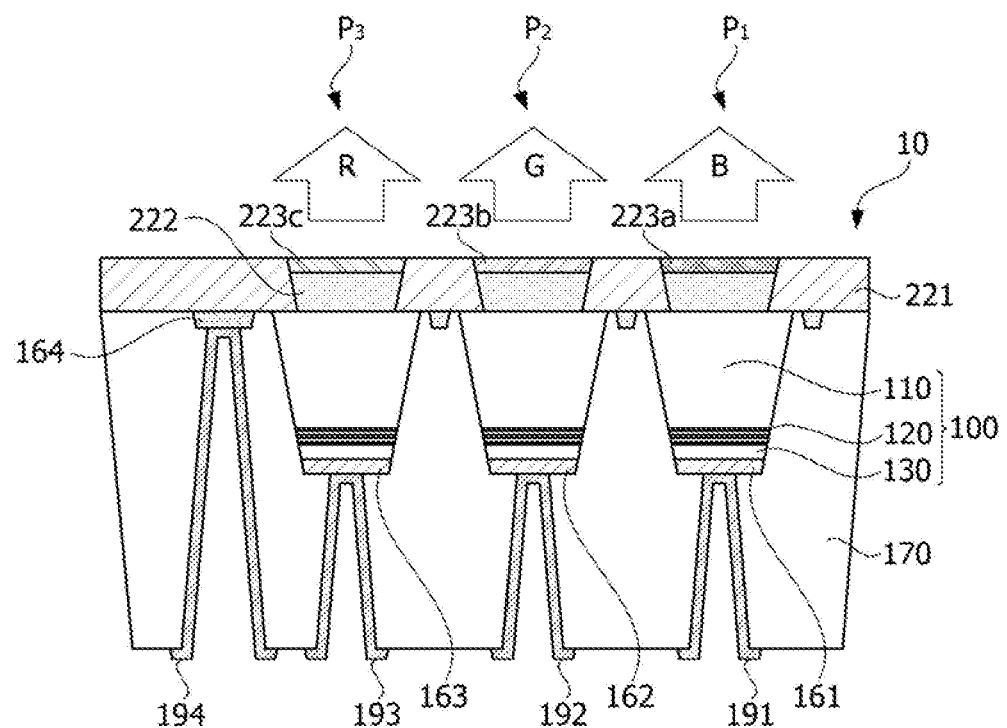

[FIG. 27H]
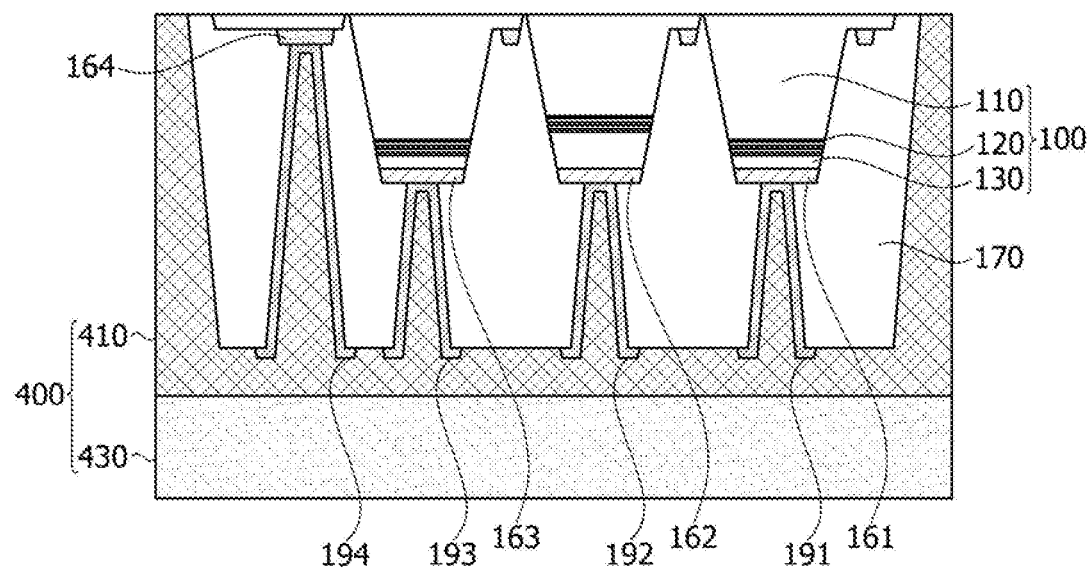

[FIG. 27I]
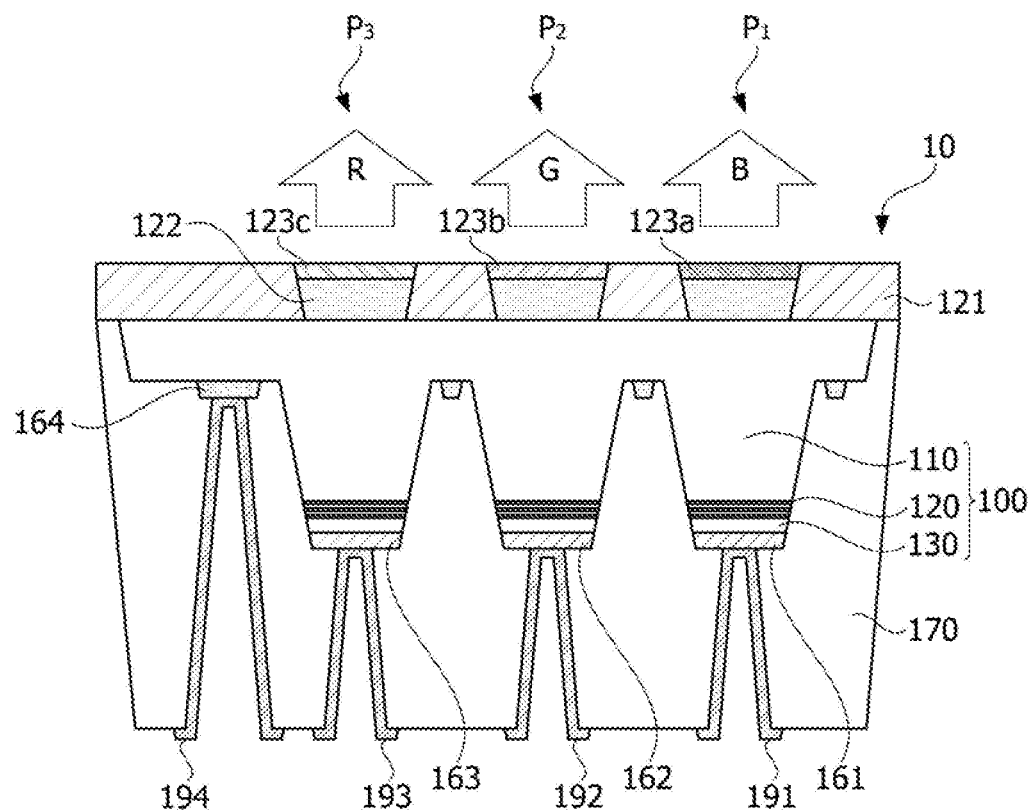
[FIG. 28A]
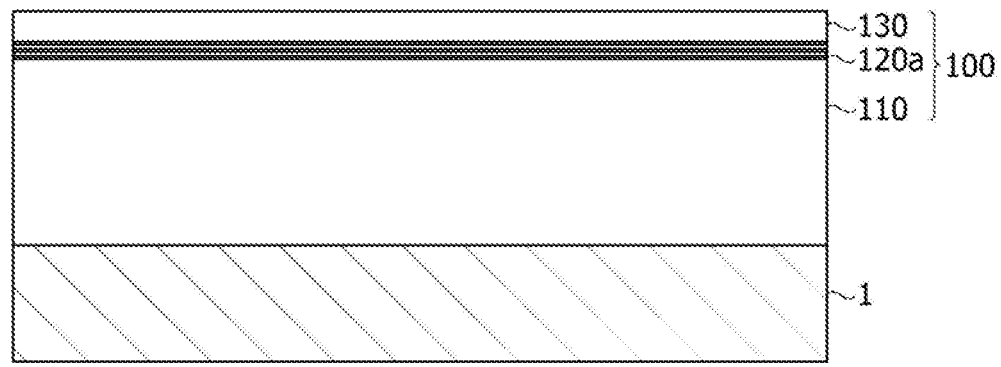

[FIG. 28B]
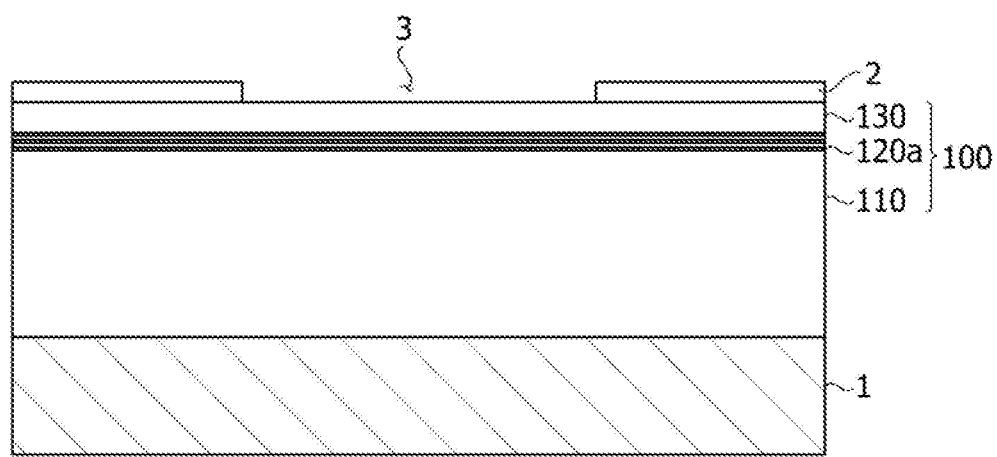
[FIG. 28C]
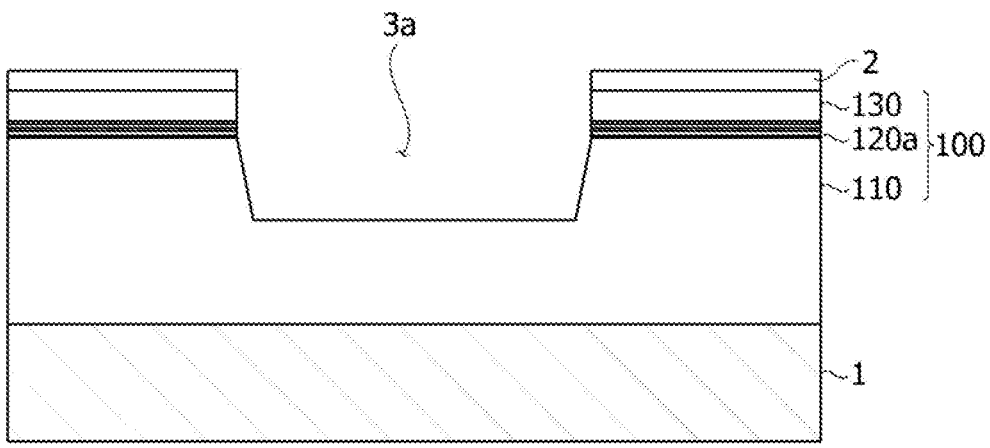

[FIG. 28D]
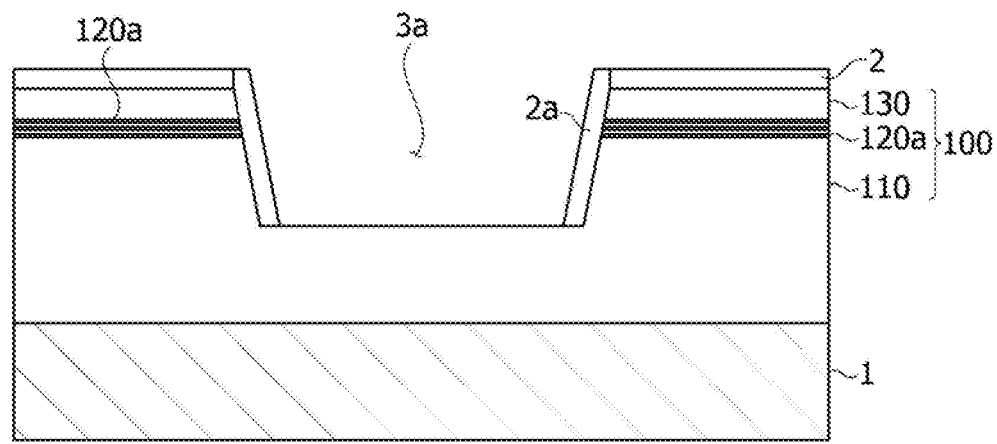
[FIG. 28E]
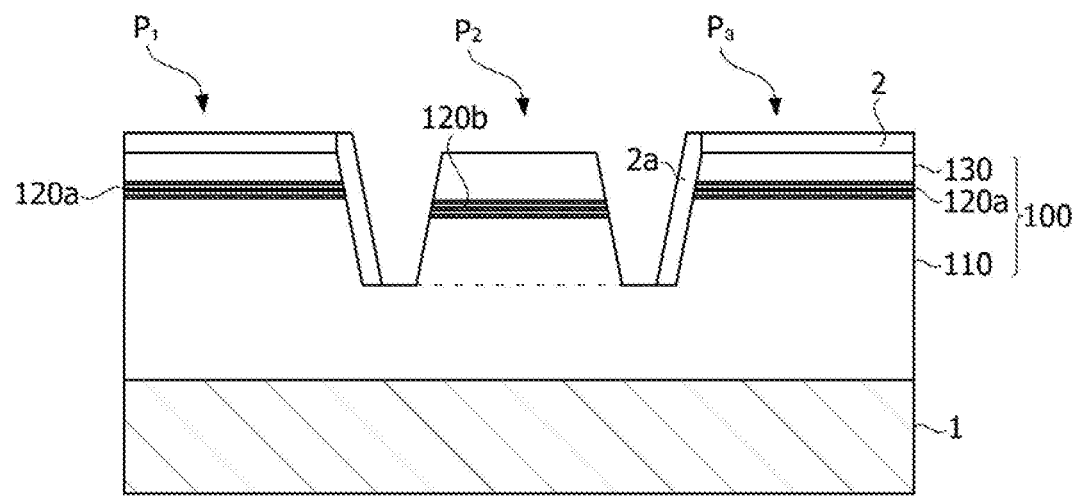

[FIG. 28F]
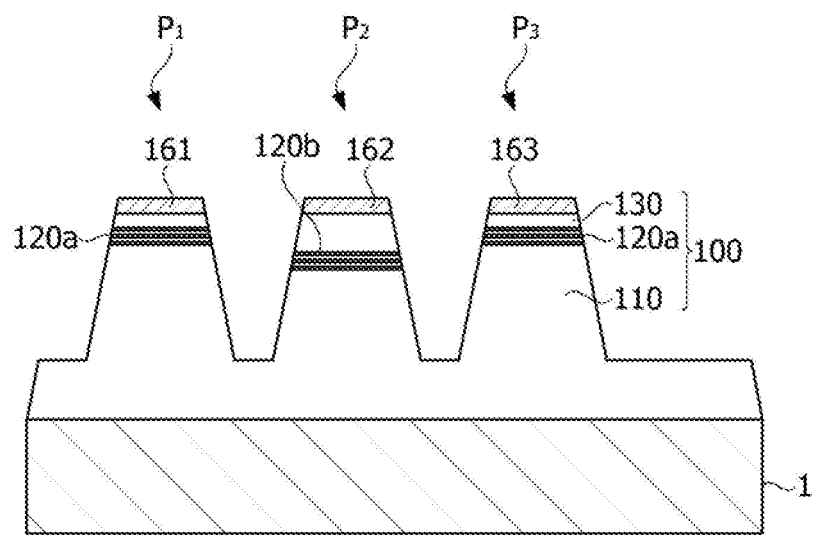

[FIG. 29A]
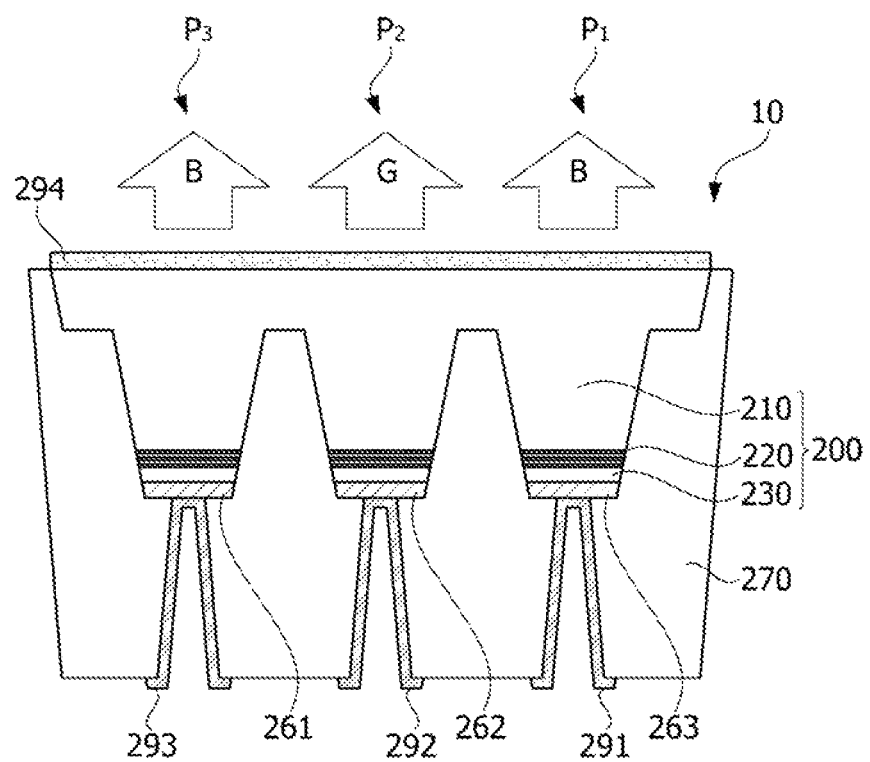

[FIG. 29B]
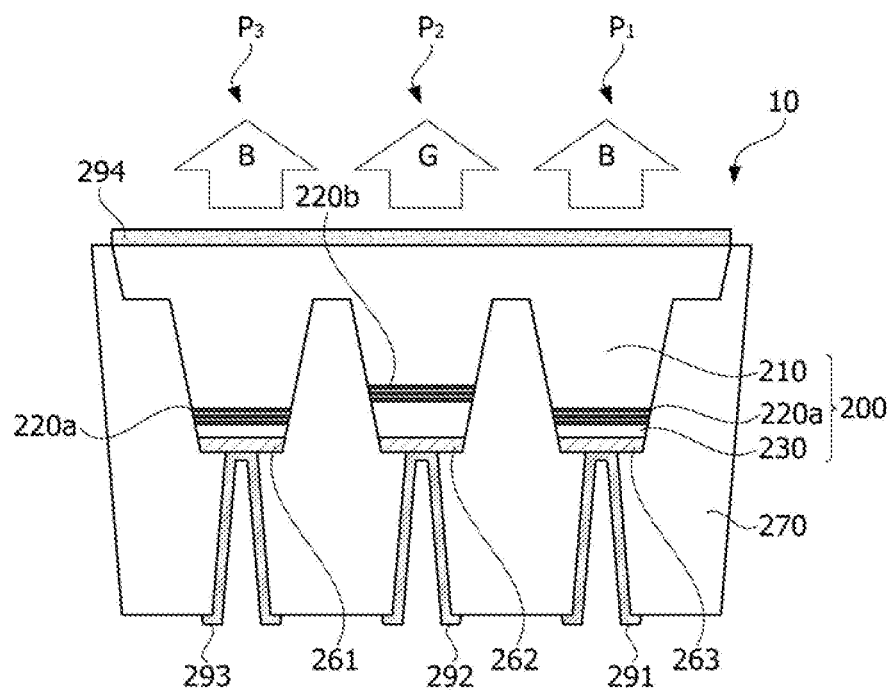

[FIG. 30A]
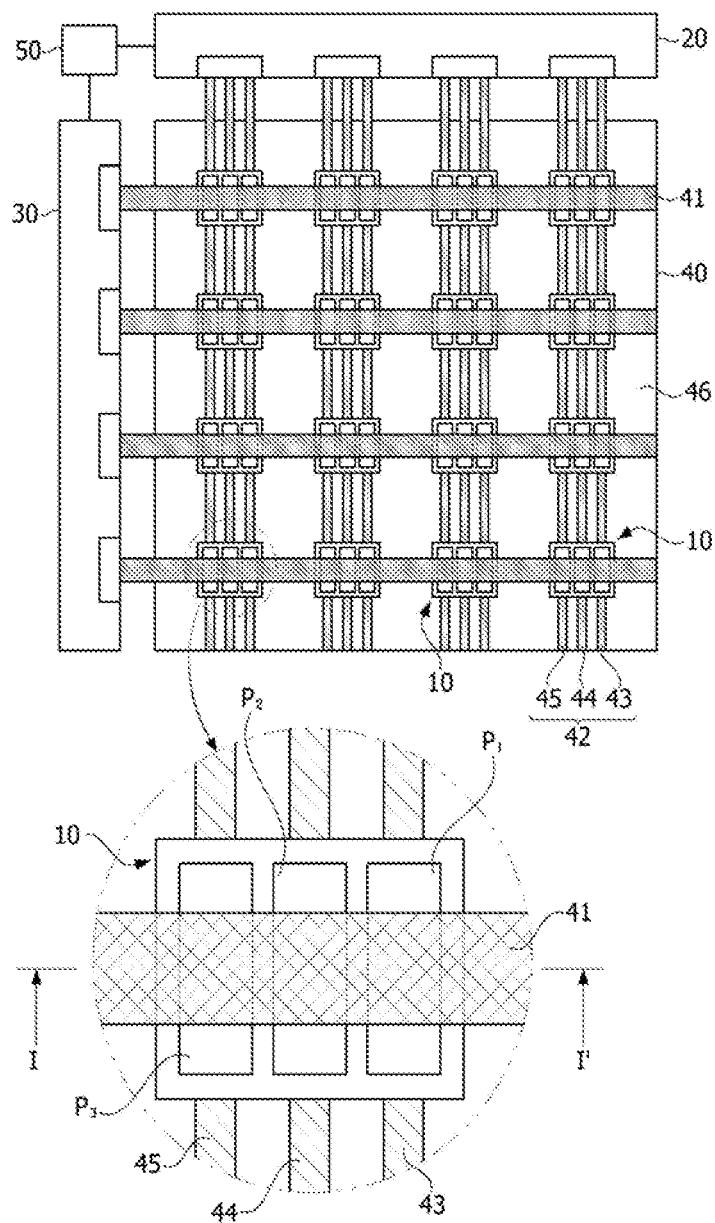

[FIG. 30B]
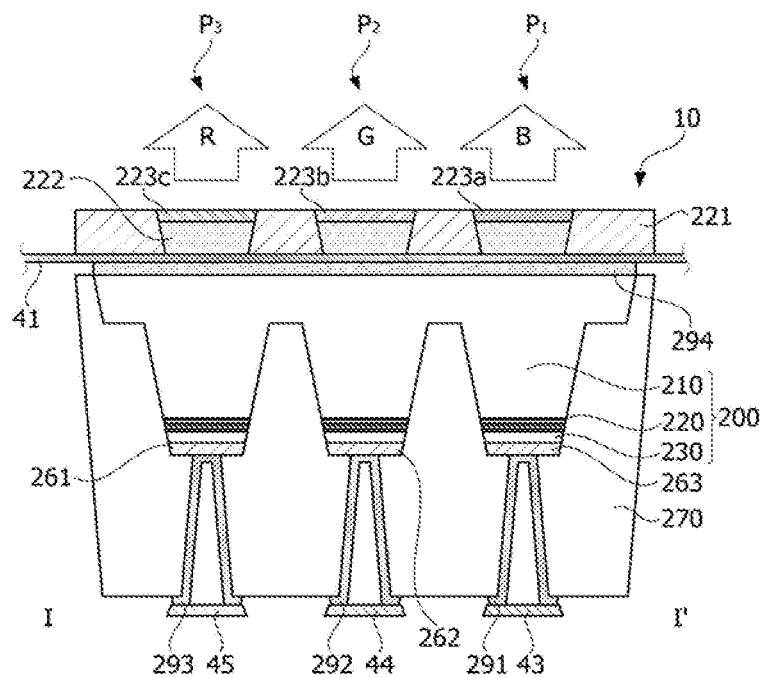

[FIG. 30C]
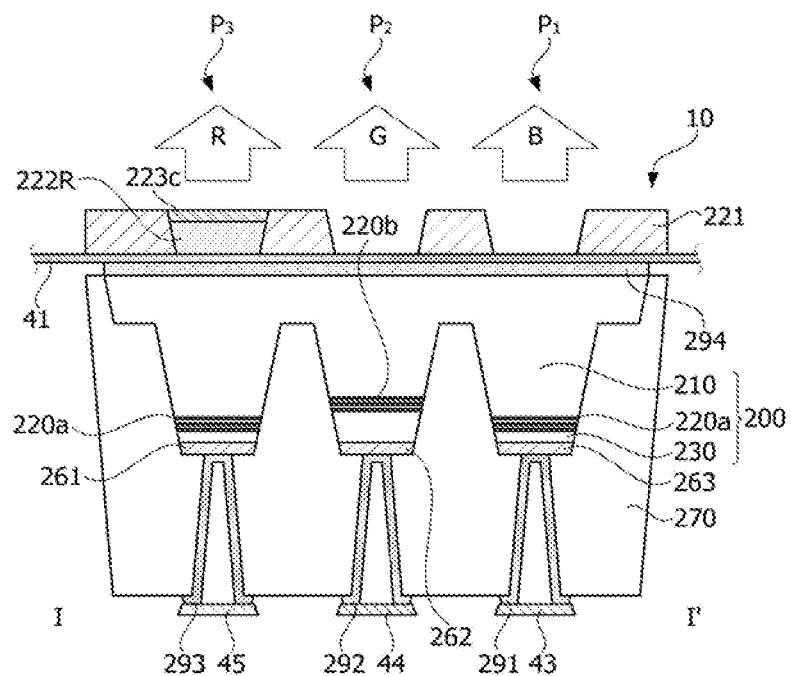
[FIG. 31A]
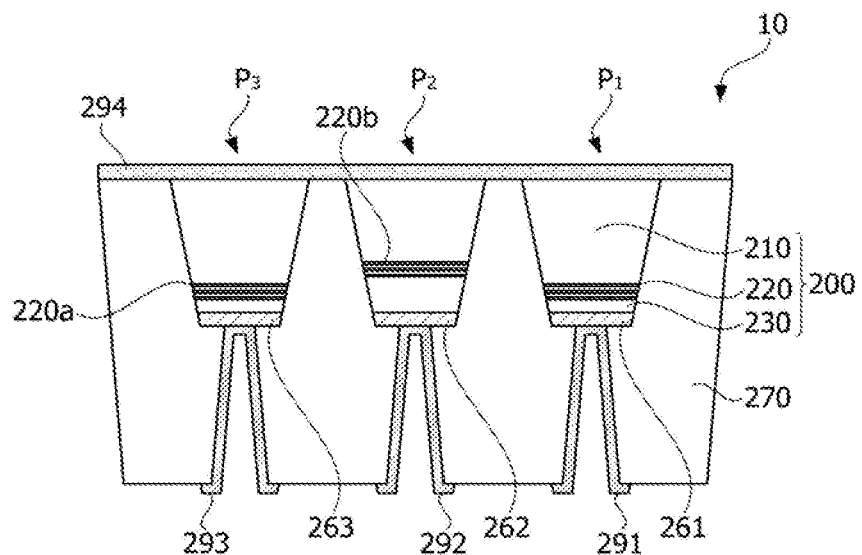

[FIG. 31B]
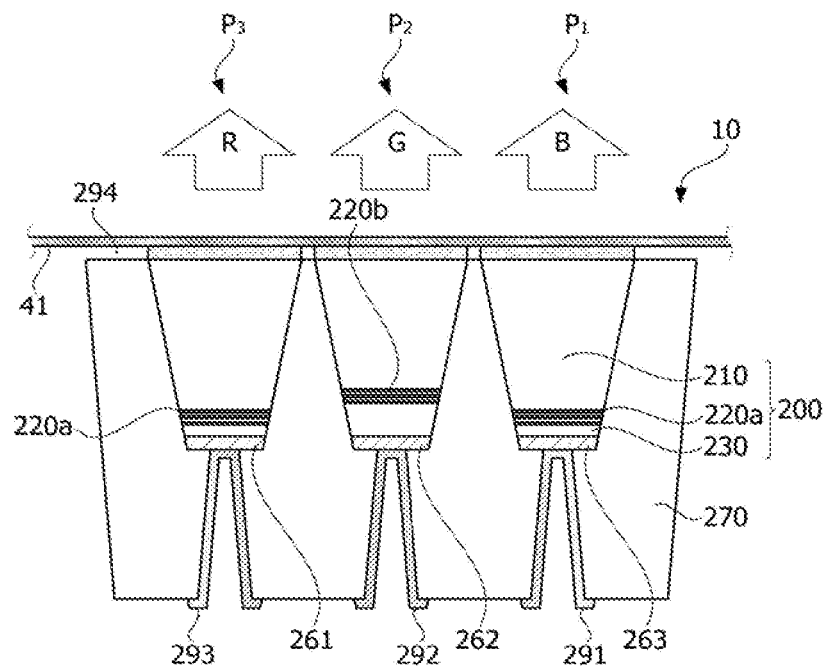
[FIG. 32A]
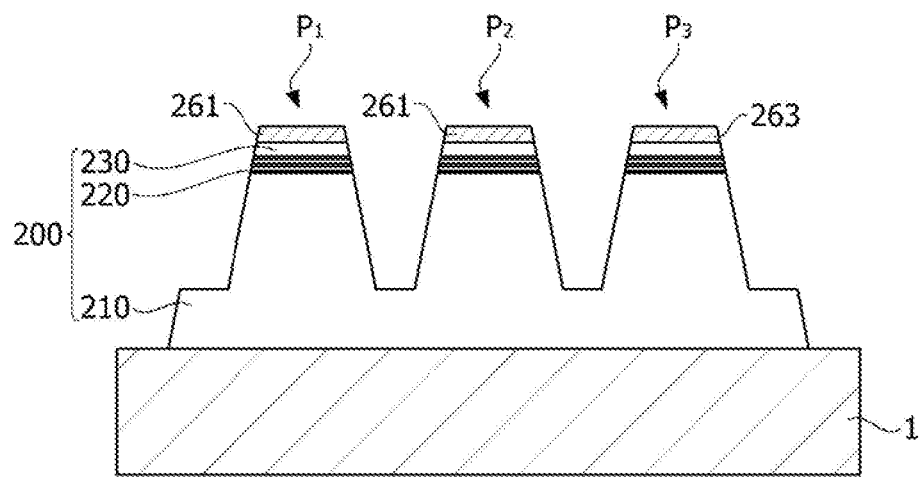

【FIG. 32B】
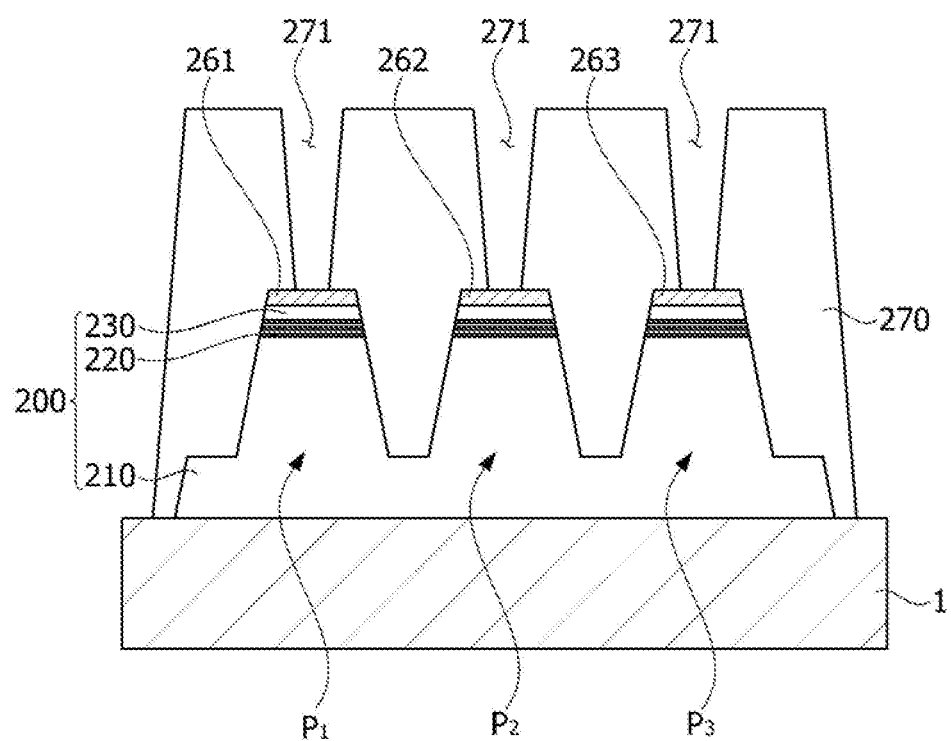

[FIG. 32C]
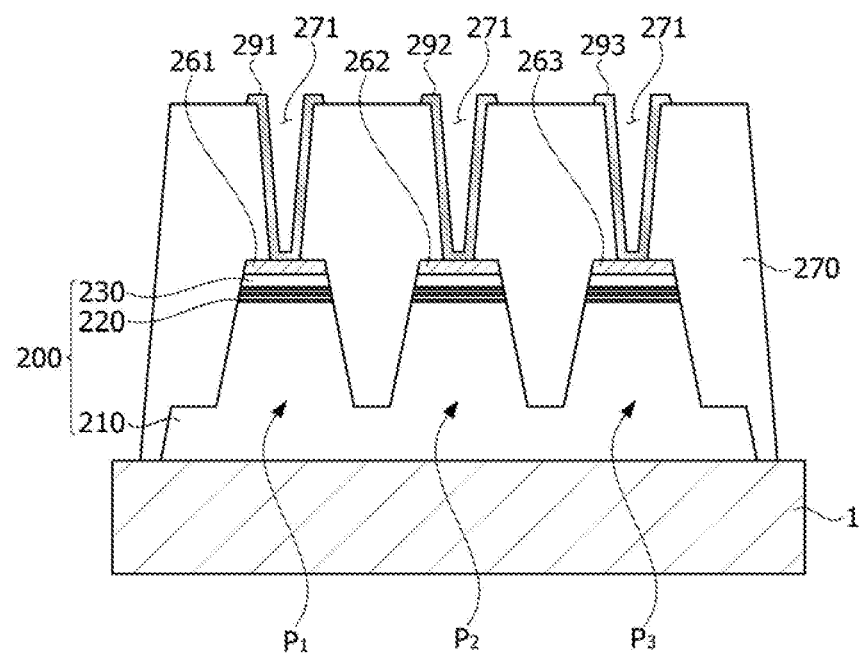

[FIG. 32D]
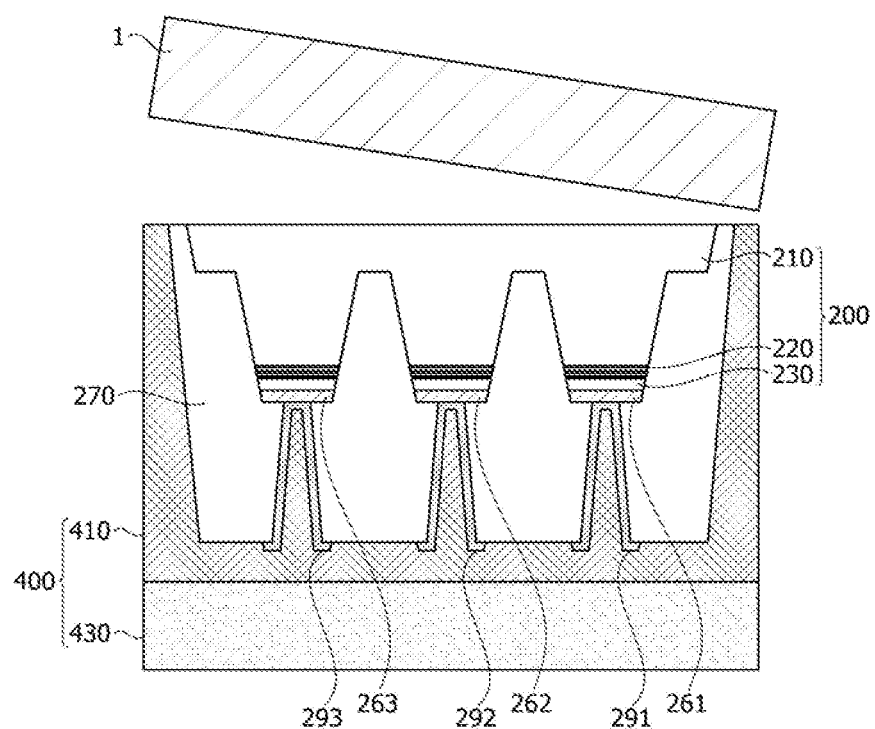

[FIG. 32E]
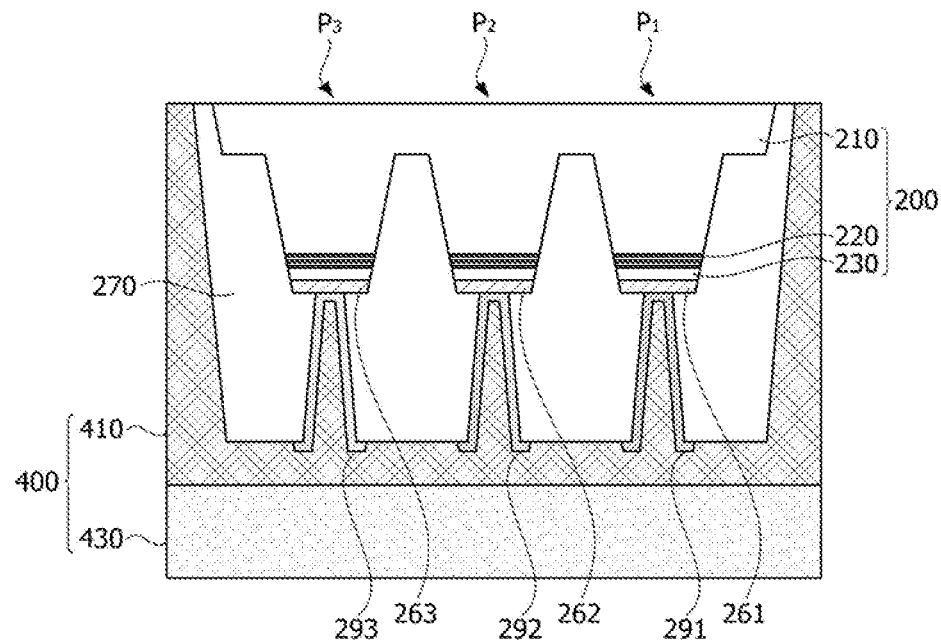
[FIG. 32F]
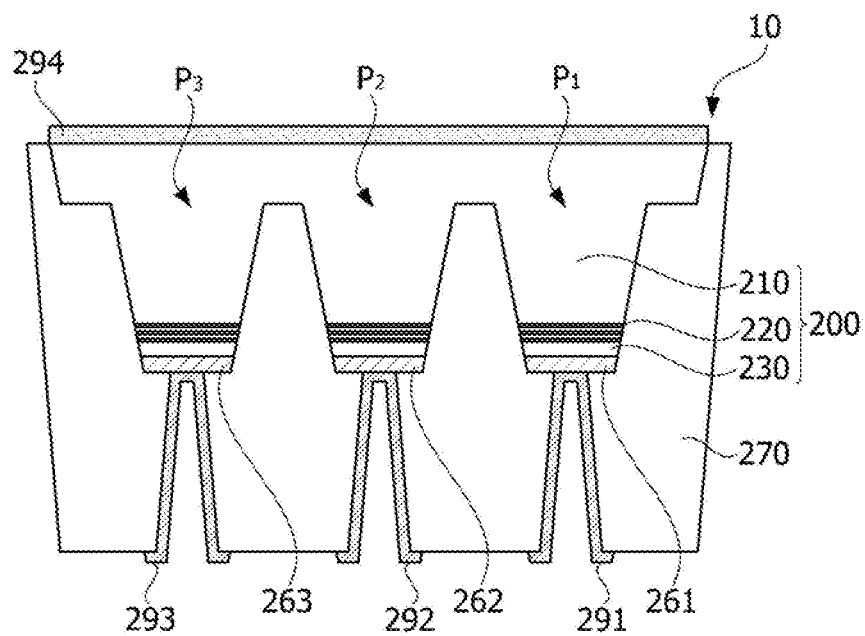

[FIG. 33A]
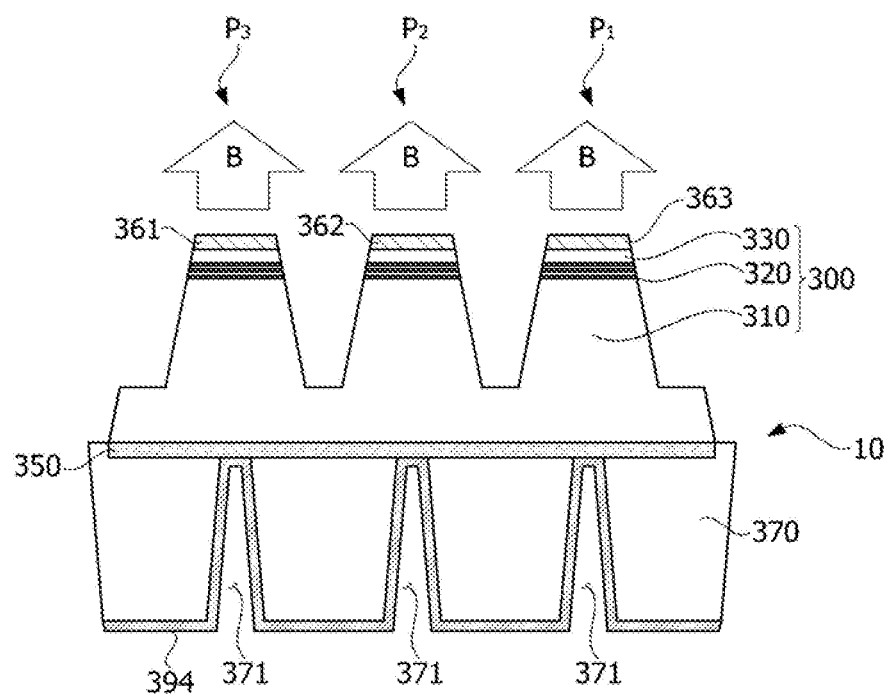

【FIG. 33B】
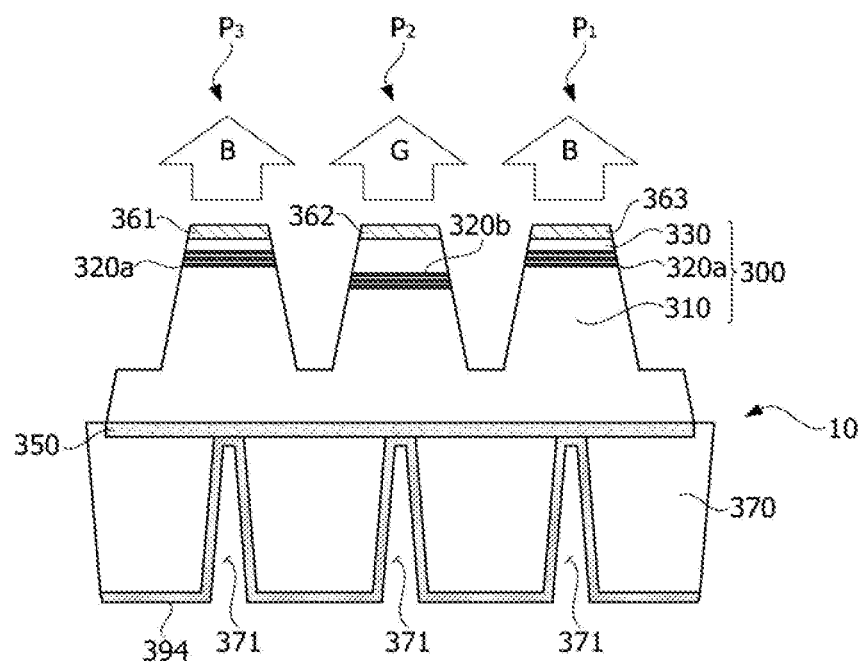

【FIG. 34A】
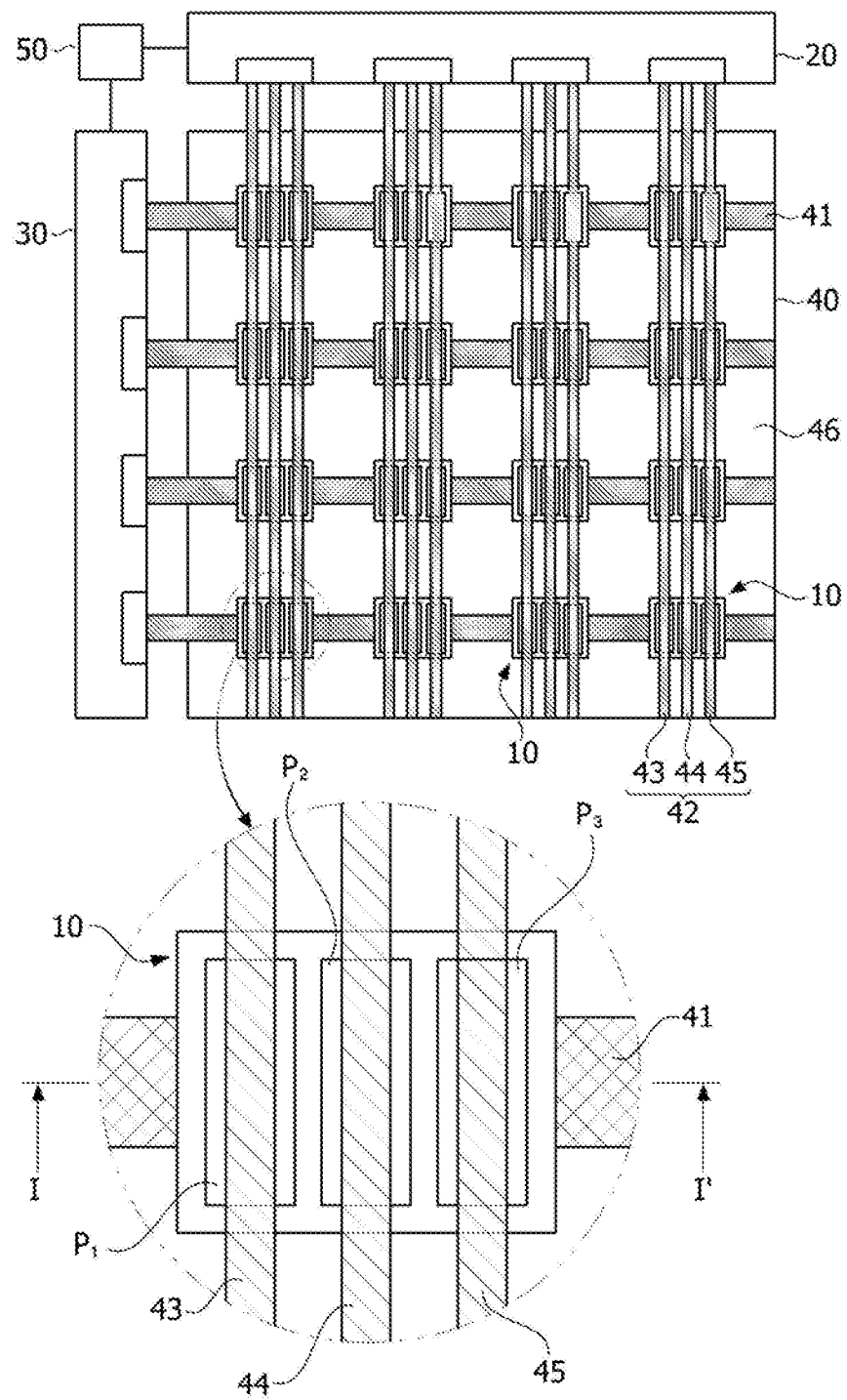

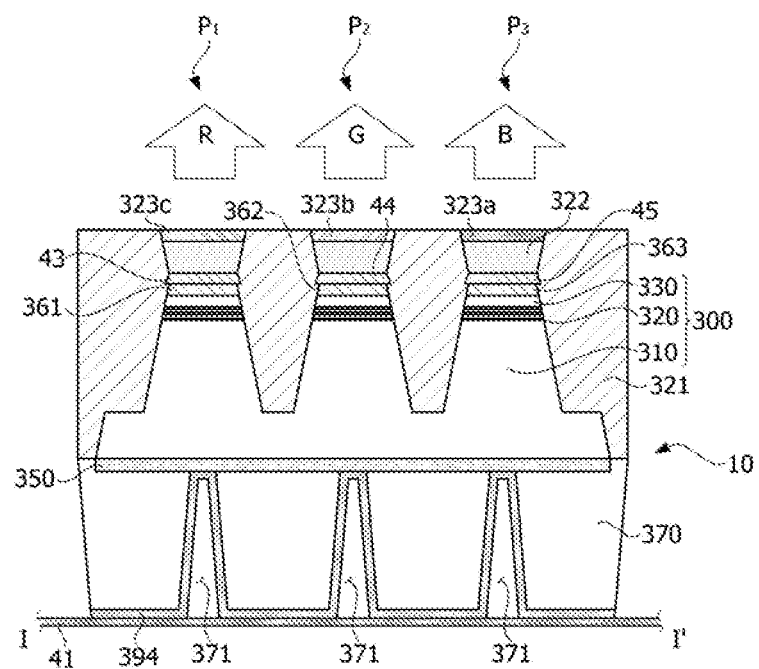
[FIG. 34B]

[FIG. 34C]
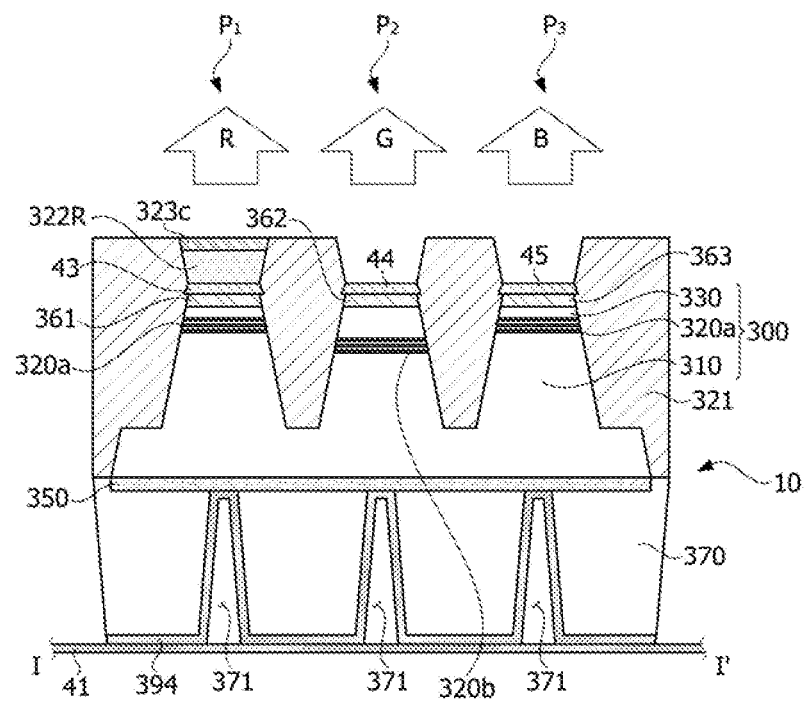
[FIG. 35A]
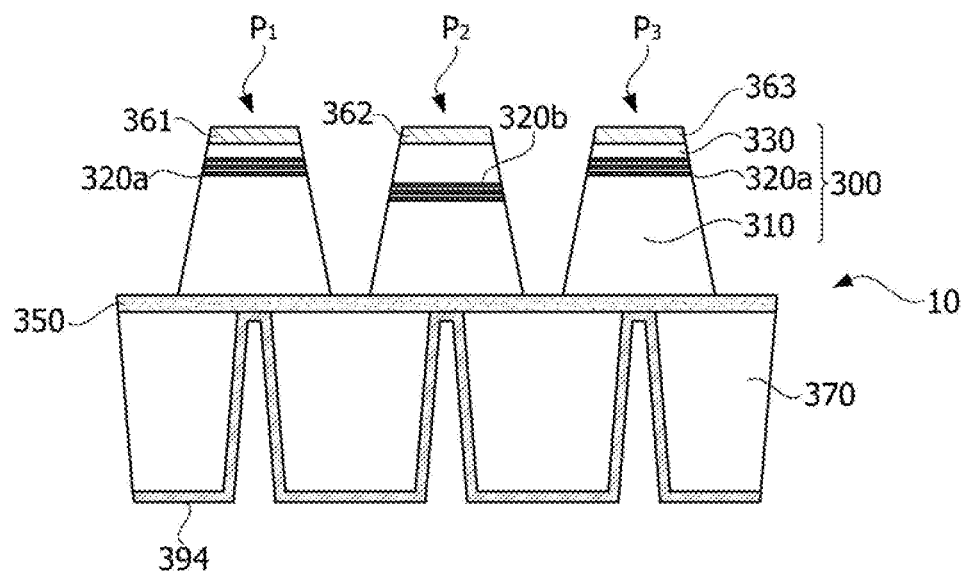

【FIG. 35B】
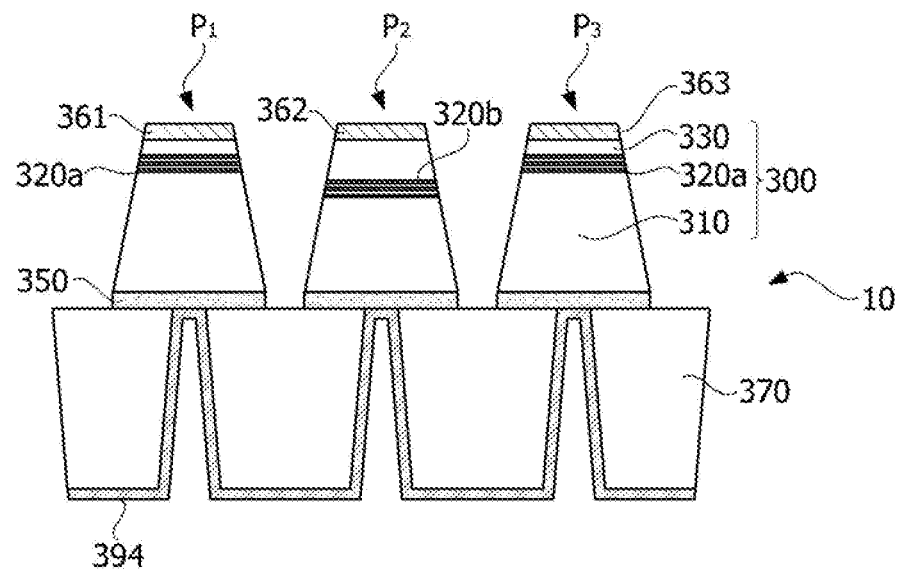
【FIG. 35C】
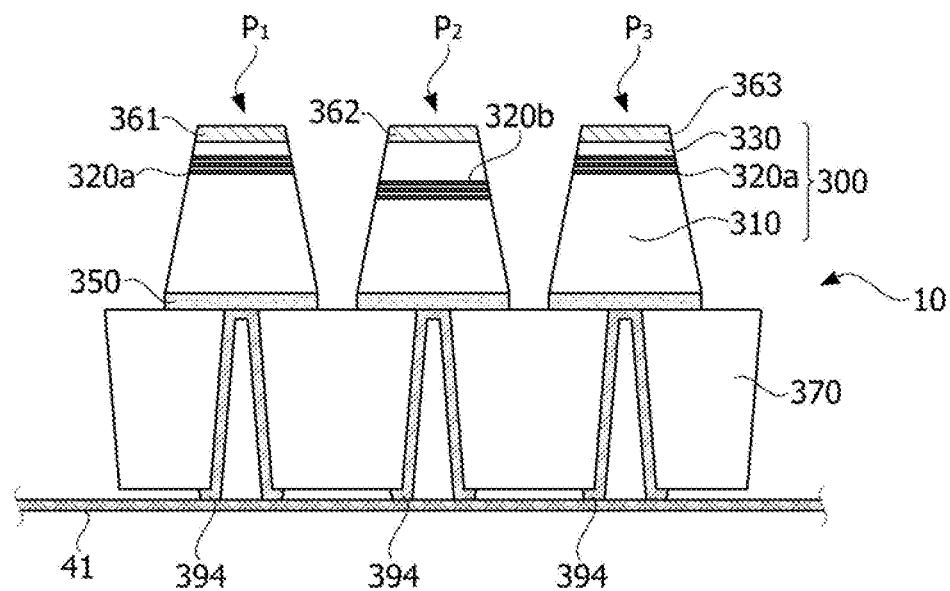

【FIG. 36A】
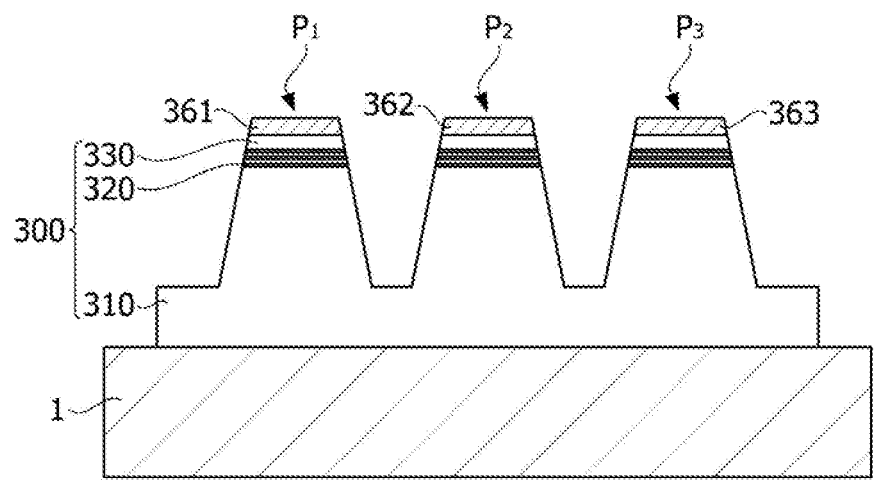
【FIG. 36B】
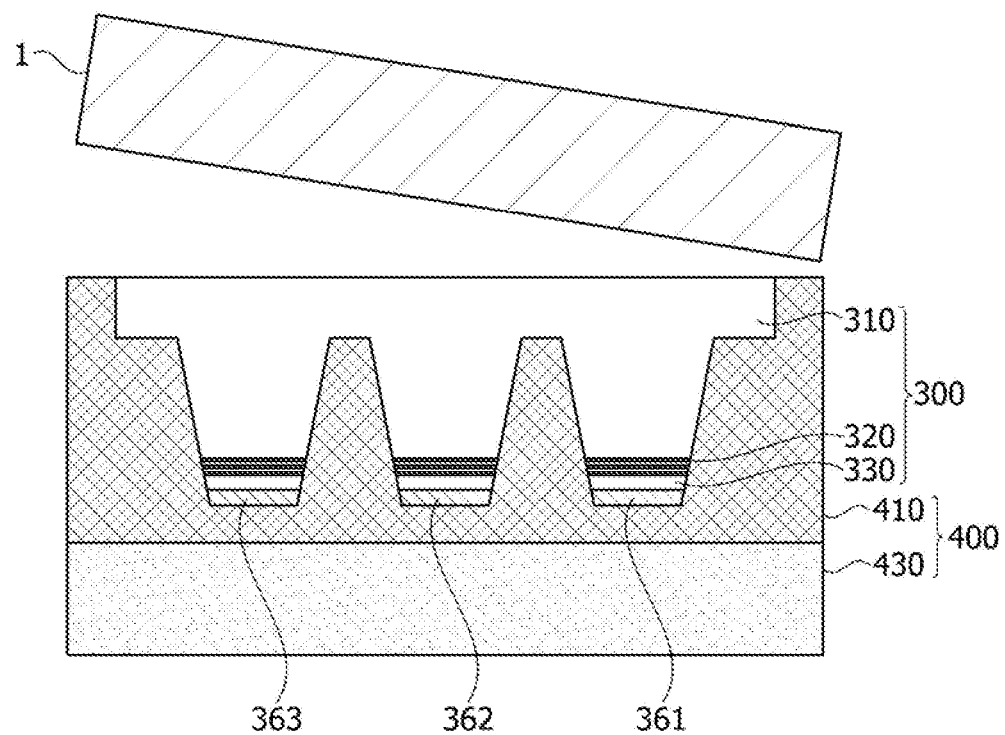

[FIG. 36C]
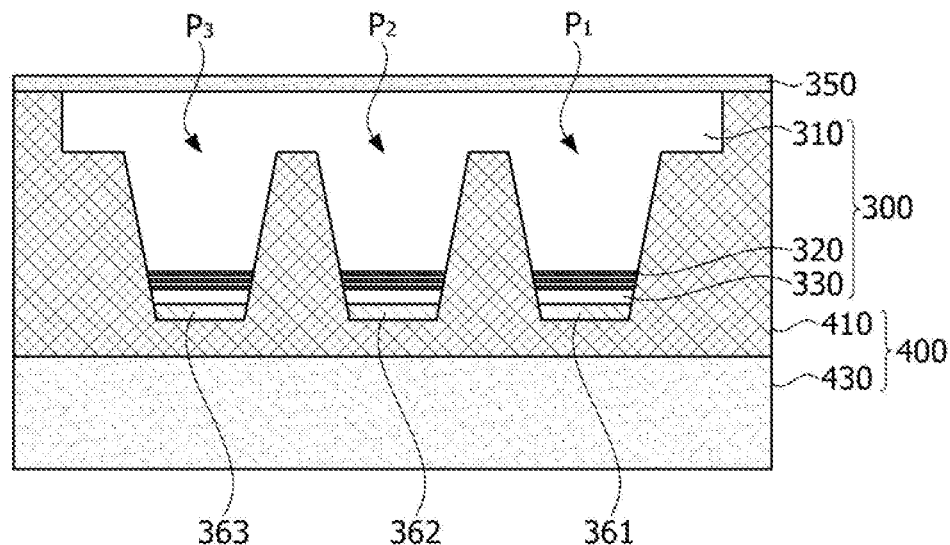
[FIG. 36D]
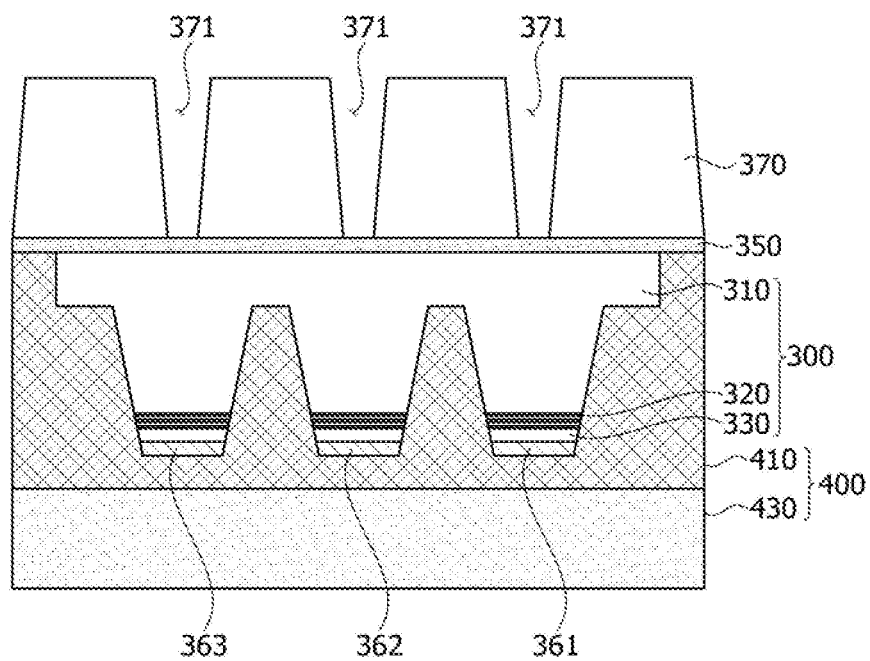

[FIG. 36E]
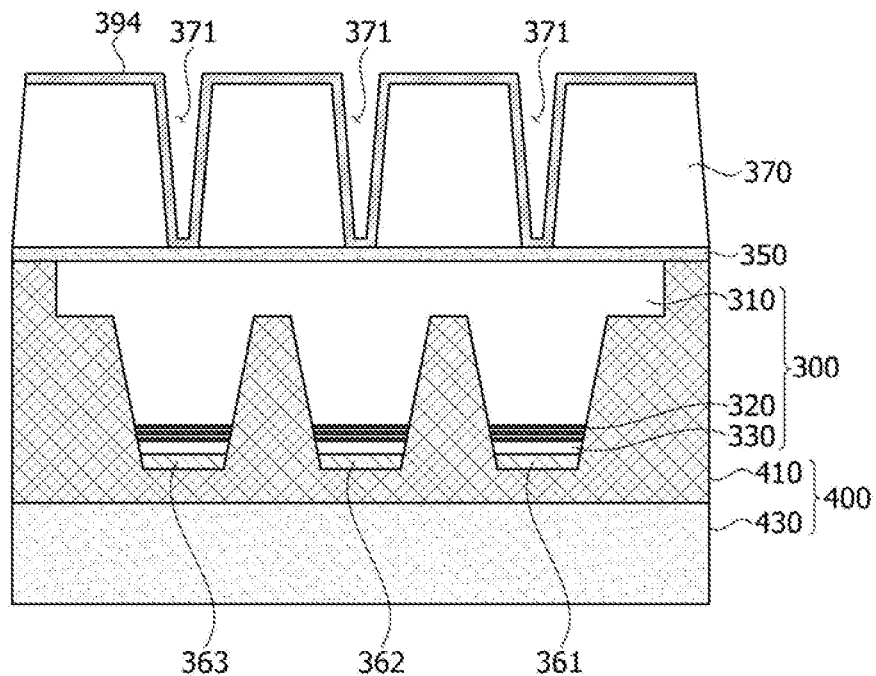
[FIG. 36F]
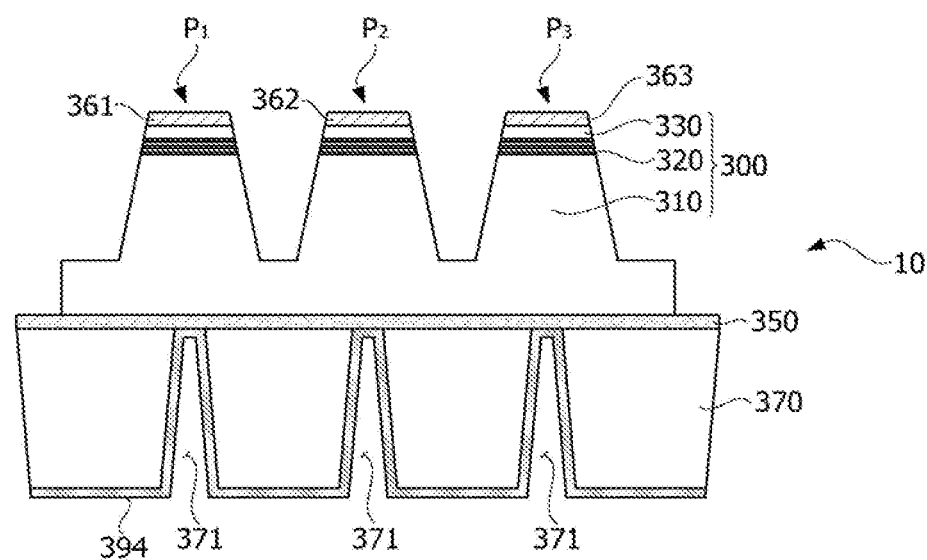

[FIG. 37A]
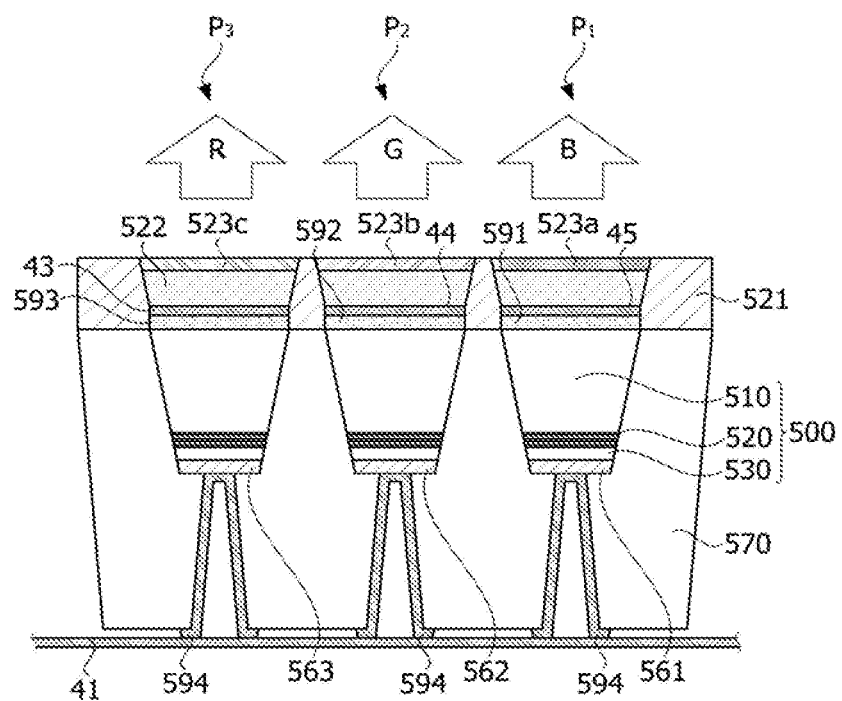

[FIG. 37B]
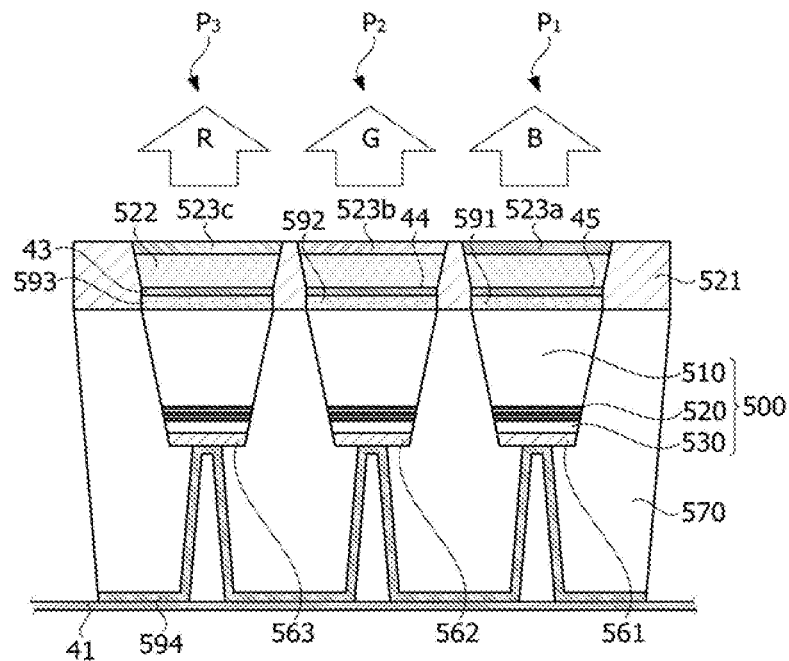
[FIG. 38]
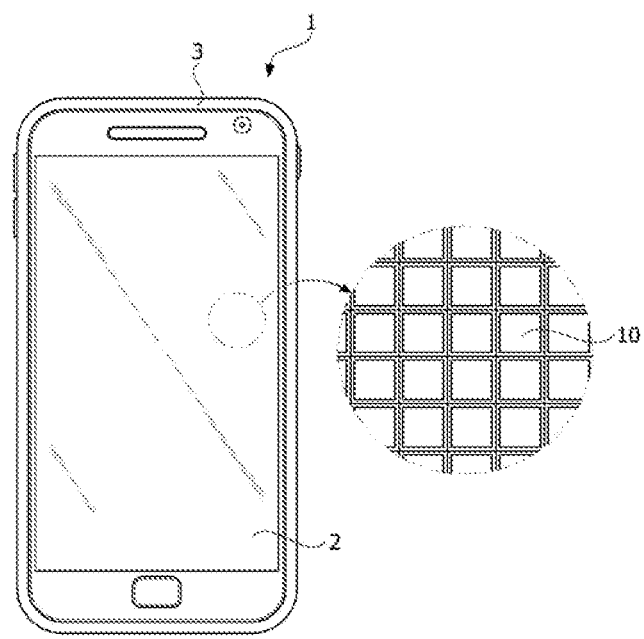

[FIG. 39]
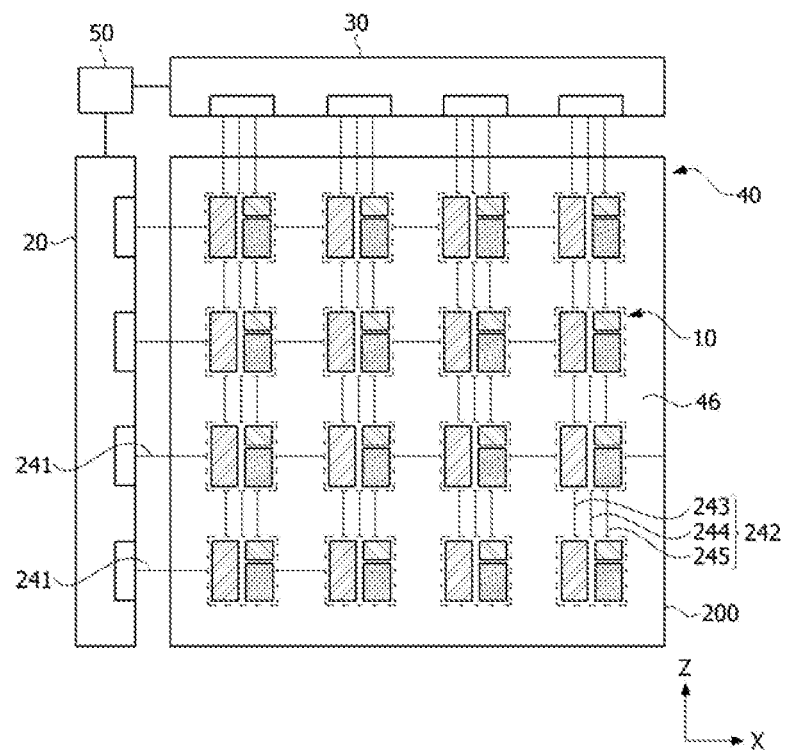
[FIG. 40]
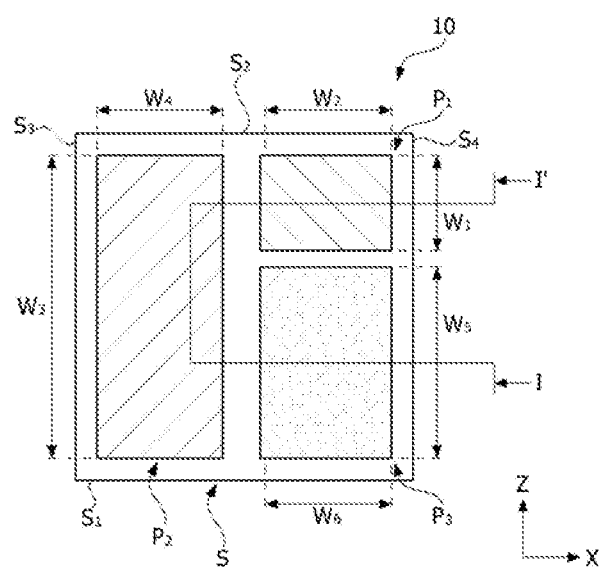

【FIG. 41】
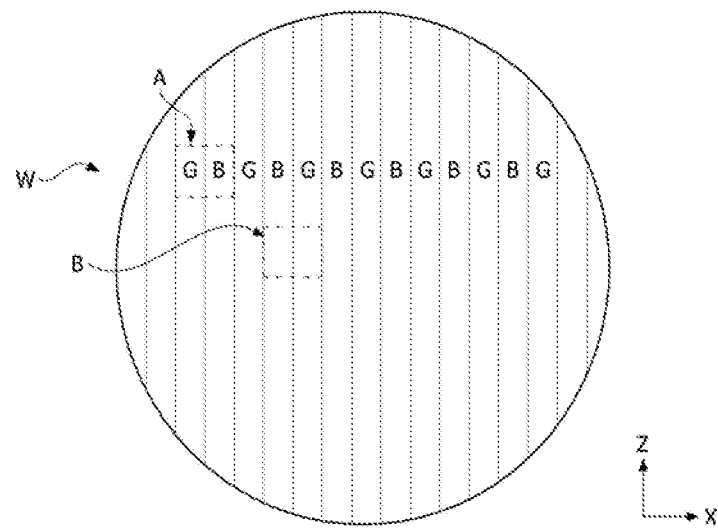
【FIG. 42】
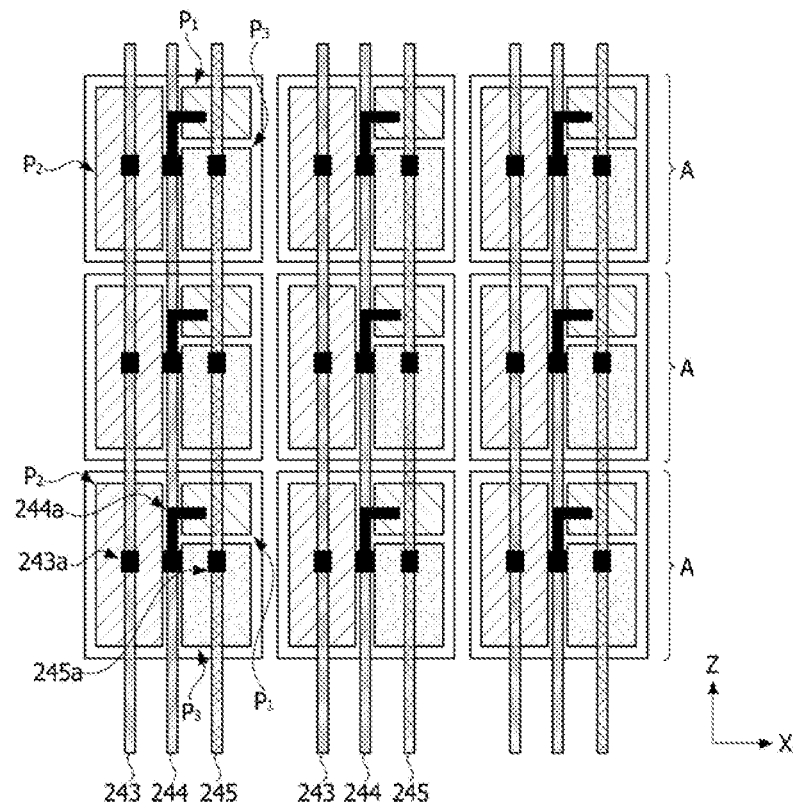

[FIG. 43]
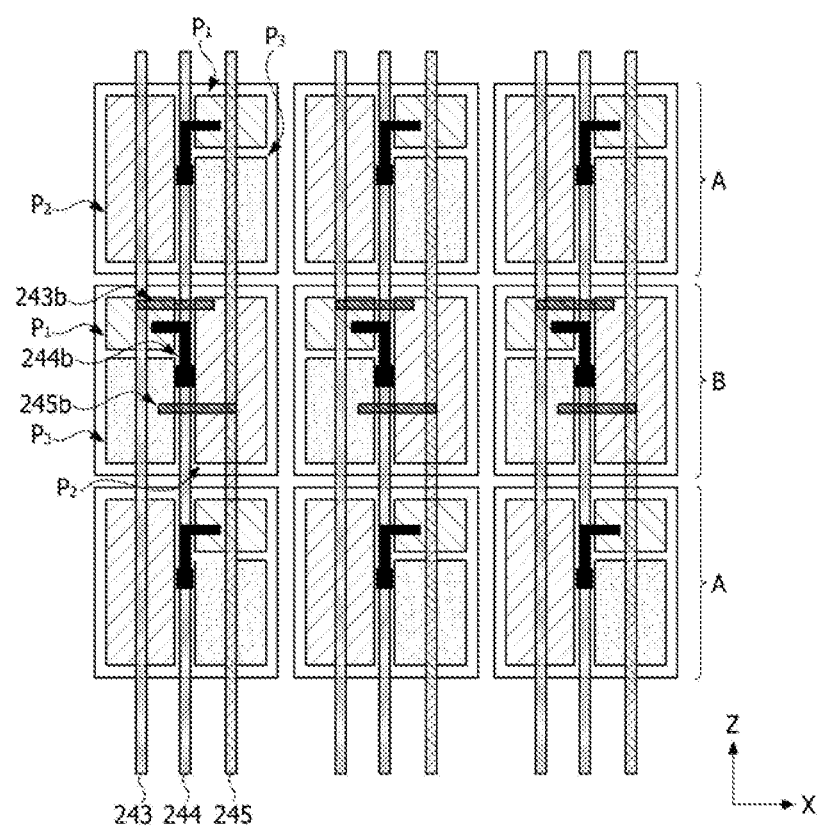

[FIG. 44]
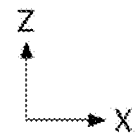
[FIG. 45]
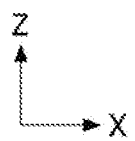

【FIG. 46】
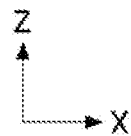
【FIG. 47】
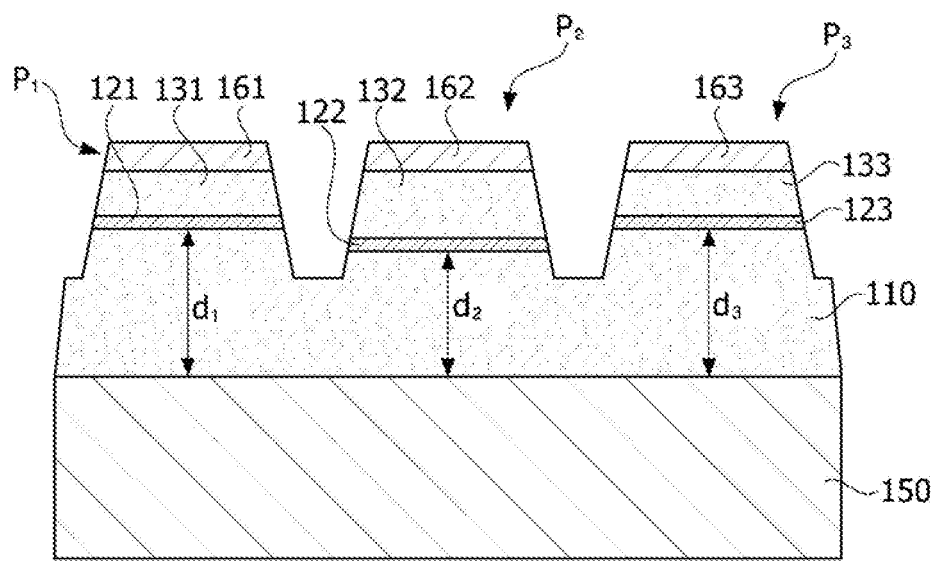

[FIG. 48]
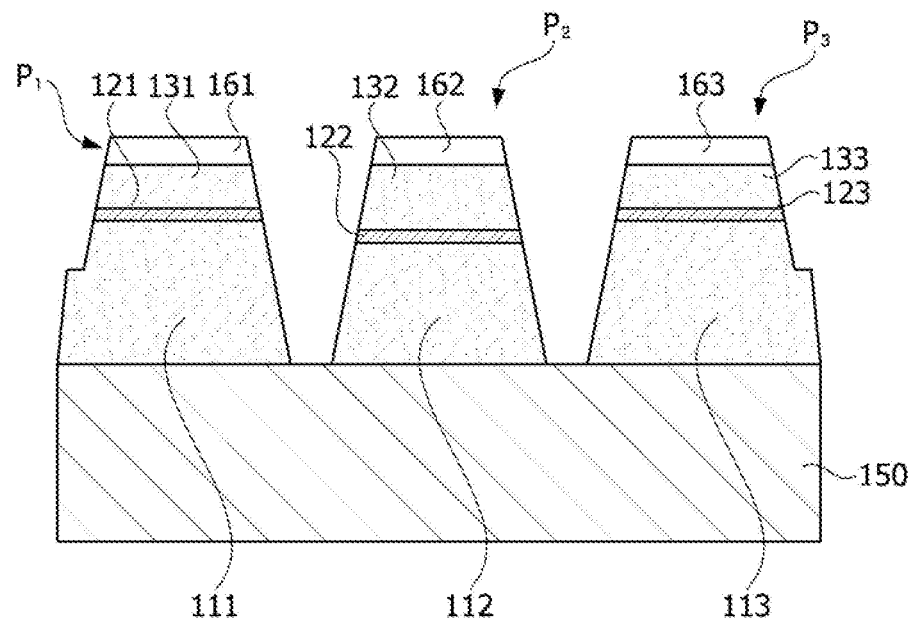
[FIG. 49A]
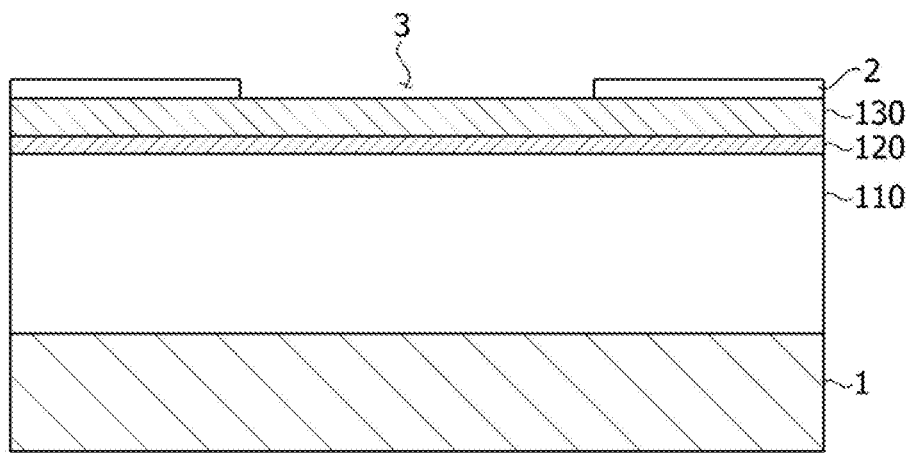

[FIG. 49B]
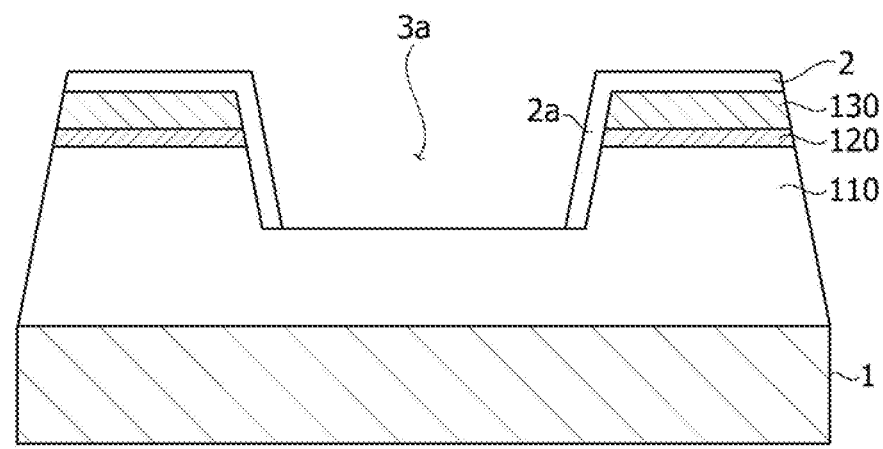
[FIG. 49C]
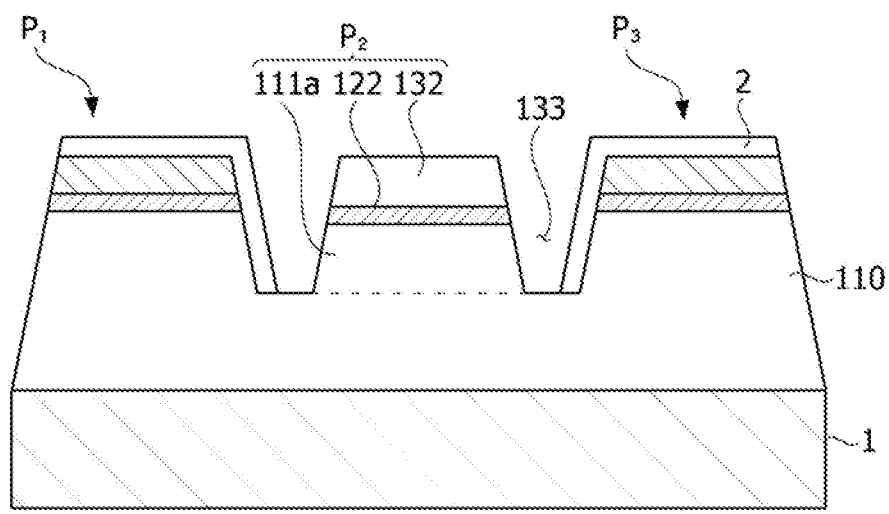

【FIG. 49D】
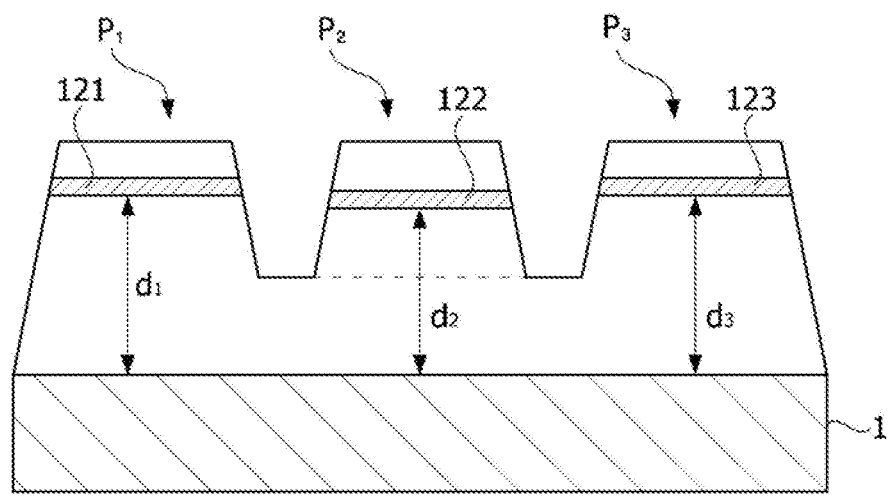
【FIG. 49E】
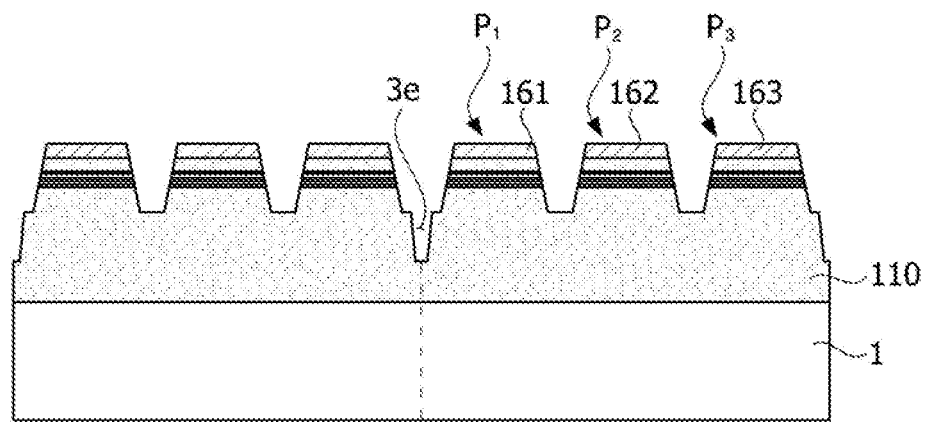

[FIG. 49F]
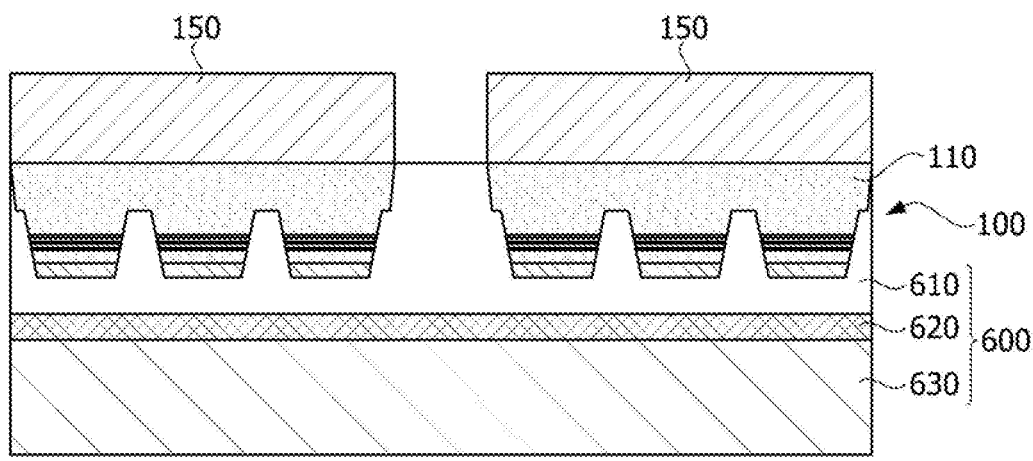
[FIG. 49G]
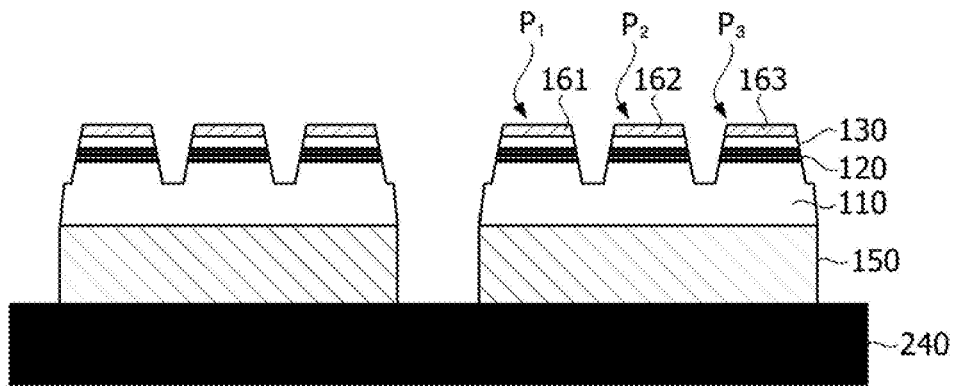

【FIG. 50】
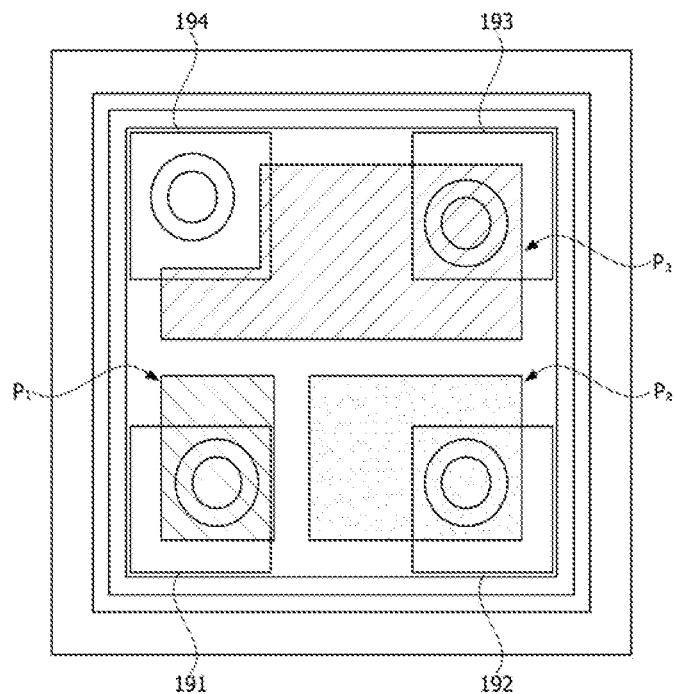
【FIG. 51】
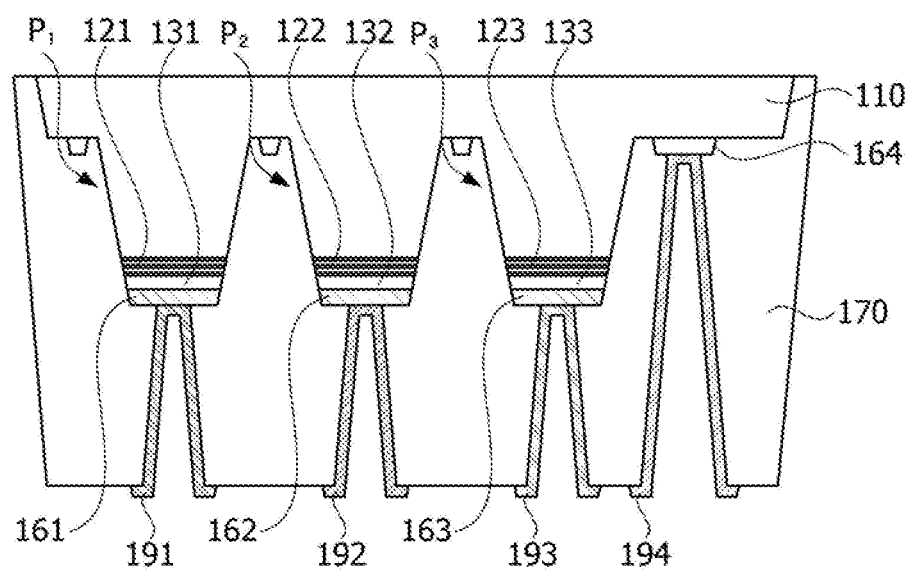

SEMICONDUCTOR DEVICE AND DISPLAY DEVICE INCLUDING THE SAME

CROSS REFERENCE TO RELATED APPLICATIONS

This application is the National Phase of PCT International Application No. PCT/KR2017/002903, filed on Mar. 17, 2017, which claims priority under 35 U.S.C. 119(a) to Patent Application Nos. 10-2016-0032819, filed in the Republic of Korea on Mar. 18, 2016, 10-2016-0071810, filed in the Republic of Korea on Jun. 9, 2016 and 10-2016-0077444 filed in the Republic of Korea on Jun. 21, 2016, all of which are hereby expressly incorporated by reference into the present application.

TECHNICAL FIELD

Embodiments relate to a semiconductor device and a display device including the same.

BACKGROUND ART

Due to having numerous advantages such as having wide and easily-adjustable bandgap energy, a semiconductor device including a compound such as GaN and AlGaN may be used in various ways as a light emitting device, a light receiving device, various diodes, and the like.

Particularly, a light emitting device such as a light emitting diode (LED) or a laser diode using a Group III-V or Group II-VI compound semiconductor material of a semiconductor is capable of implementing various colors such as red, green, blue, and ultraviolet due to the development of thin film growth techniques and device materials, is also capable of implementing white light with high efficiency by using a fluorescent material or combining colors, and has advantages of having low power consumption, semi-permanent service life, rapid response speed, safety, and being environmentally friendly in comparison to existing light sources such as a fluorescent lamp and an incandescent lamp.

Furthermore, a light receiving device such as a photodetector or a solar cell is also capable of using light in various wavelength bands from gamma-ray to radio wavelength bands by absorbing light in the various wavelength bands and generating a photoelectric current when the light receiving device is manufactured using a Group III-V or Group II-VI compound semiconductor material of a semiconductor. Also, due to having advantages of rapid response speed, safety, environment-friendliness, and easiness of adjusting device materials, the light receiving device may be easily used for a power control circuit, a microwave circuit, or a communication module.

Therefore, the scope of application of semiconductor devices is expanded to a transmission module of an optical communication means, an LED backlight which substitutes for a cold cathode fluorescence lamp (CCFL) constituting a backlight of a liquid crystal display (LCD), a white light LED lighting device capable of substituting for a fluorescent light bulb or an incandescent light bulb, a vehicle headlight, a traffic light, a sensor for sensing gas or fire, and the like. The scope of application of semiconductor devices may be further expanded to a microwave circuit, other power control devices and a communication module.

In recent years, there has been demand for a display device having a high definition and large screen. However, since an LCD and an organic electroluminescent display device having complex configurations have low yield and are high cost, it is difficult to implement a high-definition, large-screen display device therewith.

SUMMARY

Embodiments provide a semiconductor device capable of implementing a plurality of colors at a chip level and a display device including the same.

Embodiments provide a light emitting device capable of serving as pixels of a display.

Embodiments provide a display device capable of implementing a high-resolution, large-screen display device.

Embodiments provide a display device in which pixels are configured by a plurality of light emitting devices.

Technical Solution

A semiconductor device according to an embodiment includes a light emitting structure including a first conductive type semiconductor layer, a plurality of active layers disposed to be spaced apart on the first conductive type semiconductor layer, and a plurality of second conductive type semiconductor layers disposed on the plurality of active layers, respectively, a first electrode electrically connected to the first conductive type semiconductor layer, and a plurality of second electrodes electrically connected to the plurality of second conductive type semiconductor layers, respectively, wherein the plurality of active layers include a first active layer, a second active layer, and a third active layer, the light emitting structure includes a first light emitter including the first active layer, a second light emitter including the second active layer, and a third light emitter including the third active layer, the first active layer emits light in a blue wavelength band, the second active layer emits light in a green wavelength band, and a height of the second active layer differs from a height of the first active layer.

A height of the third active layer may differ from heights of the first and second active layers, and the third active layer may emit red light.

The first conductive type semiconductor layers of the first, second, and third light emitters may be disposed to be separated from each other, and the separated first conductive type semiconductor layers may be electrically connected to each other by connecting electrodes.

The first conductive type semiconductor layer may include a base part and a plurality of convex parts and concave parts disposed on the base part, the plurality of active layers may be disposed on the plurality of convex parts, and a cross-sectional area of the base part may progressively increase or decrease toward the active layers.

A thickness of the concave part may be in a range of 10% to 60% of the maximum thickness of the light emitting structure.

The semiconductor device may include a protective layer disposed on the light emitting structure and configured to expose one surface of the first conductive type semiconductor layer, and a wavelength converting layer and a color filter disposed on the one surface of the first conductive type semiconductor layer, wherein the first electrode may be electrically connected to the first conductive type semiconductor layer via the protective layer, the plurality of second electrodes may be electrically connected to the plurality of second conductive type semiconductor layers via the protective layer, and the first electrode and the second electrodes may be disposed in a direction in which the second conductive type semiconductor layers are disposed with respect to the first, second, and third active layers.

The semiconductor device may include a protective layer disposed on the light emitting structure and configured to expose one surface of the first conductive type semiconductor layer, and a wavelength converting layer and a color filter disposed on the first electrode, wherein the first electrode may be disposed between the wavelength converting layer and the first conductive type semiconductor layer, and the plurality of second electrodes may be electrically connected to the second conductive type semiconductor layers via the protective layer.

The first light emitter and the third light emitter may be disposed to be spaced apart from the second light emitter in a first direction, the first light emitter and the third light emitter may be disposed to be spaced apart in a second direction that is perpendicular to the first direction, the second light emitter may be longer than the first light emitter or the third light emitter in the second direction, the first light emitter may emit light in a blue wavelength band, the second light emitter may emit light in a green wavelength band, and the third light emitter may emit light in a blue or red wavelength band.

A display device according to an embodiment of the present disclosure includes a panel including a plurality of common lines and a plurality of driving lines, and a plurality of semiconductor devices disposed in a region in which the common lines and the driving lines intersect, wherein the semiconductor device includes a light emitting structure including a first conductive type semiconductor layer, a plurality of active layers disposed to be spaced apart on the first conductive type semiconductor layer, and a plurality of second conductive type semiconductor layers disposed on the plurality of active layers, respectively, a first electrode electrically connected to the first conductive type semiconductor layer, and a plurality of second electrodes electrically connected to the plurality of second conductive type semiconductor layers, respectively, the plurality of active layers include a first active layer, a second active layer, and a third active layer, the light emitting structure includes a first light emitter including the first active layer, a second light emitter including the second active layer, and a third light emitter including the third active layer, the first active layer emits light in a blue wavelength band, the second active layer emits light in a green wavelength band, a height of the second active layer differs from a height of the first active layer, and the first, second, and third light emitters constitute first, second, and third subpixels configured to emit lights in blue, green, and red wavelength bands, respectively.

The first light emitter and the third light emitter may be disposed to be spaced apart from the second light emitter in a first direction, the first light emitter and the third light emitter may be disposed to be spaced apart in a second direction that is perpendicular to the first direction, the second light emitter may be longer than the first light emitter or the third light emitter in the second direction, the first light emitter may emit light in a blue wavelength band, the second light emitter may emit light in a green wavelength band, and the third light emitter may emit light in a blue or red wavelength band.

Advantageous Effects

According to an embodiment, a single semiconductor device can simultaneously implement a plurality of colors at a chip level. Therefore, the semiconductor device can serve as pixels of a display device.

Further, when the semiconductor device at a chip level is used as pixels, the pixel density can be increased in a display device of the same size. Therefore, a high-resolution, large-screen display device can be implemented.

Further, since the semiconductor device at a chip level is used as pixels instead of conventional RGB packages, an additional packaging process such as die-bonding and wire bonding can be omitted.

Further, the readability of a curved image can be improved.

Further, a structure of driving lines can be simplified, and a conventional driver integrated circuit (IC) can be used without change.

Various advantageous effects of the present disclosure are not limited to those mentioned above and will become more apparent in the process of describing specific embodiments of the present disclosure.

DESCRIPTION OF DRAWINGS

FIG. 1 is a view for describing a light emitting structure according to an embodiment of the present disclosure.

FIG. 2 is a view for describing a plurality of light emitters in FIG. 1.

FIG. 3 is a view for describing a structure for removing optical interference between the plurality of light emitters.

FIG. 4 is a view in which a light-interrupting layer is disposed between the plurality of light emitters.

FIG. 5 is a view for describing light emitting areas of the plurality of light emitters.

FIGS. 6A to 6C are views for describing configurations in which light emitting areas of the plurality of light emitters differ.

FIGS. 7A to 7F are views for describing a method of manufacturing a light emitting structure according to a first embodiment of the present disclosure.

FIGS. 8A to 8D are views for describing a method of manufacturing a light emitting structure according to a second embodiment of the present disclosure.

FIGS. 9A to 9F are views for describing a method of manufacturing a light emitting structure according to a third embodiment of the present disclosure.

FIGS. 10A to 10F are views for describing a method of manufacturing a light emitting structure according to a fourth embodiment of the present disclosure.

FIG. 11 is a view for describing a semiconductor device according to a first embodiment of the present disclosure.

FIGS. 12A to 12F are views for describing a method of manufacturing the semiconductor device according to the first embodiment of the present disclosure.

FIG. 13 is a view for describing a semiconductor device according to a second embodiment of the present disclosure.

FIGS. 14A to 14E are views for describing a method of manufacturing the semiconductor device according to the second embodiment of the present disclosure.

FIG. 15 is a view for describing a semiconductor device according to a third embodiment of the present disclosure.

FIGS. 16A to 16F are views for describing a method of manufacturing the semiconductor device according to the third embodiment of the present disclosure.

FIG. 17 is a view for describing a semiconductor device according to a fourth embodiment of the present disclosure.

FIG. 18 is a view for describing an electrode structure of the semiconductor device according to the fourth embodiment of the present disclosure.

FIG. 19 is a view for describing a state in which an electrode substrate is coupled to the semiconductor device in FIG. 17.

FIGS. 20A to 20F are views for describing a method of manufacturing the semiconductor device according to the fourth embodiment of the present disclosure.

FIG. 21 is a conceptual view for describing a display device according to an embodiment of the present disclosure.

FIG. 22 is a cross-sectional view taken along line A-A in FIG. 21.

FIG. 23 is a cross-sectional view taken along line B-B in FIG. 21.

FIGS. 24A and 24B are cross-sectional views of a light emitting device according to a fifth embodiment.

FIG. 24C is a plan view of a connecting electrode in FIG. 24A.

FIG. 25A is a plan view of a display device in which the light emitting device in FIG. 24B is disposed in every pixel region.

FIGS. 25B and 25C are cross-sectional views taken along line I-I' in FIG. 25A.

FIGS. 26A and 26B are cross-sectional views of a light emitting device according to another structure of the fifth embodiment.

FIGS. 27A to 27G are process cross-sectional views illustrating a method of manufacturing the light emitting device in FIG. 24A.

FIGS. 27H and 27I are process cross-sectional views illustrating a method of manufacturing the light emitting device in FIG. 26A.

FIGS. 28A to 28F are process cross-sectional views illustrating a method of manufacturing a light emitting structure in FIG. 24B.

FIGS. 29A and 29B are cross-sectional views of a light emitting device according to a sixth embodiment.

FIG. 30A is a plan view of a display device in which the light emitting device according to the sixth embodiment is disposed in every pixel region.

FIGS. 30B and 30C are cross-sectional views taken along line I-I' in FIG. 30A.

FIGS. 31A and 31B are cross-sectional views of a light emitting device according to another structure of the sixth embodiment.

FIGS. 32A to 32F are process cross-sectional views illustrating a method of manufacturing the light emitting device in FIG. 29A.

FIGS. 33A and 33B are cross-sectional views of a light emitting device according to a seventh embodiment.

FIG. 34A is a plan view of a display device in which the light emitting device according to the seventh embodiment is disposed in every pixel region.

FIGS. 34B and 34C are cross-sectional views taken along line I-I' in FIG. 34A.

FIGS. 35A to 35C are cross-sectional views of a light emitting device according to another structure of the seventh embodiment.

FIGS. 36A to 36F are process cross-sectional views illustrating a method of manufacturing the light emitting device according to the seventh embodiment.

FIGS. 37A and 37B are cross-sectional views of a light emitting device according to an eighth embodiment.

FIG. 38 is a view illustrating a mobile communication terminal including a panel in which the light emitting device according to an embodiment is disposed.

FIG. 39 is a conceptual view of a display device according to an embodiment of the present disclosure.

FIG. 40 is a conceptual view of a light emitting device constituting pixels in FIG. 39.

FIG. 41 is a view showing a light emitting structure grown on a wafer.

FIG. 42 is a view showing a state in which a plurality of light emitting devices are electrically connected to lines.

FIG. 43 is a modified example of FIG. 42.

FIGS. 44 to 46 are views showing various pixel arrangement forms.

FIG. 47 is a conceptual view of a light emitting device according to an embodiment of the present disclosure.

FIG. 48 is a modified example of FIG. 47.

FIGS. 49A to 49G are views for describing steps of manufacturing the light emitting device according to an embodiment of the present disclosure.

FIG. 50 is a plan view showing a light emitting device according to another embodiment of the present disclosure.

FIG. 51 is a cross-sectional view showing the light emitting device according to the other embodiment of the present disclosure.

MODES OF THE INVENTION

The present embodiments may be modified to other forms, or various embodiments may be combined with each other. The scope of the present disclosure is not limited by each embodiment described below.

Even when details described in relation to one embodiment are not described in relation to another embodiment, descriptions of the details may be understood as descriptions related to the other embodiment unless descriptions contrary or contradictory to the details are given in relation to the other embodiment.

For example, when features of configuration A are described in relation to a specific embodiment and features of configuration B are described in relation to another embodiment, an embodiment in which configuration A and configuration B are combined should be understood as belonging to the scope of the present disclosure even when the embodiment is not clearly stated.

In the description of embodiments according to the present disclosure, when a certain element is described as being formed "on or under" another element, "on or under" includes both a case in which the two elements directly come into contact with each other and a case in which one or more other elements are disposed between the two elements and the two elements indirectly come into contact with each other. Further, "on or under" may refer to a downward direction as well as an upward direction with respect to a single element.

Hereinafter, embodiments of the present disclosure will be described in detail with reference to the accompanying drawings to enable those of ordinary skill in the art to which the present disclosure pertains to easily practice the embodiments.

A semiconductor device may include various electronic devices such as a light emitting device and a light receiving device, and both the light emitting device and the light receiving device may include a first conductive type semiconductor layer, an active layer, and a second conductive type semiconductor layer.

The semiconductor device according to the present embodiment may be a light emitting device.

A light emitting device emits light as electrons and holes are recombined, and a wavelength of the light is determined by a unique energy bandgap of a material. Therefore, emitted light may differ according to a composition of the material.

Hereinafter, a semiconductor device according to an embodiment will be described by assuming that the semiconductor device is a light emitting device.

FIG. 1 is a view for describing a light emitting structure according to an embodiment of the present disclosure, FIG. 2 is a view for describing a plurality of light emitters in FIG. 1, FIG. 3 is a view for describing a structure for removing optical interference between the plurality of light emitters, and FIG. 4 is a view in which a light-interrupting layer is disposed between the plurality of light emitters Referring to FIG. 1, a light emitting structure 100 according to an embodiment includes a first conductive type semiconductor layer 110, a plurality of active layers 121, 122, and 123 disposed to be spaced apart on the first conductive type semiconductor layer 110, and a plurality of second conductive type semiconductor layers 131, 132, and 133 disposed on the plurality of active layers 121, 122, and 123, respectively.

The plurality of active layers 121, 122, and 123 may include first to third active layers 121, 122, and 123 disposed to be spaced apart in a first direction (X-direction). The first to third active layers 121, 122, and 123 may emit light in the same wavelength band, or at least one or each of the first to third active layers 121, 122, and 123 may emit light in a different wavelength band. For example, the second active layer 122 may emit light in a different wavelength band from that of light emitted by the first active layer 121 and the third active layer 123. The first direction (X-direction) may be a direction perpendicular to a thickness direction (Y-direction) of the first conductive type semiconductor layer 110. Light output from the plurality of active layers 121, 122, and 123 may be output upward or downward based on the drawings according to a reflective structure of a chip.

For example, the first active layer 121 may emit light in a blue wavelength band, and the second active layer 122 may emit light in a green wavelength band. Hereinafter, light in a blue wavelength band will be referred to as blue light, light in a green wavelength band will be referred to as green light, and light in a red wavelength band will be referred to as red light.

The third active layer 123 may emit blue light. The blue light emitted from the third active layer 123 may be converted to red light by a wavelength converting layer. However, embodiments are not necessarily limited thereto, and the third active layer 123 may emit red light.

First to third light emitters P1, P2, and P3 may independently include the active layers 121, 122, and 123 and the second conductive type semiconductor layers 131, 132, and 133 and may share the first conductive type semiconductor layer 110. According to such a configuration, crack formation in the light emitting structure 100 may be prevented by the first conductive type semiconductor layer 110 which is relatively thick. Further, a current distribution effect may be achieved.

Common power may be applied to the first conductive type semiconductor layer 110, and driving power may be selectively applied to the plurality of second conductive type semiconductor layers 131, 132, and 133.

For example, the first light emitter P1 may emit blue light when power is input only to the second conductive type semiconductor layer 131 of the first light emitter P1 in a state in which power is input to the first conductive type semiconductor layer 110. Likewise, blue light and green light may be simultaneously emitted when power is applied to the second conductive type semiconductor layers 131 and 132 of the first light emitter P1 and the second light emitter P2.

Such a light emitting structure 100 may constitute pixels of a display, and the first to third light emitters P1, P2, and P3 may serve as RGB subpixels. For example, the first light emitter P1 may serve as a Blue pixel, the second light emitter P2 may serve as a Green pixel, and the third light emitter P3 may serve as a Red pixel.

A color filter may be omitted when pixels are implemented using the light emitting structure 100 according to the embodiment. Further, a process of packaging three light emitting devices to form RGB pixels may be omitted. Since light emitting device chips, which are smaller in size than RGB packages, are used, a panel with high resolution may be manufactured.

The first conductive type semiconductor layer 110 may be implemented using a Group III-V or Group II-VI compound semiconductor and may be doped with a first dopant. The first conductive type semiconductor layer 110 may be formed of one or more of InAlGaN, AlGaAs, GaP, GaAs, GaAsP, and AlGaInP which are semiconductor materials having a composition formula. $Al_xIn_yGa_{(1-x-y)}N(0 \leq x \leq 1, 0 \leq y \leq 1, 0 \leq x+y \leq 1)$, but embodiments are not limited thereto. When the first dopant is an n-type dopant such as Si, Ge, Sn, Se, and Te, the first conductive type semiconductor layer 110 may be an n-type nitride semiconductor layer.

The plurality of active layers 121, 122, and 123 are layers in which electrons (or holes) injected through the first conductive type semiconductor layer 110 and holes (or electrons) injected through a second conductive type semiconductor layer 130 meet. The active layers transition to a low energy level as the electrons and holes are recombined and may generate light having a wavelength corresponding thereto.

The plurality of active layers 121, 122, and 123 may have any one of a single well structure, a multi-well structure, a single quantum well structure, a multi-quantum well (MQW) structure, a quantum dot structure, and a quantum wire structure, but the structure of the active layers is not limited thereto.

When the plurality of active layers 121, 122, and 123 are formed to have a well structure, a well layer/barrier layer pair of the active layers may be formed of one or more pair structures of InGaN/GaN, InGaN/InGaN. GaN/AlGaN, InAlGaN/GaN, GaAs(InGaAs)/AlGaAs, and GaP(InGaP)/AlGaP, but embodiments are not limited thereto. The well layer may be formed of a material having a smaller bandgap than a bandgap of the barrier layer.

When each of the plurality of active layers 121, 122, and 123 have a plurality of well layers, each well layer may generate light in the same wavelength band. For example, all of a plurality of well layers disposed in the second active layer 122 may generate green light, and all of a plurality of well layers disposed in the first active layer 121 may generate blue light. The light emitting structure 100 according to the embodiment is for implementing pixels of a display and is differentiated from a structure in which RGB lights are mixed to implement white light.

The plurality of second conductive type semiconductor layers 131, 132, and 133 may be implemented using a Group III-V or Group II-VI compound semiconductor and may be doped with a second dopant. The second conductive type semiconductor layers 131, 132, and 133 may be formed of a semiconductor material having a composition formula, $In_xAl_yGa_{1-x-y}N$ $(0 \leq x \leq 1, 0 \leq y \leq 1, 0 \leq x+y \leq 1)$, or a material selected from AlInN, AlGaAs, GaP, GaAs, GaAsP, and AlGaInP. When the second dopant is a p-type dopant such as Mg, Zn, Ca, Sr, and Ba, the second conductive type semiconductor layers 131, 132, and 133 doped with the second dopant may be p-type semiconductor layers.

Referring to FIG. 2, the first conductive type semiconductor layer 110 may include a plurality of convex parts 111 and concave parts 113 and a base part 112 configured to connect the convex parts 111. The first to third light emitters P1, P2, and P3 may include the convex parts 111 of the first conductive type semiconductor layer 110, the active layers 121, 122, and 123, and the second conductive type semiconductor layers 131, 132, and 133.

A configuration in which light L1 generated in the first to third light emitters P1, P2, and P3 is emitted toward the second conductive type semiconductor layers 131, 132, and 133 is illustrated, but embodiments are not necessarily limited thereto. The light L1 may be emitted toward the first conductive type semiconductor layer 110.

In the light emitting device according to the embodiment, the first to third light emitters P1, P2, and P3 may be turned on independently. However, when a specific light emitter is turned on, a portion of light L2 may be emitted to another light emitter through the first conductive type semiconductor layer 110. Consequently, an optical interference problem in which light is emitted by a light emitter which should not actually be turned on may occur.

Referring to FIG. 3, the convex parts 111 and the concave parts 113 of the first conductive type semiconductor layer 110 may be formed in a process in which mesa etching is performed to partition the first to third light emitters P1, P2, and P3. Completely separating the first to third light emitters P1, P2, and P3 may be ideal, but in such a case, the current distribution effect due to the first conductive type semiconductor layer 110 may be lost, a thickness of the light emitters may decrease, and cracks may be formed easily.

A thickness d2 of the concave part 113 may be in a range of 10% to 60% of an overall thickness d1 of the light emitting structure. When the thickness d2 of the concave part 113 is less than 10% the thickness of the concave part 113 is too small, and there is a problem in that cracks are easily formed in a manufacturing process. When the thickness exceeds 60%, an amount of light that is incident on a neighboring light emitter through the first conductive type semiconductor layer 110 increases, and there is a problem in that it is difficult for the light emitters P1, P2, and P3 to serve as subpixels. When the thickness d2 of the concave part 113 is in a range of 10% to 33%, most of emitted light L3 is reflected upward, and the optical interference problem may be effectively improved. Here, the thickness d2 of the concave part 113 may refer to a thickness from a bottom surface of the first conductive type semiconductor layer 110 to the concave part 113.

A height d4 of the second active layer 122 may be smaller than heights d3 and d5 of the first active layer 121 and the third active layer 123. The second light emitter P2 may be manufactured by etching and then re-growing the light emitting structure 100. Since the light emitting structure 100 may be damaged during the re-growth, it is preferable that the re-growth time be minimized.

When a thickness of the re-grown first conductive type semiconductor layer is minimized, the re-growth time may be reduced. In this process, the height d4 of the second active layer 122 may be relatively decreased. However, embodiments are not necessarily limited thereto, and the height d4 of the second active layer 122 may be greater than the heights d3 and d5 of the first active layer 121 and the third active layer 123.

The third light emitter P3 may implement red light using a wavelength converting layer 222. The wavelength converting layer 222 may be a red fluorescent substance. The red fluorescent substance may absorb blue light and convert the absorbed blue light to red light. In this case, when the first light emitter P and the third light emitter P3 are disposed to be adjacent to each other, blue light emitted from the first light emitter P1 may be converted to red light, and optical interference may be worsened.

Generally, a green light L4 absorption rate of a red fluorescent material is lower than a blue light absorption rate thereof. Therefore, it may be advantageous in reducing optical interference when the second light emitter P2 which emits green light is disposed between the first light emitter P1 and the third light emitter P3.

In the wavelength converting layer 222, wavelength conversion particles may be distributed throughout a polymer resin. The polymer resin may be one or more of epoxy resin, silicone resin, polyimide resin, urea resin, and acrylic resin. For example, the polymer resin may be a silicone resin.

The wavelength conversion particles may absorb light emitted from the third active layer 123 and convert the absorbed light to white light. For example, the wavelength conversion particles may include one or more of a fluorescent substance and quantum dot (QD).

Referring to FIG. 4, a light-interrupting layer 140 may be formed between the first to third light emitters P1, P2, and P3. According to such a configuration, the first to third light emitters P1, P2, and P3 may be partitioned such that optical interference is effectively suppressed.

The light-interrupting layer 140 may be formed along inclined surfaces of the first to third light emitters P1, P2, and P3, but embodiments are not necessarily limited thereto. The light-interrupting layer 140 may be vertically grown between the first to third light emitters P1, P2, and P3. Alternatively, portions between the first to third light emitters P1, P2, and P3 may be entirely filled with the light-interrupting layer 140.

The light-interrupting layer 140 may include a light-absorbing material such as carbon black and graphite, but may also include a reflective material which reflects light. A method of forming a light-interrupting layer is not particularly limited. For example, the light-interrupting layer 140 may be formed using photolithography, imprinting, roll-to-roll printing, inkjet printing, and the like.

FIG. 5 is a view for describing light emitting areas of the plurality of light emitters, and FIGS. 6A to 6C are views for describing configurations in which light emitting areas of the plurality of light emitters differ.

Referring to FIG. 5, the light emitting structure may have strip-shaped active regions 121, 122, and 123. The active regions 121, 122, and 123 refer to regions in which light is generated, and may correspond to areas of the first to third active layers 121, 122, and 123.

When the area of the first conductive type semiconductor layer 110 is assumed as 100%, the active regions 121, 122, and 123 may account for 30% or more. When the active regions 121, 122, and 123 account for less than 30%, an amount of light is small, and it may be difficult for the light emitters P1, P2, and P3 to serve as pixels. When etching is excessively performed to reduce the thickness of the concave part of the first conductive type semiconductor layer, the portion accounted for by the active regions 121, 122, and 123 may be reduced to 30% or less.

Referring to FIG. 6A, areas between the active regions 121, 122, and 123 may differ from each other. The first active region 121 may be a blue light emitting region, the second active region 122 may be a green light emitting region, and the third active region 123 may be a red light emitting region. In this case, the green light emitting region and the red light emitting region, which have relatively low luminous efficiency, may be manufactured to have a relatively greater area than the area of the blue light emitting region.

For example, the green light emitting region may be 1 to 4 times greater than the blue light emitting region, and the red light emitting region may be 1 to 3 times greater than the blue light emitting region. The ratio of areas between the first to third active regions 121, 122, and 123 may be 1:3:2 or 1:3:3, but embodiments are not limited thereto.

Referring to FIG. 6B, the first active region 121 and the second active region 122 may be disposed on the same line while the third active region 123 is entirely disposed on a neighboring line. However, embodiments are not necessarily limited thereto, and the areas of the active regions may be modified in various ways. For example, as in FIG. 6C, the second active region 122 may be disposed to have the greatest area.

FIGS. 7A to 7F are views for describing a method of manufacturing a light emitting structure according to a first embodiment of the present disclosure.

Referring to FIGS. 7A to 7F, a method of manufacturing a light emitting structure according to an embodiment includes forming a light emitting structure 100 on a substrate 1, etching a partial region of the light emitting structure 100, and re-growing the light emitting structure 100 on the etched partial region.

Referring to FIG. 7A, the forming of the light emitting structure 100 may include forming the light emitting structure 100 by sequentially forming a first conductive type semiconductor layer 110, an active layer 120, and a second conductive type semiconductor layer 130 in that order on the substrate 1.

The substrate 1 may be formed of a material selected from sapphire ($Al_2O_3$), SiC, GaAs, GaN, ZnO, Si, GaP, InP, and Ge, but embodiments are not limited thereto.

A buffer layer (not illustrated) may be further disposed between the first conductive type semiconductor layer 110 and the substrate 1. The buffer layer may reduce lattice mismatch between the substrate 1 and the light emitting structure 100 disposed on the substrate 1.

The buffer layer may have a form in which group III and group V elements are combined or may include any one of GaN, InN, AlN, InGaN, AlGaN, InAlGaN, and AlInN. The buffer layer may be doped with a dopant, but embodiments are not limited thereto.

The light emitting structure 100 may be formed by sequentially forming the first conductive type semiconductor layer 110, the active layer 120, and the second conductive type semiconductor layer 130 in that order. A thickness of the light emitting structure 100 may be in a range of 1 μm to 10 μm or 3 μm to 5 μm. The light emitting structure 100 may emit blue light.

The light emitting structure 100 may be formed using methods such as metal organic chemical vapor deposition (MOCVD), chemical vapor deposition (CVD), plasma-enhanced chemical vapor deposition (PECVD), molecular beam epitaxy (MBE), hydride vapor phase epitaxy (HVPE), and sputtering.

Referring to FIGS. 7B and 7C, the etching includes forming a mask 2 on an upper surface of the light emitting structure 100 and exposing a first region 3 as illustrated in FIG. 7B. A material of the mask 2 is not limited.

Referring to FIG. 7C, the etching may be performed so that the light emitting structure 100 is removed up to a portion of the first conductive type semiconductor layer 110. An etching depth 3a of the first conductive type semiconductor layer 110 may be in a range of about 100 nm to 400 nm.

Referring to FIG. 7D, a second mask 2a may be formed at a side surface of the first region 3 so that damages to the light emitting structure 100 due to subsequent processes are prevented.

Referring to FIG. 7E, the re-growing includes re-growing a first conductive type semiconductor layer 11a of a second light emitter P2. A physical interface may be formed between the re-grown first conductive type semiconductor layer 111a and the first conductive type semiconductor layer 110 which is not etched yet, but embodiments are not necessarily limited thereto. The interface may disappear due to the re-growth.

A thickness of the re-grown first conductive type semiconductor layer 111a may be less than a thickness of the etched first conductive type semiconductor layer. Generally, since a growth temperature of n-GaN is relatively high, the light emitting structure 100 which is not etched may be damaged. Therefore, it is preferable that the re-grown first conductive type semiconductor layer 111a be manufactured to have the minimum thickness. To minimize damages to the light emitting structure 100, it may be preferable that a growth temperature of a blue light emitting structure be increased and a re-growth temperature of a green light emitting structure be decreased.

A second active layer 122 may emit green light. That is, a composition of the second active layer 122 may differ from a composition of an unetched active layer. A second conductive type semiconductor layer 132 may be formed on the second active layer 122.

Referring to FIG. 7F, a thickness d4 of the first conductive type semiconductor layer of the second light emitter P2 may be 100 nm to 200 nm less than a thickness of an etched layer. As a result, the height d4 of the second active layer may be formed to be less than a height d3 of an active layer of a first light emitter. However, embodiments are not necessarily limited thereto, and the re-grown first conductive type semiconductor layer may be manufactured so that the thickness d4 is greater.

The height d4 of the second active layer may be in a range of 80% to 110% or 85% to 95% of the height d3 of the active layer of the first light emitter. When the height d4 of the second active layer is in the range of 85% to 95% of the height d3 of the active layer of the first light emitter, damages to the blue light emitting structure during the re-growth may be reduced.

Then, the mask 2 may be removed to complete the manufacturing process.

Side surfaces of the manufactured first to third light emitters P1, P2, and P3 may be re-etched as necessary to remove edge defects.

FIGS. 8A to 8D are views for describing a method of manufacturing a light emitting structure according to a second embodiment of the present disclosure.

Referring to FIG. 8A, forming a second light emitter P2 is the same as that described above. Hereinafter, a method of forming a third-first light emitter P31 configured to generate red light will be described.

Referring to FIG. 8B, a mask 2 may be formed on a first light emitter P1 and the second light emitter P2, and a third light emitter P3 may be removed. In this case, an etching depth 3b may be a depth that allows the light emitting structure to be removed up to a portion of a first conductive type semiconductor layer 110.

Referring to FIG. 8C, a low-temperature growth method for the third-first light emitter P31 may be selected to improve damages to the light emitting structure 100 due to the re-growth of the third-first light emitter P31. For example, MBE may be selected as a growth method of the third-first light emitter P31, but embodiments are not necessarily limited thereto. An active layer of the third-first light emitter P31 may generate red light.

Referring to FIG. 8D, a height d3 of an active layer of the first light emitter P1 may be the greatest. A height d4 of an active layer of the second light emitter P2 may be greater than a height d5 of an active layer of the third-first light emitter P31. However, the height of the active layer (thickness of the first conductive type semiconductor layer) of each light emitter may be modified in various ways.

For example, the height d5 of the active layer of the third-first light emitter P31 may be in a range of 95% to 130% or 105% to 120% of the height d3 of the active layer of the first light emitter P1.

The active layer of the third-first light emitter P31 may include GaAs to emit red light. However, since a difference between lattice constants of GaAs and GaN is large, it is necessary to control lattice mismatch. During the re-growth of the first conductive type semiconductor layer of the third-first light emitter P31, the first conductive type semiconductor layer may be doped with arsenide (As) to solve lattice mismatch. In this case, the first conductive type semiconductor layer may be doped so that the concentration of arsenide (As) progressively increases in a thickness direction. In this process, the thickness of the first conductive type semiconductor layer of the third-first light emitter P31 may be increased. Therefore, the height d5 of the active layer of the third-first light emitter P31 may be in a range of 105% to 130% of the height d3 of the active layer of the first light emitter P1.

As described above, the height d4 of the active layer of the second light emitter P2 may be in the range of 85% to 95% of the height d3 of the active layer of the first light emitter P1. Therefore, the height of the active layer of the third light emitter P3 may be the greatest.

FIGS. 9A to 9F are views for describing a method of manufacturing a light emitting structure according to a third embodiment of the present disclosure.

Referring to FIGS. 9A to 9F, a method of manufacturing the light emitting structure according to the embodiment includes forming a first conductive type semiconductor layer 110 on a substrate 1, forming an active layer 120 and a second conductive type semiconductor layer 130 only in partial region on the first conductive type semiconductor layer 110, and forming the active layer 120 and the second conductive type semiconductor layer 130 in the remaining region of the first conductive type semiconductor layer 110.

Referring to FIG. 9A, the forming of the first conductive type semiconductor layer 110 may have the same configuration as that described above.

Referring to FIGS. 9B and 9C, the forming of the active layer 120 and the second conductive type semiconductor layer 130 includes forming a mask 2 in a first region and sequentially growing the first conductive type semiconductor layer 110, the active layer 120, and the second conductive type semiconductor layer 130 in that order in the first region. The light emitting structure 100 may be manufactured to emit blue light.

Referring to FIGS. 9D and 9E, the mask 2 is re-formed in the grown light emitting structure 100, and a first conductive type semiconductor layer 110a, an active layer 122, and second conductive type semiconductor layer 132 are grown in a first region 3c. In this case, the second active layer 122 may be manufactured to emit green light.

Referring to FIG. 9F, to minimize the growth time of the green light emitting structure, a height d4 of an active layer of a second light emitter P2 may be less than a height d3 of an active layer of a first light emitter P1.

In this case, as described with reference to FIG. 8, a third light emitter configured to emit red light may be re-formed.

FIGS. 10A to 10F are views for describing a method of manufacturing a light emitting structure according to a fourth embodiment of the present disclosure.

Referring to FIGS. 10A to 10F, a method of manufacturing the light emitting structure according to the embodiment includes forming a light emitting structure 100 on a substrate 1, etching a partial region of the light emitting structure 100, re-growing the light emitting structure 100 throughout an upper surface of the light emitting structure 100, and removing the remaining re-grown light emitting structure 100 excluding the light emitting structure 100 corresponding to the partial region.

Referring to FIG. 10A, the forming of the light emitting structure 100 may include sequentially forming a first conductive type semiconductor layer 110, an active layer, and a second conductive type semiconductor layer 130 in that order. In this case, an etching preventing layer S1 may be further formed on the light emitting structure 100.

Referring to FIGS. 10B and 10C, the etching includes forming a mask 2 on the etching preventing layer S1 and exposing a first region. A material of the mask 2 is not particularly limited. Then, the first region 3d may be etched so that the light emitting structure 100 is removed up to a portion of the first conductive type semiconductor layer 110.

Referring to FIG. 10D, the re-growing includes re-growing a first conductive type semiconductor layer 110a, an active layer 120a, and a second conductive type semiconductor layer 130a throughout an upper portion of the partially-etched light emitting structure 100. The re-grown active layer 120a generates green light.

Referring to FIGS. 10E and 10F, after the mask 2 is formed only at the first region, the re-grown first conductive type semiconductor layer 110a, active layer 120a, and second conductive type semiconductor layer 130a are re-etched. In this case, the etching is performed only up to the etching preventing layer S1. In this process, first to third light emitters P1, P2, and P3 are separated as illustrated in FIG. 10F.

Then, as described with reference to FIG. 8, the third light emitter configured to emit red light may be re-formed.

FIG. 11 is a view for describing a light emitting device according to a first embodiment of the present disclosure.

Referring to FIG. 11, a light emitting device 10A according to the embodiment includes a light emitting structure 100 including a first conductive type semiconductor layer 110, a plurality of active layers 121, 122, and 123, and a plurality of second conductive type semiconductor layers 131, 132, and 133, a first electrode 150 electrically connected to the first conductive type semiconductor layer 110, and a plurality of second electrodes 161, 162, and 163 electrically connected to the second conductive type semiconductor layers 131, 132, and 133.

The light emitting structure 100 according to the present embodiment may include all of the features of the light emitting structure 100 described above with reference to FIGS. 1 to 10. That is, the individual driving of the plurality of light emitters, the configuration for controlling optical interference, the various forms of manufacturing methods, and the like may be applied without change.

The first conductive type semiconductor layer 110 may include a base part 112 and a plurality of convex parts 111 and concave parts 113 (see FIG. 3) disposed on the base part 112. A side surface 112*a* of the base part 112 may be tilted so that a cross-sectional area thereof progressively decreases upward. An angle θ1 formed between the side surface 112*a* of the base part 112 and a bottom surface of the base part 112 may be in a range of 30° to 89° or 60° to 89°. Light extraction efficiency may be increased due to the inclined side surface.

The side surface 112*a* of the base part 112 may be parallel to side surfaces of the plurality of convex parts 111. However, embodiments are not necessarily limited thereto, and when the plurality of convex parts 111 are re-etched to remove edge defects, angles of inclination of the convex parts 111 and the side surface 112*a* of the base part 112 may differ.

The first electrode 150 may be disposed below the first conductive type semiconductor layer 110.

The first electrode 150 may be formed of a material having excellent electrical conductivity so that a current injected from the outside may be evenly distributed horizontally.

The first electrode 150 may be formed of opaque metals such as Ag, Ni, Al, Rh, Pd, Ir, Ru, Mg, Zn, Pt, Au, and Hf. The first electrode 150 may be formed of one or more layers in which a transparent conductive oxide (TCO) film and an opaque metal are mixed, but embodiments are not limited thereto.

A reflective layer, an ohmic layer, and the like may be further formed between the first electrode 150 and the first conductive type semiconductor layer 110. When the first electrode 150 and/or the reflective layer are formed of a material which is in ohmic contact with the first conductive type semiconductor layer 110, the ohmic layer may not be separately formed.

The plurality of second electrodes 161, 162, and 163 may be respectively disposed on the plurality of second conductive type semiconductor layers 131, 132, and 133. The second electrodes 161, 162, and 163 may be electrically insulated from each other.

The plurality of second electrodes 161, 162, and 163 may be formed of a TCO film so that light emitted from the light emitting structure 100 is able to pass therethrough. The TCO film may be selected from indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), IZO nitride (IZON), ZnO, IrOx, RuOx, NiO, and the like.

FIGS. 12A to 12F are views for describing a method of manufacturing the light emitting device according to the first embodiment of the present disclosure.

Referring to FIGS. 12A to 12F, a method of manufacturing the light emitting device according to the embodiment includes forming a plurality of light emitters in a light emitting structure 100, removing a substrate 1, forming a first electrode 150, and separating a plurality of light emitting devices.

Referring to FIGS. 12A and 12B, the light emitting structure 100 may be manufactured by sequentially forming a first conductive type semiconductor layer 110, an active layer 120, and a second conductive type semiconductor layer 130 in that order on the substrate 1, and an electrode layer 160 may be formed on the light emitting structure 100. Then, first to third light emitters P1, P2, and P3 may be manufactured using various methods described above with reference to FIGS. 7 to 10. The electrode layer 160 may be separated into a plurality of second electrodes 161, 162, and 163 on the first to third light emitters P1, P2, and P3.

Referring to FIG. 12C, a side surface of the first conductive type semiconductor layer 110 may be isolation-etched (3*e*). The isolation-etching (3*e*) may include etching up to a thickness of a buffer layer.

Referring to FIG. 12D, the removing of the substrate 1 may include forming a support pad 600 including a photoresist layer 610, an adhesive layer 620, and a support layer 630 on the light emitting structure 100, fixing the formed support pad 600, and then removing the substrate 1. The adhesive layer 620 may fix the photoresist layer 610 and the support layer 630. In this case, a method of removing the substrate 1 is not particularly limited. The substrate 1 may be removed using a laser lift off (LLO) technique.

Referring to FIG. 12E, the first electrode 150 is formed on the exposed first conductive type semiconductor layer 110. In this case, it is preferable that the first electrode 150 be formed after up to a buffer layer having relatively low conductivity is removed. When the above-described isolation-etching has been performed in advance, the light emitting device may be separated into a plurality of chips when the buffer layer is removed.

Any generally-used method of forming an electrode such as sputtering, coating, and depositing may be applied as a method of forming the first electrode 150. A reflective layer and an ohmic layer may be further formed during the formation of the first electrode 150.

Referring to FIG. 12F, after an adhesive tape 240 is attached to the first electrode 150, the photoresist layer may be removed, and the support pad may be detached. The photoresist layer may be removed by being dipped into a stripper solution. The stripper solution may include various organic/inorganic solvents capable of melting the photoresist. The adhesive tape 240 may be removed afterwards.

FIG. 13 is a view for describing a light emitting device according to a second embodiment of the present disclosure.

Referring to FIG. 13, a light emitting device 10B according to the embodiment differs from the structure in FIG. 11 only in terms of formation of a first conductive type semiconductor layer 110, and the remaining configurations of the structure in FIG. 11 may be applied to the light emitting device 10B without change.

The first conductive type semiconductor layer 110 includes a plurality of convex parts 111 on which a plurality of active layers 121, 122, and 123 are disposed and a base part 112 configured to electrically connect the plurality of convex parts 111.

A cross-sectional area of the base part 112 may progressively increase upward. That is, a side surface 112*a* of the base part 112 may be tilted so that a cross-sectional area thereof progressively increases upward.

An angle θ2 formed between the side surface 112*a* and the bottom surface of the base part 112 may be in a range of 91° to 120° or 100° to 110°. Such a structure may increase light extraction efficiency at the side surface.

FIGS. 14A to 14E are views for describing a method of manufacturing the light emitting device according to the second embodiment of the present disclosure.

Referring to FIGS. 14A to 14E, a method of manufacturing the light emitting device according to the embodiment includes forming a plurality of light emitters P1, P2, and P3 on a light emitting structure 100, removing a substrate 1, forming first electrodes 150, and separating the light emitting structure 100 into a plurality of light emitting devices.

Referring to FIG. 14A, the light emitting structure 100 may be manufactured by sequentially forming a first conductive type semiconductor layer 110, an active layer 120, and a second conductive type semiconductor layer 130 in that order on the substrate 1, and an electrode layer may be formed on the light emitting structure 100. Then, first to third light emitters P1, P2, and P3 may be manufactured using various methods described above with reference to FIGS. 7 to 10. The electrode layer may be separated into a plurality of electrodes 161, 162, and 163 on the first to third light emitters P1, P2, and P3.

Referring to FIG. 14B, the removing of the substrate 1 may include forming a support pad 600 including a photoresist layer 610, an adhesive layer 620, and a support layer 630 on the light emitting structure 100, fixing the formed support pad 600, and then removing the substrate 1. The adhesive layer 620 may fix the photoresist layer 610 and the support layer 630. In this case, a method of removing the substrate 1 is not particularly limited. The substrate 1 may be removed using the LLO technique.

Referring to FIG. 14C, the first electrodes 150 are formed on the exposed first conductive type semiconductor layer 110. Any generally-used method of forming an electrode such as sputtering, coating, and depositing may be applied as a method of forming the first electrodes 150. A reflective layer and an ohmic layer may be further formed during the formation of the first electrodes 150.

Referring to FIG. 14D, a region exposed between the first electrodes 150 may be etched. In this process, the light emitting structure 100 may be separated into a plurality of chips, and a slope may be formed at the side surface 112a of the first conductive type semiconductor layer 110.

Referring to FIG. 14E, the photoresist layer may be removed after an adhesive tape 240 is attached to the first electrodes 150. The photoresist layer may be removed by being dipped into a stripper solution. The stripper solution may include various organic/inorganic solvents capable of melting the photoresist. The adhesive tape 240 may be removed afterwards.

FIG. 15 is a view for describing a light emitting device according to a third embodiment of the present disclosure.

Referring to FIG. 15, a light emitting device 10C according to the embodiment includes a light emitting structure 100 including a first light emitter P1, a second light emitter P2, and a third light emitter P3, a plurality of first electrodes 151, 152, and 153 electrically connected to a first conductive type semiconductor layer 110 of the first to third light emitters P1, P2, and P3, a plurality of second electrodes 161, 162, and 163 electrically connected to a second conductive type semiconductor layer 130 of the first to third light emitters P1, P2, and P3, a protective layer 170 configured to cover the first to third light emitters P1, P2, and P3, and a reflective electrode 180 electrically connected to the plurality of second electrodes 161, 162, and 163 via the protective layer 170.

In the light emitting structure 100, the first to third light emitters P1, P2, and P3 are disposed to be spaced apart and respectively include first conductive type semiconductor layers 111, 112, and 113, active layers 121, 122, and 123, and second conductive type semiconductor layers 131, 132, and 133. The first light emitter P1 may emit blue light, the second light emitter P2 may emit green light, and the third light emitter P3 may emit red light.

Since the first to third light emitters P1, P2, and P3 are physically separated, optical interference may be reduced. That is, since a path along which light is propagated through optical layers connected to each other is not present, optical interference may be reduced. Also, since areas of the first to third light emitters P1, P2, and P3 progressively increase upward significantly, light emitting areas may be increased. Therefore, a size of each subpixel may be increased.

The plurality of first electrodes 151, 152, and 153 may be respectively disposed on the first conductive type semiconductor layers 111, 112, and 113 of the first to third light emitters P1, P2, and P3. The first electrode 151, 152, and 153 may be formed of a TCO film. The TCO film may be selected from ITO, IZO, AZO, AGZO, IZTO, IAZO, IGZO, IGTO, ATO, GZO, IZON, ZnO, IrOx, RuOx, NiO, and the like.

The plurality of first electrodes 151, 152, and 153 may be formed of opaque metals such as Ag, Ni, Al, Rh, Pd, Ir, Ru, Mg, Zn, Pt, Au, and Hf. In this case, since light emitting areas are decreased as much as the areas of the first electrodes 151, 152, and 153, it may be preferable that the first electrodes 151, 152, and 153 be formed in small sizes.

The plurality of second electrodes 161, 162, and 163 may be ohmic electrodes.

The protective layer 170 may cover side surfaces and a lower portion of the light emitting structure 100. The protective layer 170 may include at least one of $SiO_2$, $Si_3N_4$, $TiO_2$, $Al_2O_3$, and MgO. The protective layer 170 may serve as a light reflecting layer and/or a light absorbing layer. The protective layer 170 may include light reflecting particles to serve as the light reflecting layer and may include light absorbing particles such as carbon black and graphite to serve as the light absorbing layer.

The reflective electrode 180 may be electrically connected to the plurality of second electrodes 161, 162, and 163 via the protective layer 170. The reflective electrode 180 may serve as a common electrode which applies power to the first to third light emitters P1, P2, and P3. The reflective electrode 180 may be formed of a material having a high reflectance such as Ag, Ni, Al, Rh, Pd, Ir, Ru, Mg, Zn, Pt, Au, and Hf or may be formed by mixing between the material having a high reflectance and a transparent conductive material such as IZO, IZTO, IAZO, IGZO, IGTO, AZO, and ATO, but embodiments are not limited thereto.

According to the embodiment, since the first to third light emitters P1, P2, and P3 are separated and the light reflecting layer is disposed between the first to third light emitters P1, P2, and P3, the optical interference problem may be effectively solved.

FIGS. 16A to 16F are views for describing a method of manufacturing the light emitting device according to the third embodiment of the present disclosure.

Referring to FIGS. 16A to 16F, a method of manufacturing the light emitting device according to the embodiment includes forming first to third light emitters P1, P2, and P3 by etching a light emitting structure 100, connecting a first electrode 150 to the first to third light emitters P1, P2, and P3, removing a substrate 1, and forming a second electrode on the first to third light emitters P1, P2, and P3.

Referring to FIG. 16A, the light emitting structure 100 may be manufactured by sequentially forming a first conductive type semiconductor layer 110, an active layer 120, and a second conductive type semiconductor layer 130 in that order on the substrate 1, and an electrode layer may be formed on the light emitting structure 100. Then, the first to third light emitters P1, P2, and P3 may be manufactured using various methods described above with reference to FIGS. 7 to 10. The second electrode 160 layer may be separated into a plurality of second electrodes on the first to third light emitters P1, P2, and P3.

Referring to FIG. 16B, a protective layer 170 may be formed on the first to third light emitters P1, P2, and P3. In this case, the plurality of second electrodes 161, 162, and 163 disposed on the first to third light emitters P1, P2, and P3 may be exposed using a mask 2.

Referring to FIG. 16C, a reflective electrode 180 is formed throughout an upper portion of the protective layer 170. The reflective electrode 180 may be formed of opaque metals such as Ag, Ni, Al, Rh, Pd, Ir, Ru, Mg, Zn, Pt, Au, and Hf.

Referring to FIG. 16D, a photoresist layer 610, an adhesive layer 620, and a support layer 630 may be formed and fixed on the reflective electrode 180, and then the substrate 1 may be removed. The adhesive layer 620 may fix the photoresist layer 610 and the support layer 630. In this case, a method of removing the substrate 1 is not particularly limited. The substrate 1 may be removed using the LLO technique.

Referring to FIG. 16E, the first to third light emitters P1, P2, and P3 may be separated by etching the first conductive type semiconductor layer 110. In this case, up to a buffer layer having relatively low conductivity may be removed.

Referring to FIG. 16F, a plurality of first electrodes 151, 152, and 153 may be formed on the first conductive type semiconductor layer 110 of the first to third light emitters P1, P2, and P3. The first electrode 150 may be formed of opaque metals such as Ag, Ni, Al, Rh, Pd, Ir, Ru, Mg, Zn, Pt, Au, and Hf, but embodiments are not necessarily limited thereto. When the first electrode 150 is manufactured using opaque metals, since light emitting areas are decreased as much as the area of the first electrode 150, the first electrode 150 may be formed in small size.

Then, an adhesive tape 240 may be attached on the first to third light emitters P1, P2, and P3, and then the photoresist layer may be removed. The photoresist layer may be removed by being dipped into a stripper solution. The stripper solution may include various organic/inorganic solvents capable of melting the photoresist. The adhesive tape 240 may be removed afterwards.

FIG. 17 is a view for describing a light emitting device according to a fourth embodiment of the present disclosure, and FIG. 18 is a view for describing an electrode structure of the light emitting device according to the fourth embodiment of the present disclosure.

Referring to FIG. 17, a light emitting device 10D according to the embodiment may be a flip chip type. The light emitting device 10D includes a light emitting structure 100 having first to third light emitters P1, P2, and P3, a protective layer 170 configured to cover the first to third light emitters P1, P2, and P3, a first electrode 194 electrically connected to a first conductive type semiconductor layer 110 via the protective layer 170, and a plurality of second electrodes 191, 192, and 193 electrically connected to a plurality of second conductive type semiconductor layers 131, 132, and 133 via the protective layer 170.

Specific configurations of the first to third light emitters P1, P2, and P3 may include all of the features of the light emitting structure described above with reference to FIGS. 1 to 10. That is, the individual driving of the plurality of light emitters, the configuration for controlling optical interference, the various forms of manufacturing methods, and the like may be applied without change.

The protective layer 170 may cover side surfaces and a lower portion of the light emitting structure 100. The protective layer 170 may be manufactured using a resin such as polycarbonate (PC) and polymethyl methacrylate (PMMA). In this case, the protective layer 170 may include at least one of SiO2, Si3N4, TiO2, Al2O3, and MgO.

The protective layer 170 may serve as a light reflecting layer and/or a light absorbing layer. The protective layer 170 may include light reflecting particles to serve as the light reflecting layer and may include carbon black, graphite, and the like to serve as the light absorbing layer. However, embodiments are not necessarily limited thereto, and the light emitting device 10D may further include a separate light reflecting layer.

The first electrode 194 may be electrically connected to the first conductive type semiconductor layer 110 via the protective layer 170. In this case, an ohmic electrode 164 may be disposed between the first conductive type semiconductor layer 110 and the first electrode 194.

The plurality of second electrodes 191, 192, and 193 may be electrically connected to a plurality of ohmic electrodes 161, 162, and 163 via the protective layer 170.

Referring to FIG. 18, the first electrode 194 and the plurality of second electrodes 191, 192, and 193 may include a circular shape. Specifically, one of the first electrode 194 and the plurality of second electrodes 191, 192, and 193 may be formed at the center, and the remaining electrodes may be formed to surround the electrode formed at the center.

For example, the second electrodes 191, 192, and 193 may include a second-first electrode 191 disposed at the center, a second-second electrode 192 configured to surround the second-first electrode 191, and a second-third electrode 193 configured to surround the second-second electrode 192. The first electrode 194 may be formed to surround the second-third electrode 193. However, embodiments are not necessarily limited thereto, and positions of the electrodes may be changed.

For example, the first electrode 194 and the second electrodes 191, 192, and 193 may be disposed in a structure in which the first electrode 194 is disposed at the center, the second-first electrode 191 surrounds the first electrode 194, the second-second electrode 192 surrounds the second-first electrode 191, and the second-third electrode 193 surrounds the second-second electrode 192.

However, embodiments are not necessarily limited thereto, and the shapes of the electrodes are not particularly limited as long as the first electrode 194 and the second electrodes 191, 192, and 193 have a structure in which the first electrode 194 and the second electrodes 191, 192, and 193 are rotationally symmetric with respect to an axis passing through the center.

At least one of the first electrode 194 and the second electrodes 191, 192, and 193 may include a ferromagnetic material. For example, the first electrode 194 may include at least one of nickel (Ni), cobalt (Co), and iron (Fe), and include Ni or an Ni alloy, for example. At least one of the first electrode 194 and the second electrodes 191, 192, and 193 may include at least three, e.g., at least ferromagnetic materials, among Ti, Cr, Al, Ni, Sn, In, and Au.

According to such a configuration, when disposing the light emitting device in a display device, a magnetic field may be applied to a panel so that the light emitting device is self-aligned at a desired position.

The first electrode 194 and the second electrodes 191, 192, and 193 may include a bonding material, e.g., at least one of tin (Sn) and/or indium (In), bismuth (Bi), cadmium (Cd), and lead (Pb) or an alloy selectively containing the above.

Referring to FIG. 19, a separate electrode substrate 195 may be disposed to have the electrode structure illustrated in FIG. 18. That is, the light emitting device having the configuration in FIG. 17 may be bonded to the electrode substrate 195 which has electrode structures 191a, 192a, 193a, and 194a in FIG. 19. That is, the electrode structures 191a, 192a, 193a, and 194a of the electrode substrate may have the same shapes as the shapes of the electrodes in FIG. 18 in plan view.

FIGS. 20A to 20F are views for describing a method of manufacturing the light emitting device according to the fourth embodiment of the present disclosure.

Referring to FIGS. 20A to 20F, a method of manufacturing the light emitting device according to the embodiment includes forming first to third light emitters P1. P2, and P3 in a light emitting structure 100, forming a protective layer 170 configured to cover the first to third light emitters P1, P2, and P3, and forming a first electrode 194 and second electrodes 191, 192, and 193 via the protective layer 170.

Referring to FIG. 20A, the light emitting structure 100 including the first to third light emitters P1, P2, and P3 may be manufactured, and an electrode layer may be formed on the light emitting structure 100. Then, the first to third light emitters P1, P2, and P3 may be manufactured using various methods described above with reference to FIGS. 7 to 10. The electrode layer may be separated into a plurality of second ohmic electrodes 161, 162, and 163 on the first to third light emitters P1, P2, and P3.

Referring to FIGS. 20B and 20C, after a first ohmic electrode 164 is formed on a first conductive type semiconductor layer 110, the protective layer 170 is formed throughout the first to third light emitters P1, P2, and P3. Then, a plurality of through-holes 171 are formed so that the first ohmic electrode 164 and the plurality of second ohmic electrodes 161, 162, and 163 are exposed.

Referring to FIG. 20D, the forming of the first electrode 194 and the second electrodes 191, 192, and 193 includes forming the electrodes at the through-holes through which the first ohmic electrode 164 and the second ohmic electrode 161, 162, and 163 are exposed. Specifically, the first electrode 194 electrically connected to the first ohmic electrode 164 and the plurality of second electrodes 191, 192, and 193 electrically connected to the plurality of second ohmic electrodes 161, 162, and 163 are formed.

Referring to FIG. 20E, the removing of the substrate 1 may include forming and fixing a photoresist layer 610 and a support layer 630 on the light emitting structure 100 and then removing the substrate 1. A method of removing the substrate 1 is not particularly limited. The substrate 1 may be removed using the LLO technique.

Referring to FIG. 20F, the photoresist layer 610 may be removed after an adhesive tape 240 is attached to the light emitting device 10D. The photoresist layer may be removed by being dipped into a stripper solution. The stripper solution may include various organic/inorganic solvents capable of melting the photoresist. The adhesive tape 240 may be removed afterwards.

FIG. 21 is a conceptual view for describing a display device according to an embodiment of the present disclosure, FIG. 22 is a cross-sectional view taken along line A-A in FIG. 21, and FIG. 23 is a cross-sectional view taken along line B-B in FIG. 21.

Referring to FIG. 21, a display device may include a panel 40 on which a plurality of common lines 41 and driving lines 42 intersect, a plurality of light emitting devices 10 disposed in regions in which the plurality of common lines 41 and driving lines 42 intersect, a first driver 30 configured to apply a driving signal to the common lines 41, a second driver 20 configured to apply a driving signal to the driving lines 42, and a controller 50 configured to control the first driver 30 and the second driver 20.

The features described above with reference to FIGS. 1 to 20 may be applied without change to the plurality of light emitting devices 10, and a single light emitting device 10 may refer to a single pixel. The first to third light emitters P1, P2, and P3 disposed in the light emitting device 10 may serve as subpixels.

The first light emitter P1 may serve as a first subpixel which outputs blue light. The second light emitter P2 may serve as a second subpixel which outputs green light. The third light emitter P3 may serve as a third subpixel which outputs red light.

The common line 41 is electrically connected to the first electrode 150 disposed at a lower portion of the light emitting device 10, and first to third driving lines 43, 44, and 45 may be electrically connected to the first to third light emitters P1, P2, and P3, respectively.

The controller 50 may separately control the light emitters P1, P2, and P3 of each light emitting device 10 by outputting a control signal to the first and second drivers 30 and 20 so that power is selectively applied to the common line 41 and the first to third driving lines 43, 44, and 45.

Referring to FIG. 22, the third light emitter P3 may emit blue light, and the blue light may be converted to red light by a wavelength converting layer 222 disposed on the third light emitter P3. According to the embodiment, the third driving line 45 may be electrically connected to an electrode of the third light emitter P3, and the wavelength converting layer 222 may be disposed thereon.

Referring back to FIG. 21, when the display device is implemented to have a standard definition (SD) level resolution (760×480), a high definition (HD) level resolution (1180×720), a full HD (FHD) level resolution (1920×1080), an ultra HD (UHD) level resolution (3480×2160), or a resolution higher than the UHD level resolution (e.g., 4K (K=1000), 8K, or the like), a plurality of light emitting devices 10 according to the embodiment may be arranged and connected.

Alternatively, an electric sign board or TV whose diagonal size is 100 inches or greater may be implemented with pixels having LEDs. By a light emitting module 1000 according to an embodiment being arranged as LEDs, power consumption may be decreased, a long service life may be provided with a low maintenance cost, and a high-luminance, self-emitting display may be provided.

According to the embodiment, a pixel pitch may be reduced in comparison to a conventional structure in which RGB light emitting device modules are packaged. Therefore, there is an advantage in that a resolution may be further improved. Also, a packaging process may be omitted. When the light emitting device according to the embodiment is manufactured in the size of 300 μm×300 μm, the density of the pixels may be improved in comparison to a conventional light emitting device package.

A protective layer 46 may be disposed between light emitting devices. The protective layer 46 may include a black matrix material. Therefore, the protective layer 46 may improve a contrast ratio of the display device.

Referring to FIG. 23, since a gap between a light emitting device 10 and another light emitting device 10 is filled with the protective layer 46, the driving line 44 disposed at an upper portion of the light emitting device 10 may be supported by the protective layer 46. Therefore, disconnection of the driving line 44 may be prevented even when the panel is enlarged to have a large area.

FIGS. 24A and 24B are cross-sectional views of a light emitting device according to a fifth embodiment. FIG. 24C is a plan view of a connecting electrode in FIG. 24A.

As illustrated in FIG. 24A, a light emitting device 10 may include a light emitting structure 100 including first, second, and third light emitters P1, P2, and P3, a protective layer 170 configured to cover the first, second, and third light emitters P1, P2, and P3, a first electrode 194 electrically connected to a first conductive type semiconductor layer 110 of the first, second, and third light emitters P1, P2, and P3 via the protective layer 170, and second electrodes 191, 192, and 193 electrically connected to a second conductive type semiconductor layer 130 of the first, second, and third light emitters P1, P2, and P3 via the protective layer 170.

The light emitting device 10 may be a flip chip type, and all of the first electrode 194 and the second electrodes 191, 192, and 193 may be disposed in a direction in which the second conductive type semiconductor layer 130 of the light emitting structure 100 is disposed.

The light emitting structure 100 may include the first conductive type semiconductor layer 110, an active layer 120, and the second conductive type semiconductor layer 130 which are sequentially stacked in that order, and the second conductive type semiconductor layer 130 may vertically overlap with the first conductive type semiconductor layer 110 while the active layer 120 is disposed therebetween. In the embodiment, a case in which the active layer 120 is disposed on the second conductive type semiconductor layer 130 and the first conductive type semiconductor layer 110 is disposed on the active layer 120 is illustrated. In this case, the active layers 120 and the second conductive type semiconductor layers 130 of the first, second, and third light emitters P1, P2, and P3 may be disposed to be separated from each other.

In the first, second, and third light emitters P1, P2, and P3 of the light emitting structure 100, light in a blue (B) wavelength band may be emitted through the first conductive type semiconductor layer 110, and a wavelength converting layer 222 and blue, green, and red color filters 223a. 223b, and 223c may be disposed in a direction in which light in the blue (B) wavelength band is emitted. In the embodiment, a case in which the wavelength converting layer 222 and the blue, green, and red color filters 223a. 223b, and 223c vertically overlap with the active layer 120 while the first conductive type semiconductor layer 110 is disposed therebetween is illustrated.

The wavelength converting layer 222 may absorb light in the blue (B) wavelength band emitted from the first, second, and third light emitters P1, P2, and P3 and convert the absorbed light to light in a white (W) wavelength band. For this, the wavelength converting layer 222 may include wavelength converting particles, and the wavelength converting layer 222 may have a structure in which the wavelength converting particles are distributed throughout a polymer resin selected from transmissive epoxy resin, silicone resin, polyimide resin, urea resin, acrylic resin, and the like, but embodiments are not limited thereto.

The wavelength converting particles may include one or more of a fluorescent substance and a quantum dot (QD).

The fluorescent substance may include any one of a YAG-based fluorescent material, a TAG-based fluorescent material, a silicate-based fluorescent material, a sulfide-based fluorescent material, and a nitride-based fluorescent material, but embodiments are not limited by the type of fluorescent substance. The YAG and TAG-based fluorescent materials may be selected from (Y, Tb, Lu, Sc, La, Gd, Sm)$_3$(Al, Ga, In, Si, Fe)$_5$(O, S)$_{12}$:Ce, and the silicate-based fluorescent material may be selected from (Sr, Ba, Ca, Mg)$_2$SiO$_4$:(Eu, F, Cl). The sulfide-based fluorescent material may be selected from (Ca,Sr)S:Eu, (Sr,Ca,Ba)(Al,Ga)$_2$S$_4$:Eu. And the nitride-based fluorescent material may be (Sr, Ca, Si, Al, O)N:Eu (for example, CaAlSiN$_4$:Eu β-SiAlON: Eu) or (Ca$_x$,M$_y$)(Si,Al)$_{12}$(O,N)$_{16}$, which is Ca-α SiAlON: Eu-based. In this case, M may be at least one material of Eu, Tb, Yb, and Er or may be selected from fluorescent substance components that satisfy 0.05<(x+y)<0.3, 0.02<x<0.27, and 0.03<y<0.3.

The wavelength converting layer 222 may be separated by a first partition 221 into areas which vertically overlap the first, second, and third light emitters P1, P2, and P3. The first partition 221 may prevent color mixture of light emitted from the first, second, and third light emitters P1, P2, and P3. The first partition 221 may include a light absorbing material such as carbon black and graphite, but may also include a reflective material configured to reflect light. A method of forming the first partition 221 is not particularly limited. For example, the first partition 221 may be formed using photolithography, imprinting, roll-to-roll printing, inkjet printing, and the like.

The light in the white (W) wavelength band converted by the wavelength converting layer 222 as described above may implement light in the blue (B), green (G), and red (R) wavelength bands due to the blue, green, and red color filters 223a, 223b, and 223c disposed respectively in the first, second, and third light emitters P1, P2, and P3 on the wavelength converting layer 222.

Meanwhile, as illustrated in FIG. 24B, in the light emitting device 10 according to the embodiment, an active layer 120b of at least one light emitter P2 of the first, second, and third light emitters P1, P2, and P3 may differ from active layers 120a of the remaining light emitters P1 and P3. For example, the first active layers 120a of the first and third light emitters P1 and P3 may generate light in the blue (B) wavelength band while the second active layer 120b of the second light emitter P2 generates light in the green (G) wavelength band. In this case, a red wavelength converting layer 222R and the red color filter 223c may be disposed only in a region that vertically overlaps with the third light emitter P3. In this case, only the red wavelength converting layer 222R may be disposed in the region vertically overlapping with the third light emitter P3. The red wavelength converting layer 222R may absorb light in the blue (B) wavelength band emitted from the first active layer 120a of the third light emitter P3 and convert the absorbed light to light in the red (R) wavelength band.

Therefore, in the above-described light emitting device 10, the first, second, and third light emitters P1, P2, and P3 of the light emitting structure 100 may implement light in the blue (B), green (G), and red (R) wavelength bands, respectively.

Referring back to FIG. 24A, the protective layer 170 may cover side surfaces and a lower portion of the light emitting structure 100. The protective layer 170 may include a resin such as PC and PMMA, but embodiments are not limited thereto. Further, the protective layer 170 may include at least one of SiO2, Si3N4, TiO2, Al2O3, and MgO, but embodiments are not limited thereto.

The protective layer 170 may serve as a light reflecting layer and/or a light absorbing layer, but embodiments are not limited thereto. For example, the protective layer 170 may further include light reflecting particles including metals such as Al and Ag to serve as the light reflecting layer. Also, the protective layer 170 may include carbon black, graphite, and the like to serve as the light absorbing layer.

The first electrode 194 may be electrically connected to the first conductive type semiconductor layer 110 via the protective layer 170. In this case, the first conductive type semiconductor layer 110 and the first electrode 194 may be electrically connected via a connecting electrode 164. The connecting electrode 164 may be disposed between the first conductive type semiconductor layer 110 and the protective layer 170. The connecting electrode 164 may directly come into contact with the first conductive type semiconductor layer 110 and evenly deliver a carrier supplied from the first electrode 194 to the first conductive type semiconductor layer 110 of the first, second, and third light emitters P1, P2, and P3.

To easily deliver a carrier supplied from the first electrode 194 to the first, second, and third light emitters P1, P2, and P3, the connecting electrode 164 may also be disposed between the first, second, and third light emitters P1, P2, and P3. For example, as illustrated in FIG. 24C, the connecting electrode 164 may be integrally formed between the first conductive type semiconductor layer 110 and the protective layer 170.

For example, the connecting electrode 164 may be an ohmic electrode for ohmic contact between the first electrode 194 and the first conductive type semiconductor layer 110. In this case, the connecting electrode 164 may be selected from TCOs such as ITO, IZO, AZO, AGZO, IZTO, IAZO, IGZO, IGTO, ATO, GZO, IZON, ZnO, IrOx, RuOx, and NiO, but embodiments are not limited thereto.

The connecting electrode 164 may not be formed. In this case, the first electrode 194 may directly come into contact with the first conductive type semiconductor layer 110 and may evenly deliver a carrier supplied from the first electrode 194 to the first conductive type semiconductor layer 110 of the first, second, and third light emitters P1, P2, and P3.

The second electrodes 191, 192, and 193 may be connected to the second conductive type semiconductor layers 130 of the first, second, and third light emitters P1, P2, and P3 and selectively deliver a carrier to the first, second, and third light emitters P1, P2, and P3.

The second electrodes 191, 192, and 193 may be electrically connected to a plurality of reflective electrodes 161, 162, and 163 via the protective layer 170. The reflective electrodes 161, 162, and 163 may be disposed between the second electrodes 191, 192, and 193 and the second conductive type semiconductor layers 130. That is, the reflective electrodes 161, 162, and 163 may vertically overlap with the active layers 120 of the first, second, and third light emitters P1, P2, and P3 while the second conductive type semiconductor layers 130 are disposed therebetween.

The reflective electrodes 161, 162, and 163 may be configured to reflect light generated by the first, second, and third light emitters P1, P2, and P3 toward the first conductive type semiconductor layer 110. For example, the reflective electrodes 161, 162, and 163 may be formed to include a material having a high reflectance such as Ag, Ni, Al, Rh, Pd, Ir, Ru, Mg, Zn, Pt, Au, and Hf or formed by mixing between the material having a high reflectance and a transparent conductive material such as IZO, IZTO, IAZO, IGZO, IGTO, AZO, and ATO, but embodiments are not limited thereto. Also, the reflective electrodes 161, 162, and 163 may be formed of a single-layer or multi-layer structure.

The first electrode 194 and the second electrodes 191, 192, and 193 may be selected from ITO, IZO, AZO, AGZO, IZTO, IAZO, IGZO, IGTO, ATO, GZO, IZON, ZnO, IrOx, RuOx, NiO, and the like. The first electrode 194 and the second electrodes 191, 192, and 193 are not limited thereto and may further include opaque metals selected from Ag. Ni, Al, Rh, Pd, Ir, Ru, Mg, Zn, Pt, Au, Hf, and the like. The first electrode 194 and the second electrodes 191, 192, and 193 may be formed of a single-layer or multi-layer structure.

The above-described light emitting device 10 according to the fifth embodiment may be disposed in every pixel region of a display device. When the light emitting device 10 includes the first, second, and third light emitters P1, P2, and P3 as in the embodiment, the first, second, and third light emitters P1, P2, and P3 may independently emit light.

A display device including pixels in which the light emitting device according to the fifth embodiment is disposed will be described in detail below.

FIG. 25A is a plan view of a display device in which the light emitting device in FIGS. 24A and 24B is disposed in every pixel region, and FIGS. 25B and 25C are cross-sectional views taken along line I-I' in FIG. 25A. In this case, FIG. 25B is a cross-sectional view taken along line I-I' in which the light emitting device in FIG. 24A is disposed in a pixel region, and FIG. 25C is a cross-sectional view taken along line I-I' in which the light emitting device in FIG. 24B is disposed in a pixel region.

As illustrated in FIGS. 25A and 25B, the display device may include a panel 40 including a plurality of pixel regions defined by regions in which common lines 41 and driving lines 42 intersect, a light emitting device 10 disposed in each pixel region, a first driver 30 configured to apply a driving signal to the common lines 41, a second driver 20 configured to apply a driving signal to the driving lines 42, and a controller 50 configured to control the first driver 30 and the second driver 20.

A second partition 46 disposed in the panel 40 is disposed between the light emitting devices 10 disposed in the pixel regions and may support the light emitting devices 10, the common lines 41, the driving lines 42, and the like. Therefore, disconnection of the common lines 41 and the driving lines 42 may be prevented even when the panel 40 is enlarged to have a large area. The second partition 46 may include a material such as carbon black and graphite and prevent light leakage between adjacent pixel regions, but embodiments are not limited thereto.

The common lines 41 may be electrically connected to the first electrode 194 of the light emitting device 10. Also, first, second, and third driving lines 43, 44, and 45 may be electrically connected to the second electrodes 191, 192, and 193 of the first, second, and third light emitters P1, P2, and P3, respectively.

Since all of the first electrode 194 and the second electrodes 191, 192, and 193 are exposed in a direction in which the second conductive type semiconductor layer 130 of the light emitting device 10 is disposed with respect to the active layer 120, the common lines 41 and the driving lines 42 may have a structure in which the common lines 41 and the driving lines 42 are separated while at least one insulating film is disposed therebetween, but embodiments are not limited thereto. In the embodiment, first and second insulating films 1a and 1b are illustrated.

The light emitting device 10 may be disposed in every pixel region of the panel 40. A thickness D of the protective layer 170 between the connecting electrode 164 and a lower surface of the protective layer 170 may be in a range of 20 μm to 100 μm. In this case, when the thickness D of the protective layer 170 between the connecting electrode 164 and the lower surface of the protective layer 170 is greater than 100 μm, a thickness of the display device increases. Conversely, when the thickness D of the protective layer 170 between the connecting electrode 164 and the lower surface of the protective layer 170 is less than 20 μm, the light emitting structure 100 may be unable to have a sufficient thickness, and luminous efficiency of the light emitting structure 100 may be reduced.

Therefore, a single light emitting device 10 may serve as a pixel of the display device. Also, the first, second, and third light emitters P1, P2, and P3 of the light emitting device 10 may serve as first, second, and third subpixels. For example, the first light emitter P1 may serve as a blue subpixel, the second light emitter P2 may serve as a green subpixel, and the third light emitter P3 may serve as a red subpixel. Therefore, light in the blue, green, and red wavelength bands emitted from the above-described single light emitting device 10 may be mixed to implement white light.

Meanwhile, the red wavelength converting layer 222R and the red color filter 223c may be disposed only in a region that vertically overlaps with the third light emitter P3 of the first, second, and third light emitters P1, P2, and P3, and light in the blue (B) wavelength band emitted from the third light emitter P3 may be converted to light in the red (R) wavelength band. Accordingly, the first, second, and third light emitters P1, P2, and P3 may implement light in the blue (B), green (G), and red (R) wavelength bands, respectively.

Referring back to FIG. 25A, the controller 50 may output a control signal to the first and second drivers 30 and 20 so that power is selectively applied to the common lines 41 and the driving lines 42. Accordingly, the controller 50 may individually control the first, second, and third light emitters P1, P2, and P3 of the light emitting device 10.

In a general display device, a light emitting device may be individually disposed for each subpixel of a pixel, or a light emitting device package including two or more light emitting devices packaged through an additional packaging process such as die-bonding and wire bonding may be disposed in a pixel. Consequently, a packaging area has to be taken into consideration in the general display device, and luminous efficiency is low since an area of an actual light emitting area of the entire area of a panel is narrow.

On the other hand, in the display device according to the embodiment, the light emitting device 10 at a chip level may be disposed in a pixel region, and the first, second, and third light emitters P1, P2, and P3 of the light emitting device 10 may serve as first, second, and third pixels, which are RGB pixels. Therefore, it is not necessary to package the first, second, and third light emitters P1, P2, and P3 serving as the first, second, and third subpixels using an additional process such as die-bonding and wire bonding. Accordingly, an area for performing wire bonding and the like is removed, and gaps between the first, second, and third light emitters P1, P2, and P3 of the light emitting device 10 may be reduced. That is, since a pixel pitch between subpixels and pixel regions is reduced, the pixel density and resolution of the display device may be improved.

Particularly, since the first electrode 194 and the second electrodes 191, 192, and 193 vertically overlap the light emitting structure 100, it is not necessary to secure the above-described pad region in the semiconductor device according to the embodiment. Therefore, luminous efficiency is high, and the size of the light emitting device 10 may be reduced since the gaps between the first, second, and third light emitters P1, P2, and P3 are reduced as described above.

Meanwhile, the first conductive type semiconductor layers 110 of the first, second, and third light emitters P1, P2, and P3 of the light emitting device 10 may be disposed to be separated from each other.

FIGS. 26A and 26B are cross-sectional views of a light emitting device according to another structure of the fifth embodiment.

As illustrated in FIGS. 26A and 26B, first conductive type semiconductor layers 110 of first, second, and third light emitters P1, P2, and P3 of a light emitting device 10 may be disposed to be separated from each other. In this case, the first conductive type semiconductor layers 110 of the first, second, and third light emitters P1, P2, and P3 may be connected to each other via a connecting electrode 164. Since the connecting electrode 164 is integrally formed as illustrated in FIG. 24B, a carrier may be uniformly supplied to the first, second, and third light emitters P1, P2, and P3 of the light emitting device 10 via a single first electrode 194 even when the first conductive type semiconductor layers 110 of the first, second, and third light emitters P1, P2, and P3 are disposed to be separated from each other.

Specifically, as illustrated in FIG. 26A, the connecting electrode 164 may simultaneously connect the first conductive type semiconductor layers 110 of the first, second, and third light emitters P1, P2, and P3 to each other and electrically connect the first electrode 194 to the first conductive type semiconductor layers 110 of the first, second, and third light emitters P1, P2, and P3. As illustrated in FIG. 26B, the connecting electrode 164 may be disposed at one surface of the first conductive type semiconductor layers 110 of the first, second, and third light emitters P1, P2, and P3 exposed due to the protective layer 170.

A portion of the connecting electrode 164 may directly come into contact with the first electrode 194, and a carrier injected from the first electrode 194 may be delivered to the first, second, and third light emitters P1, P2, and P3 by the integrally formed connecting electrode 164 which connects the first conductive type semiconductor layers 110 of the first, second, and third light emitters P1, P2, and P3 to each other.

Therefore, power may be applied to the first, second, and third light emitters P1, P2, and P3 of the light emitting device 10 through a single common line 41 (see FIG. 25A) even when the first conductive type semiconductor layers 110 of the first, second, and third light emitters P1, P2, and P3 of the light emitting device 10 are disposed to be separated from each other. Also, driving of the first, second, and third light emitters P1, P2, and P3 of the light emitting device 10 may be individually controlled by the driving lines 42 (see FIG. 25A) connected to the first, second, and third light emitters P1, P2, and P3 of the light emitting device 10.

FIGS. 27A to 27G are process cross-sectional views illustrating a method of manufacturing the light emitting device in FIG. 24A.

As illustrated in FIG. 27A, a light emitting structure 100 including a first conductive type semiconductor layer 110, an active layer 120, and a second conductive type semiconductor layer 130 may be formed on a substrate 1, and reflective electrodes 161, 162, and 163 disposed on the second conductive type semiconductor layer 130 may be respectively formed at the first, second, and third light emitters P1, P2, and P3 of the light emitting structure 100.

The first, second, and third light emitters P1, P2, and P3 of the light emitting structure 100 may have a structure in which mesa etching is performed on the first conductive type semiconductor layer 110, the active layer 120, and the second conductive type semiconductor layer 130. Portions of the first conductive type semiconductor layer 110, the active layer 120, and the second conductive type semiconductor layer 130 may be etched, and reflective electrodes 161, 162, and 163 may be disposed to be separated corresponding to the first, second, and third light emitters P1, P2, and P3.

In the embodiment, a case in which the first, second, and third light emitters P1, P2, and P3 share a portion of the first conductive type semiconductor layer 110, and the active layer 120, the second conductive type semiconductor layer 130, and the reflective electrodes 161, 162, and 163, which are disposed on the first conductive type semiconductor 110, are separated corresponding to the first, second, and third light emitters P1, P2, and P3 is illustrated.

As illustrated in FIG. 27B, a connecting electrode 164 may be formed on a region in which a portion of the first conductive type semiconductor layer 110 is etched. The connecting electrode 164 may also be formed on the first conductive type semiconductor layer 110 between the first, second, and third light emitters P1. P2, and P3, and the connecting electrode 164 disposed on the first conductive type semiconductor layer 110 may be integrally formed as illustrated in FIG. 24C.

As illustrated in FIG. 27C, a protective layer 170 is formed on the substrate 1 so as to cover the connecting electrode 164, the light emitting structure 100, and the reflective electrodes 161, 162, and 163. Also, the protective layer 170 is selectively removed, and through-holes 171 configured to expose the first, second, and third reflective electrodes 161, 162, and 163 respectively disposed at the first, second, and third light emitters P1, P2, and P3 and a portion of the connecting electrode 164 are formed. A depth of the through-hole 171 configured to expose the connecting electrode 164 may differ from a depth of the through-hole 171 configured to expose the first, second, and third reflective layers 161, 162, and 163.

As illustrated in FIG. 27D, the second electrodes 191, 192, and 193 which respectively come into contact with the first, second, and third reflective electrodes 161, 162, and 163 of the first, second, and third light emitters P1, P2, and P3 via the through-holes 171 are formed. Also, the first electrode 194 coming into contact with the connecting electrode 164 may be formed.

The first electrode 194 may electrically come into contact with the connecting electrode 164 disposed on the first conductive type semiconductor layer 110, and the first conductive type semiconductor layers 110 of the first, second, and third light emitters P1, P2, and P3 may be electrically connected to the single first electrode 194. Also, the second electrodes 191, 192, and 193 may respectively come into contact with the first, second, and third reflective electrodes 161, 162, and 163 of the first, second, and third light emitters P1, P2, and P3.

Therefore, in the light emitting device according to the embodiment, the first electrode 194 may be electrically connected to the common lines 41 of the panel 40 (see FIG. 25A) and supply power to the first, second, and third light emitters P1, P2, and P3 of the light emitting device, and the second electrodes 191, 192, and 193 coming into contact with the second conductive type semiconductor layers 130 of the first, second, and third light emitters P1, P2, and P3 may be electrically connected to the driving lines 42 of the panel 40 (see FIG. 25A) and control the driving lines 42 to control light emission of the first, second, and third light emitters P1, P2, and P3.

As illustrated in FIG. 27E, a support pad 400 including a photoresist layer 410 and a support layer 430 may be formed at a front surface of the substrate 1 so as to cover the second electrodes 191, 192, and 193 and the first electrode 194, and then the substrate 1 may be removed. A method of removing the substrate 1 is not particularly limited. For example, the substrate 1 may be removed using the LLO technique.

As illustrated in FIG. 27F, the support pad 400 may be removed from the light emitting structure 100. For example, the photoresist layer 410 may be removed by being dipped into a stripper solution. The stripper solution may include various organic/inorganic solvents capable of melting the photoresist. When the photoresist layer 410 is removed, the support layer 430 may be separated from the light emitting structure 100.

As illustrated in FIG. 27G, a first partition 221, a wavelength converting layer 222, and color filters 223a, 223b, and 223c may be disposed in a direction in which light generated in the active layer 120 of the light emitting structure 100 is emitted. Accordingly, the light emitting device 10 at a chip level that includes the first, second, and third light emitters P1, P2, and P3 may be formed.

Therefore, the above-described light-emitting device 10 may implement light in the blue (B), green (G), and red (R) wavelength bands for each of the first, second, and third light emitters P1, P2, and P3 through the wavelength converting layer 222 and the blue, green, and red color filters 223a, 223b, and 223c disposed in the direction in which light in the blue wavelength band generated in the active layer 120 of the light emitting structure 100 is emitted. Meanwhile, although not illustrated, the wavelength converting layer 222 and the blue color filter 223a may be removed from the first light emitter P1, and light in the blue (B) wavelength band generated in the active layer 120 of the third light emitter P3 may be emitted as it is.

Since the above-described display device uses the light emitting device 10 at a chip level including the first, second, and third light emitters P1, P2, and P3 as a pixel, a wire is not required, and thus an additional packaging process such as wire bonding may be omitted. Therefore, optical interference due to a wire may be prevented.

Further, even when the first conductive type semiconductor layers 110 of the first, second, and third light emitters P1, P2, and P3 are separated from each other, the light emitting structure 100 may be supported through the protective layer 170 at which the second electrodes 191, 192, and 193 and the first electrode 194 are formed. Therefore, light absorption due to the substrate 1 may be prevented by removing the substrate 1 from the light emitting structure 100.

FIGS. 27H and 27I are process cross-sectional views illustrating a method of manufacturing the light emitting device in FIG. 26A.

In a method of forming the light emitting device 10 as illustrated in FIG. 26A in which the first conductive type semiconductor layers 110 of the first, second, and third light emitters P1, P2, and P3 are disposed to be separated from each other, the steps illustrated in FIGS. 27A to 27E may be performed, and then the steps illustrated in FIGS. 27H and 27I may be further performed. Although not illustrated, when performing mesa etching on the first conductive type semiconductor layer 110, the active layer 120, and the second conductive type semiconductor layer 130 as illustrated in FIG. 27A, the first conductive type semiconductor layer 110 may be removed so that an upper surface of the substrate 1 is exposed between the first, second, and third light emitters P1, P2, and P3, and the first conductive type semiconductor layers 110 of the first, second, and third light emitters P1, P2, and P3 may be disposed to be separated.

First, as illustrated in FIG. 27H, the first conductive type semiconductor layer 110 which is exposed as the substrate 1 (see FIG. 27E) is separated is further removed. In this case, the first conductive type semiconductor layer 110 may be removed so that the first conductive type semiconductor layers 110 of the first, second, and third light emitters P1, P2, and P3 are disposed to be separated. As illustrated in FIG. 27I, the support pad 400 may be removed from the light emitting structure 100, and the first partition 221, the wavelength converting layer 222, and the blue, green, and red color filters 223a. 223b, and 223c may be disposed. Accordingly, the light emitting device 10 at a chip level including the first, second, and third light emitters P1, P2, and P3 may be formed.

Since the display device in which the above-described light emitting device 10 at a chip level is used as a pixel has a higher pixel density than an LCD device and an organic electroluminescent display device of the same size, a high-resolution, large-screen display device may be implemented.

FIGS. 28A to 28F are process cross-sectional views illustrating a method of manufacturing a light emitting structure in FIG. 24B.

When the first light emitter P1 and the third light emitter P3 include the same first active layer 120a while the second light emitter P2 includes the second active layer 120b which differs from the first active layer 120a as illustrated in FIG. 24B, the method may include forming a light emitting structure 100) on a substrate 1, etching a partial region of the light emitting structure 100, and re-growing the light emitting structure 100 on the etched partial region.

As illustrated in FIG. 28A, the light emitting structure 100 may be formed by sequentially forming the first conductive type semiconductor layer 110, the first active layer 120a, and the second conductive type semiconductor layer 130 in that order on the substrate 1. Then, as illustrated in FIG. 28B, a first mask 2 may be disposed at an upper surface of the light emitting structure 100. The first mask 2 may expose a partial region of the second conductive type semiconductor layer 130 of the second light emitter P2 of the light emitting structure 100. In this case, a first region 3 exposed due to the first mask 2 may be a region for forming the light emitting structure 100 including the second active layer 120b which differs from the first active layer 120a.

Then, as illustrated in FIG. 28C, the first conductive type semiconductor layer 110, the first active layer 120a, and the second conductive type semiconductor layer 130 in the region exposed due to the first mask 2 are removed such that a groove 3a which exposes the first conductive type semiconductor layer 110 via a bottom surface thereof and exposes the first conductive type semiconductor layer 110, the first active layer 120a, and the second conductive type semiconductor layer 130 via side surfaces thereof is formed. Then, as illustrated in FIG. 28D, a second mask 2a may be disposed to cover the side surfaces of the groove 3a. The second mask 2a may be configured to prevent damages to the light emitting structure due to subsequent processes.

Then, as illustrated in FIG. 28E, the first conductive type semiconductor layer 110 is re-grown on the first conductive type semiconductor layer 110 exposed via the bottom surface of the groove 3a. A physical interface may be generated between the re-grown first conductive type semiconductor layer 110 and the first conductive type semiconductor layer 110 which is not etched yet, but embodiments are not necessarily limited thereto. The interface may disappear due to the re-growth. Then, the second active layer 120b may be formed on the re-grown first conductive type semiconductor layer 110, and the second conductive type semiconductor layer 130 may be re-grown on the second active layer 120b. For example, the second active layer 120b may emit light in the green (G) wavelength band, and the first active layer 120a may emit light in the blue (B) wavelength band.

Then, as illustrated in FIG. 28F, by removing the first and second masks 2 and 2a, the light emitting structure 100 which include the first light emitter P1 and the third light emitter P3 including the same first active layer 120a and the second light emitter P2 including the second active layer 120b which differs from the first active layer 120a may be formed. Then, the reflective electrodes 161, 162, and 163 may be respectively formed on the first, second, and third light emitters P1, P2, and P3 of the light emitting structure 100.

Subsequent processes are the same as those illustrated in FIGS. 27B to 27F, and descriptions thereof will be omitted. Then, as illustrated in FIG. 24B, the red wavelength converting layer 222R and the red color filter 223c may be disposed only in a region that vertically overlaps with the second light emitter P2 on the light emitting structure 100. In this case, only the red wavelength converting layer 222R may be disposed, and color characteristics of light in the red wavelength band implemented by disposing both the red wavelength converting layer 222R and the red color filter 223c may be improved.

A light emitting device according to a sixth embodiment will be described in detail below.

FIGS. 29A and 29B are cross-sectional views of the light emitting device according to the sixth embodiment.

As illustrated in FIG. 29A, a light emitting device 10 according to the sixth embodiment may include a light emitting structure 200 including first, second, and third light emitters P1, P2, and P3, a protective layer 270 configured to cover the first, second, and third light emitters P1, P2, and P3, a first electrode 294 electrically connected to a first conductive type semiconductor layer 210 of the light emitting structure 200, and a plurality of second electrodes 291, 292, and 293 electrically connected to a second conductive type semiconductor layer 230 of the first, second, and third light emitters P1, P2, and P3 via the protective layer 270.

The light emitting device 10 may be a vertical type, and the first electrode 294 and the second electrodes 291, 292, and 293 may be disposed in opposite directions while the light emitting structure 200 is disposed therebetween. In the embodiment, a case in which the second conductive type semiconductor layer 230, an active layer 220, and the first conductive type semiconductor layer 210 are sequentially stacked in that order in the second light emitting structure 200 such that the active layer 220 is disposed on the second conductive type semiconductor layer 230 and the first conductive type semiconductor layer 210 is disposed on the active layer 220 is illustrated. A case in which the first electrode 294 is disposed on the first conductive type semiconductor layer 210 such that the first electrode 294 vertically overlaps with the active layer 220 while the first conductive type semiconductor layer 210 is disposed therebetween and the second electrodes 291, 292, and 293 are disposed to vertically overlap with the active layer 220 while the second conductive type semiconductor layer 230 is disposed therebetween is illustrated.

The light emitting structure 200 may include the first conductive type semiconductor layer 210, the active layers 220 disposed to be spaced apart from each other on the first conductive type semiconductor layer 210 and disposed on the first, second, and third light emitters P1, P2, and P3, and the second conductive type semiconductor layer 230 configured to vertically overlap with the first conductive type semiconductor layer 210 while the active layers 220 are disposed therebetween. The first, second, and third light emitters P1, P2, and P3 may share the first conductive type semiconductor layer 210, and the first, second, and third light emitters P1, P2, and P3 may be connected to each other via the first conductive type semiconductor layer 210.

The above-described first, second, and third light emitters P1, P2, and P3 of the light emitting structure 200 may emit the same colored light. For example, the first, second, and third light emitters P1, P2, and P3 of the light emitting structure 200 may emit blue (B) light.

Since the first electrode 294 which comes into contact with the first conductive type semiconductor layer 210 in a direction in which light in the blue (B) wavelength band generated in the active layer 220 is emitted is disposed in the above-described light emitting device 10, when color filters and wavelength converting layers are directly disposed on the first electrode 294, it is not possible to bring the first electrode 294 into electrical contact with common lines of a panel which will be described below. Therefore, the color filters and the wavelength converting layers may be disposed on the common lines after the light emitting device 10 is mounted in the panel.

Meanwhile, as illustrated in FIG. 29B, the first light emitter P1 and the third light emitter P3 may include the same first active layer 220a while the second light emitter P2 includes the second active layer 220b which differs from the first active layer 220a. In this case, the first active layer 220a may generate light in the blue (B) wavelength band, and the second active layer 220b may generate light in the green (G) wavelength band.

After the above-described light emitting device 10 is disposed in a panel of a display device, the first, second, and third light emitters P1, P2, and P3 of the light emitting structure 200 may implement light in the blue (B), green (G), and red (R) wavelength bands through the wavelength converting layers and the color filters.

Referring back to FIG. 29A, the first electrode 294 may directly come into contact with the first conductive type semiconductor layer 210 of the light emitting structure 200 exposed due to the protective layer 270. For example, the protective layer 270 may expose the first conductive type semiconductor layer 210 of the light emitting structure 200. The first conductive type semiconductor layer 210 of the first, second, and third light emitters P1, P2, and P3 may be electrically connected to the single first electrode 294, and a power signal may be applied to the first, second, and third light emitters P1, P2, and P3 via the first electrode 294. The first electrode 294 is illustrated in FIG. 29A as being disposed only at an upper surface of the first conductive type semiconductor layer 210, but embodiments are not limited thereto. The first electrode 294 may also be disposed in a region of the protective layer 270.

The second electrodes 291, 292, and 293 may be electrically connected to the second conductive type semiconductor layers 230 of the first, second, and third light emitters P1, P2, and P3, respectively. For example, reflective electrodes 261, 262, and 263 may be disposed between the second electrodes 291, 292, and 293 and the second conductive type semiconductor layers 230 of the first, second, and third light emitters P1, P2, and P3, and the second electrodes 291, 292, and 293 may be electrically connected to the second conductive type semiconductor layers 230 of the first, second, and third light emitters P1, P2, and P3 via the reflective electrodes 261, 262, and 263. The reflective electrodes 261, 262, and 263 may reflect light generated in the first, second, and third light emitters P1, P2, and P3 toward the first conductive type semiconductor layer 210.

In the above-described light emitting device 10 according to the sixth embodiment, a power signal may be applied from the first electrode 294 to the first, second, and third light emitters P1, P2, and P3, and the first, second, and third light emitters P1, P2, and P3 may selectively be driven through the second electrodes 291, 292, and 293 and emit light.

A display device including pixels in which the light emitting device 10 according to the sixth embodiment is disposed will be described in detail below.

FIG. 30A is a plan view of the display device in which the light emitting device according to the sixth embodiment is disposed in every pixel region, and FIGS. 30B and 30C are cross-sectional views taken along line I-I' in FIG. 30A. In this case, FIG. 30B is a cross-sectional view taken along line I-I' in which the light emitting device in FIG. 29A is disposed in pixel regions, and FIG. 30C is cross-sectional view taken along line I-I' in which the light emitting device in FIG. 29B is disposed in pixel regions.

As illustrated in FIGS. 30A and 30B, a display device may include a panel 40 including a plurality of pixel regions defined by regions in which common lines 41 and driving lines 42 intersect, a light emitting device 10 disposed in each pixel region, a first driver 30 configured to apply a driving signal to the common lines 41, a second driver 20 configured to apply a driving signal to the driving lines 42, and a controller 50 configured to control the first driver 30 and the second driver 20.

A second partition 46 disposed in the panel 40 is disposed between the light emitting devices 10 disposed in the pixel regions and may support the light emitting devices 10, the common lines 41, the driving lines 42, and the like. Therefore, disconnection of the common lines 41 and the driving lines 42 may be prevented even when the panel 40 is enlarged to have a large area. The second partition 46 may include a material such as carbon black and graphite and prevent light leakage between adjacent pixel regions, but embodiments are not limited thereto. Further, even when a wavelength converting layer 222 and blue, green, and red color filters 223a, 223b, and 223c are disposed between the common lines 41, the second partition 46 disposed between adjacent light emitting devices 10 may sufficiently support the wavelength converting layer 222 and the blue, green, and red color filters 223a, 223b, and 223c.

The common lines 41 may be electrically connected to a first electrode 294 of the light emitting device 10. Also, first, second, and third driving lines 43, 44, and 45 may be respectively connected to the second electrodes 291, 292, and 293 of the first, second, and third light emitters P1, P2, and P3. Since the first electrode 294 and the second electrodes 291, 292, and 293 are disposed in opposite directions with respect to the active layers 220a and 220b, the common lines 41 may be electrically connected to the first electrode 294 at an upper portion of the light emitting device 10, and the first, second, and third driving lines 42 (43, 44, and 45) may respectively come into contact with the second electrodes 291, 292, and 293 of the first, second, and third light emitters P1, P2, and P3 at a lower portion of the light emitting device 10. Therefore, interference between the common lines 41 and the driving lines 42 may be efficiently prevented.

In the display device, the controller 50 may output a control signal to the first and second drivers 30 and 20 so that power is selectively applied to the common lines 41 and the driving lines 42. Accordingly, the first, second, and third light emitters P1, P2, and P3 of the light emitting device 10 may be individually controlled.

For example, the controller 50 may supply power to the first, second, and third light emitters P1, P2, and P3 of the light emitting device 10 via the common lines 41 and may control the first, second, and third driving lines 42 (43, 44, and 45) so that the first, second, and third light emitters P1, P2, and P3 selectively emit light.

The wavelength converting layer 222 and the blue, green, and red color filters 223a. 223b, and 223c may be disposed on the light emitting structure 200 so as to vertically overlap with the first, second, and third light emitters P1, P2, and P3 of the light emitting device 10 while the common lines 41 are disposed therebetween. The wavelength converting layer 222 may include a material for converting light in the blue wavelength band emitted from the first, second, and third light emitters P1, P2, and P3 to light in the white wavelength band.

The above-described wavelength converting layer 222 may be separated by the first partition 221 corresponding to regions which vertically overlap the first, second, and third light emitters P1, P2, and P3. The first partition 221 may prevent color mixture of light emitted from the first, second, and third light emitters P1, P2, and P3. The first partition 221 may include a light absorbing material such as carbon black and graphite, but may also include a reflective material which reflects light. A method of forming the first partition 221 is not particularly limited. For example, the first partition 221 may be formed using photolithography, imprinting, roll-to-roll printing, inkjet printing, and the like.

The light in the white wavelength band converted by the wavelength converting layer 222 as described above may implement light in the blue (B), green (G), and red (R) wavelength bands due to the blue, green, and red color filters 223a, 223b, and 223c disposed respectively in the first, second, and third light emitters P1, P2, and P3 on the wavelength converting layer 222.

Meanwhile, as illustrated in FIG. 30C, the red wavelength converting layer 222R and the red color filter 223c may be disposed only in a region that vertically overlaps with the third light emitter P3 of the first, second, and third light emitters P1, P2, and P3 while the common lines 41 are disposed therebetween on the light emitting structure 200, and light in the blue (B) wavelength band generated in the third light emitter P3 may be converted to light in the red (R) wavelength band. Accordingly, the first, second, and third light emitters P1, P2, and P3 may respectively implement light in the blue (B), green (G), and red (R) wavelength bands.

Meanwhile, the first conductive type semiconductor layer 210 of the first, second, and third light emitters P1, P2, and P3 of the light emitting device 10 may have a structure in which the first conductive type semiconductor layer 210 is disposed to be separated. In this case, the separation of the first conductive type semiconductor layer 210 of the first, second, and third light emitters P1, P2, and P3 may be performed by further removing the first conductive type semiconductor layer 210 exposed due to separating the substrate during the process of manufacturing the light emitting device 10.

FIGS. 31A and 31B are cross-sectional views of a light emitting device according to another structure of the sixth embodiment.

As illustrated in FIGS. 31A and 31B, the first conductive type semiconductor layer 210 of the first, second, and third light emitters P1, P2, and P3 of the light emitting device 10 according to the sixth embodiment may have a structure in which the first conductive type semiconductor layer 210 is disposed to be separated.

Even when the first conductive type semiconductor layers 210 of the first, second, and third light emitters P1, P2, and P3 are further removed and the first conductive type semiconductor layers 210 of the first, second, and third light emitters P1, P2, and P3 are disposed to be separated from each other, the light emitting structure 200 including the first, second, and third light emitters P1, P2, and P3 separated from each other may be supported by the protective layer 270 which is disposed to surround side surfaces and a bottom surface of the light emitting structure 200.

The first conductive type semiconductor layer 210 of the first, second, and third light emitters P1, P2, and P3 may be connected to a single first electrode 294 as illustrated in FIG. 31A, or first electrodes 294 disposed on the first conductive type semiconductor layer 210 of the first, second, and third light emitters P1, P2, and P3 so as to come into contact with the first conductive type semiconductor layer 210 of the first, second, and third light emitters P1, P2, and P3 may be disposed to be separated from each other as illustrated in FIG. 31B. In the embodiment, the first electrode 294 is illustrated as being disposed only at an upper surface of the first conductive type semiconductor layer 210 of the first, second, and third light emitters P1, P2, and P3, but embodiments are not limited thereto. The first electrode 294 may also be disposed in a region of the protective layer 270. Meanwhile, in the case in FIG. 31B, the first electrodes 294 disposed on the first conductive type semiconductor layer 210 of the first, second, and third light emitters P1, P2, and P3 may be connected to a single common line 41.

Therefore, power may be applied to the first, second, and third light emitters P1, P2, and P3 of the light emitting device 10 via a single common line 41 (see FIG. 30A), and driving of the first, second, and third light emitters P1, P2, and P3 of the light emitting device 10 may be individually controlled through the driving lines 42 (see FIG. 30A) connected to the first, second, and third light emitters P1, P2, and P3 of the light emitting device 10.

FIGS. 32A to 32F are process cross-sectional views illustrating a method of manufacturing the light emitting device in FIG. 29A.

As illustrated in FIG. 32A, a light emitting structure 200 including a first conductive type semiconductor layer 210, an active layer 220, and a second conductive type semiconductor layer 230 may be formed on a substrate 1, and reflective electrodes 261, 262, and 263 may be formed on the second conductive type semiconductor layer 230 in each of the first, second, and third light emitters P1, P2, and P3 of the light emitting structure 200.

In this case, the first, second, and third light emitters P1, P2, and P3 of the light emitting structure 200 may have a structure in which mesa etching is performed on the first conductive type semiconductor layer 210, the active layer 220, and the second conductive type semiconductor layer 230. Portions of the first conductive type semiconductor layer 210, the active layer 220, and the second conductive type semiconductor layer 230 may be etched by mesa etching, and the reflective electrodes 261, 262, and 263 may be respectively disposed at the first, second, and third light emitters P1, P2, and P3 so as to be separated.

In the embodiment, a case in which the first, second, and third light emitters P1, P2, and P3 share a portion of the first conductive type semiconductor layer 210, and the active layer 220, the second conductive type semiconductor layer 230, and the reflective electrodes 261, 262, and 263 disposed on the first conductive type semiconductor layer 210 are separated corresponding to the first, second, and third light emitters P1, P2, and P3 is illustrated.

As illustrated in FIG. 32B, a protective layer 270 may be formed on the substrate 1 so as to cover the light emitting structure 200 and the reflective electrodes 261, 262, and 263, and then the protective layer 270 may be selectively removed so as to form through-holes 271 configured to expose the first, second, and third reflective electrodes 261, 262, and 263 respectively disposed at the first, second, and third light emitters P1, P2, and P3.

As illustrated in FIG. 32C, second electrodes 291, 292, and 293 which respectively come into contact with the first, second, and third reflective electrodes 261, 262, and 263 of the first, second, and third light emitters P1, P2, and P3 exposed due to the through-holes 271 may be formed on the protective layer 270. That is, the second electrodes 291, 292, and 293 may be respectively connected to the second conductive type semiconductor layers 230 of the first, second, and third light emitters P1, P2, and P3.

As illustrated in FIG. 32D, a support pad 400 which includes a photoresist layer 410 and a support layer 430 is formed at a front surface of the substrate 1 so as to cover the second electrodes 291, 292, and 293 and the protective layer 270. Then, as illustrated in FIG. 32E, the substrate 1 may be removed from the light emitting structure 200. A method of removing the substrate 1 is not particularly limited. For example, the substrate 1 may be removed using the LLO technique.

Meanwhile, although not illustrated, the first conductive type semiconductor layer 210 which is exposed due to the separation of the substrate 1 may be further removed after the substrate 1 is separated from the light emitting structure 200. In this way, as illustrated in FIGS. 31A and 31B, the first conductive type semiconductor layers 210 of the first, second, and third light emitters P1, P2, and P3 may be separated from each other.

Although not illustrated, when mesa etching is performed on the first conductive type semiconductor layer 210, the active layer 220, and the second conductive type semiconductor layer 230 as illustrated in FIG. 32A, the first conductive type semiconductor layer 210 may be removed so that an upper surface of the substrate 1 is exposed between the first, second, and third light emitters P1, P2, and P3, and the first conductive type semiconductor layers 210 of the first, second, and third light emitters P1, P2, and P3 may be disposed to be separated.

Then, as illustrated in FIG. 32F, the first electrode 294 may be formed on the first conductive type semiconductor layer 210 of the light emitting structure 200 exposed due to the removal of the substrate 1. Then, the support pad 400 may be removed from the light emitting structure 200. For example, the photoresist layer 410 may be removed by being dipped into a stripper solution. The stripper solution may include various organic/inorganic solvents capable of melting the photoresist. When the photoresist layer 410 is removed, the support layer 430 may be separated from the light emitting structure 200. Accordingly, the light emitting device 10 at a chip level including the first, second, and third light emitters P1, P2, and P3 may be formed.

A light emitting device according to a seventh embodiment will be described in detail below.

FIGS. 33A and 33B are cross-sectional views of the light emitting device according to the seventh embodiment.

As illustrated in FIG. 33A, a light emitting device 10 according to the seventh embodiment may include a light emitting structure 300 including first, second, and third light emitters P1, P2, and P3, a protective layer 370 disposed at a lower portion of the light emitting structure 300, a first electrode 394 electrically connected to a first conductive type semiconductor layer 310 of the light emitting structure 300 via the protective layer 370, and a plurality of second electrodes 361, 362, and 363 electrically connected to a second conductive type semiconductor layer 330 of the first, second, and third light emitters P1, P2, and P3 exposed at an upper surface of the light emitting structure 300.

The light emitting device 10 may be a vertical type, and the first electrode 394 and the second electrodes 361, 362, and 363 may be disposed in opposite directions while the light emitting structure 300 is disposed therebetween.

The first conductive type semiconductor layer 310, an active layer 320, and the second conductive type semiconductor layer 330 may be sequentially stacked in that order in the light emitting structure 300 such that the active layer 320 is disposed on the first conductive type semiconductor layer 310 and the second conductive type semiconductor layer 330 is disposed on the active layer 320.

The active layer 320 may be disposed to be separated on the first conductive type semiconductor layer 310 and disposed in each of the first, second, and third light emitters P1, P2, and P3. Then, the second conductive type semiconductor layer 330 may vertically overlap with the first conductive type semiconductor layer 310 while the active layer 320 is disposed therebetween. The first, second, and third light emitters P1, P2, and P3 may share the first conductive type semiconductor layer 310, and the first, second, and third light emitters P1, P2, and P3 may be connected to each other via the first conductive type semiconductor layer 310.

The above-described first, second, and third light emitters P1, P2, and P3 of the light emitting structure 300 may emit the same colored light. For example, the first, second, and third light emitters P1, P2, and P3 of the light emitting structure 300 may emit blue light.

Meanwhile, as illustrated in FIG. 33B, the first light emitter P1 and the third light emitter P3 may include the same first active layer 320a while the second light emitter P2 includes a second active layer 320b which differs from the first active layer 320a. In this case, the first active layer 320a may generate light in the blue (B) wavelength band, and the second active layer 320b may generate light in the green (G) wavelength band.

After the above-described light emitting device 10 is disposed in a panel of a display device, the first, second, and third light emitters P1, P2, and P3 of the light emitting structure 300 may implement light in the blue (B), green (G), and red (R) wavelength bands through wavelength converting layers and color filters.

Referring back to FIG. 33A, the first electrode 394 may be electrically connected to the light emitting structure 300 via the protective layer 370. A reflective electrode 350 may be disposed between the protective layer 370 and the light emitting structure 300, and the protective layer 370 may include through-holes 371 configured to expose the reflective electrode 350 such that the reflective electrode 350 exposed due to the through-holes 371 may electrically come into contact with the first electrode 394. The reflective electrode 350 may be configured to reflect light generated in the first, second, and third light emitters P1, P2, and P3 toward the second conductive type semiconductor layer 330. The reflective electrode 350 is illustrated in FIG. 33A as being disposed only at a surface at which the protective layer 370 and the first conductive type semiconductor layer 310 come into contact, but embodiments are not limited thereto. The reflective electrode 350 may be disposed at an entire upper surface of the protective layer 370, but embodiments are not limited thereto.

The second electrodes 361, 362, and 363 may be disposed on the second conductive type semiconductor layers 330 of the first, second, and third light emitters P1, P2, and P3 and may be electrically connected to the second conductive type semiconductor layers 330. The second electrodes 361, 362, and 363 may include a transparent material so that light generated in the first, second, and third light emitters P1, P2, and P3 travels in a direction in which blue, green, and red color filters 323a, 323b, and 323c are disposed. For example, the second electrodes 361, 362, and 363 may include materials such as ITO, IZO, IZTO, IAZO, IGZO, IGTO, AZO, ATO, GZO, IZON, AGZO, and IGZO, but embodiments are not limited thereto.

A display device including pixels in which the light emitting device according to the seventh embodiment is disposed will be described in detail below.

FIG. 34A is a plan view of a display device in which the light emitting device according to the seventh embodiment is disposed in every pixel region, and FIGS. 34B and 34C are cross-sectional views taken along line I-I' in FIG. 34A. In this case, FIG. 34B is a cross-sectional view taken along line I-I' in which the light emitting device in FIG. 33A is disposed in pixel regions, and FIG. 34C is cross-sectional view taken along line I-I' in which the light emitting device in FIG. 33B is disposed in pixel regions.

As illustrated in FIGS. 34A and 34B, a display device may include a panel 40 including a plurality of pixel regions defined by regions in which common lines 41 and driving lines 42 intersect, a light emitting device 10 disposed in each pixel region, a first driver 30 configured to apply a driving signal to the common lines 41, a second driver 20 configured to apply a driving signal to the driving lines 42, and a controller 50 configured to control the first driver 30 and the second driver 20.

A second partition 46 disposed in the panel 40 is disposed between the light emitting devices 10 disposed in the pixel regions and may support the light emitting devices 10, the common lines 41, the driving lines 42, and the like. Therefore, disconnection of the common lines 41 and the driving lines 42 may be prevented even when the panel 40 is enlarged to have a large area. The second partition 46 may include a material such as carbon black and graphite and prevent light leakage between adjacent pixel regions, but embodiments are not limited thereto.

The common lines 41 may be electrically connected to a first electrode 394 of the light emitting device 10. Also, first, second, and third driving lines 43, 44, and 45 may be respectively connected to second electrodes 361, 362, and 363 of the first, second, and third light emitters P1, P2, and P3. Since the first electrode 394 and the second electrodes 361, 362, and 363 are disposed in opposite directions with respect to the active layers 320a and 320b, the common lines 41 may be electrically connected to the first electrode 394 at an upper portion of the light emitting device 10, and the first, second, and third driving lines 42 (43, 44, and 45) may respectively be connected to the second electrodes 361, 362, and 363 of the first, second, and third light emitters P1, P2, and P3 at a lower portion of the light emitting device 10. Therefore, interference between the common lines 41 and the driving lines 42 may be efficiently prevented.

In the display device, the controller 50 may output a control signal to the first and second drivers 30 and 20 so that power is selectively applied to the common lines 41 and the driving lines 42. Accordingly, the first, second, and third light emitters P1, P2, and P3 of the light emitting device 10 may be individually controlled. For example, the controller 50 may supply power to the first, second, and third light emitters P1, P2, and P3 of the light emitting device 10 via the common lines 41 and may control the first, second, and third driving lines 42 (43, 44, and 45) so that the first, second, and third light emitters P1, P2, and P3 selectively emit light.

A wavelength converting layer 322 and blue, green, and red color filters 323a, 323b, and 323c may be disposed on the light emitting structure 300 so as to vertically overlap with the first, second, and third light emitters P1, P2, and P3 of the light emitting device 10 while the first, second, and third driving lines 42 (43, 44, and 45) are disposed therebetween. The wavelength converting layer 322 may include a material for converting light in the blue wavelength band emitted from the first, second, and third light emitters P1, P2, and P3 to light in the white wavelength band.

The above-described wavelength converting layer 322 may be separated by a first partition 321 corresponding to regions which vertically overlap the first, second and third light emitters P1, P2, and P3. The first partition 321 may prevent color mixture of light emitted from the first, second, and third light emitters P1, P2, and P3. The first partition 321 may include a light absorbing material such as carbon black and graphite, but may also include a reflective material which reflects light. A method of forming the first partition 321 is not particularly limited. For example, the first partition 321 may be formed using photolithography, imprinting, roll-to-roll printing, inkjet printing, and the like.

The light in the white wavelength band converted by the wavelength converting layer 322 as described above may implement light in the blue (B), green (G), and red (R) wavelength bands due to the blue, green, and red color filters 323a, 323b, and 323c disposed respectively in the first, second, and third light emitters P1, P2, and P3 on the wavelength converting layer 322.

Meanwhile, as illustrated in FIG. 34C, the red wavelength converting layer 322R and the red color filter 323c may be disposed only in a region that vertically overlaps with the third light emitter P3 of the first, second, and third light emitters P1, P2, and P3 while the common lines 41 are disposed therebetween on the light emitting structure 300, and light in the blue (B) wavelength band generated in the third light emitter P3 may be converted to light in the red (R) wavelength band. Accordingly, the first, second, and third light emitters P1, P2, and P3 may respectively implement light in the blue (B), green (G), and red (R) wavelength bands.

Meanwhile, the first conductive type semiconductor layer 310 of the first, second, and third light emitters P1, P2, and P3 of the light emitting device 10 may be disposed to be separated. In this case, the separation of the first conductive type semiconductor layer 310 of the first, second, and third light emitters P1, P2, and P3 may be performed by further removing the first conductive type semiconductor layer 310 exposed due to separating the substrate during the process of manufacturing the light emitting device 10.

FIGS. 35A to 35C are cross-sectional views of a light emitting device according to another structure of the seventh embodiment.

As illustrated in FIGS. 35A to 35C, the first conductive type semiconductor layers 310 of the first, second, and third light emitters P1, P2, and P3 of the light emitting device 10 according to the seventh embodiment may be disposed to be separated from each other. Even when the first conductive type semiconductor layers 310 of the first, second, and third light emitters P1, P2, and P3 are disposed to be separated from each other, the first, second, and third light emitters P1, P2, and P3 of the light emitting structure 300 may be supported through the protective layer 370.

As illustrated in FIG. 35A, the light emitting structure 300 and the first electrode 394 may be electrically connected via the reflective electrode 350 disposed between the protective layer 370 and the first conductive type semiconductor layers 310 of the first, second, and third light emitters P1, P2, and P3. Further, as illustrated in FIG. 35B, the reflective electrode 350 may also be separated as the first conductive type semiconductor layers 310 of the first, second, and third light emitters P1, P2, and P3. In this case, the reflective electrodes 350 which respectively come into contact with the first conductive type semiconductor layers 310 of the first, second, and third light emitters P1, P2, and P3 may be electrically connected to the first electrode 394.

Further, as illustrated in FIG. 35C, the first electrode 394 may be disposed to be separated so that the first electrodes 394 respectively come into contact with the first, second, and third light emitters P1, P2, and P3. In this case, the first electrodes 394 may respectively come into contact with the reflective electrodes 350 of the first, second, and third light emitters P1, P2, and P3 exposed at a bottom surface of the light emitting structure 300. Even when the first electrode 394 is disposed to be separated as illustrated in FIG. 35C, the first electrodes 394 of the first, second, and third light emitters P1, P2, and P3 may be connected to a single common line 41.

Therefore, even when the first conductive type semiconductor layer 310 of the first, second, and third light emitters P1, P2, and P3 are disposed to be separated, power may be applied to the first, second, and third light emitters P1, P2, and P3 of the light emitting device 10 via the single common line 41 (see FIG. 33A) electrically connected to the first electrodes 394, and driving of the first, second, and third light emitters P1, P2, and P3 of the light emitting device 10 may be individually controlled through the driving lines 42 (see FIG. 33A) connected to the first, second, and third light emitters P1, P2, and P3 of the light emitting device 10.

FIGS. 36A to 36F are process cross-sectional views illustrating a method of manufacturing the light emitting device according to the seventh embodiment.

As illustrated in FIG. 36A, a light emitting structure 300 including a first conductive type semiconductor layer 310, an active layer 320, and a second conductive type semiconductor layer 330 may be formed on the substrate 1, and reflective electrodes 361, 362, and 363 may be formed on the second conductive type semiconductor layer 330 in each of the first, second, and third light emitters P1, P2, and P3 of the light emitting structure 300.

In this case, the first, second, and third light emitters P1, P2, and P3 of the light emitting structure 300 may have a structure in which mesa etching is performed on the first conductive type semiconductor layer 310, the active layer 320, and the second conductive type semiconductor layer 330. Portions of the first conductive type semiconductor layer 310, the active layer 320, and the second conductive type semiconductor layer 330 may be etched by mesa etching, and the reflective electrodes 361, 362, and 363 may be respectively disposed at the first, second, and third light emitters P1, P2, and P3 so as to be separated.

In the embodiment, a case in which the first, second, and third light emitters P1, P2, and P3 share a portion of the first conductive type semiconductor layer 310, and the active layer 320, the second conductive type semiconductor layer 330, and the reflective electrodes 361, 362, and 363 disposed on the first conductive type semiconductor layer 310 are separated corresponding to the first, second, and third light emitters P1, P2, and P3 is illustrated.

Then, as illustrated in FIG. 36B, a support pad 400 which includes a photoresist layer 410 and a support layer 430 may be formed at a front surface of the substrate 1 so as to cover the second electrodes 361, 362, and 363 and the light emitting structure 300, and then the substrate 1 may be separated from the light emitting structure 300. A method of separating the substrate 1 is not particularly limited. For example, the substrate 1 may be separated from the light emitting structure 300 using the LLO technique.

Meanwhile, although not illustrated, the first conductive type semiconductor layer 310 which is exposed due to the separation of the substrate 1 may be further removed after the substrate 1 is separated from the light emitting structure 300. In this way, as illustrated in FIGS. 35A and 35B, the first conductive type semiconductor layers 310 of the first, second, and third light emitters P1, P2, and P3 may be separated from each other.

Although not illustrated, when mesa etching is performed on the first conductive type semiconductor layer 310, the active layer 320, and the second conductive type semiconductor layer 330 as illustrated in FIG. 36A, the first conductive type semiconductor layer 310 may be removed so that an upper surface of the substrate 1 is exposed between the first, second, and third light emitters P1, P2, and P3, and the first conductive type semiconductor layers 310 of the first, second, and third light emitters P1, P2, and P3 may be disposed to be separated.

Then, as illustrated in FIG. 36C, a reflective electrode 350 may be formed on the first conductive type semiconductor layer 310 of the light emitting structure 300 exposed due to the separation of the substrate 1. As illustrated in FIG. 36D, a protective layer 370 is formed on the reflective electrode 350, and the protective layer 370 is selectively removed so as to form through-holes 371 configured to expose the reflective electrode 350 in a region that vertically overlaps with the first, second, and third light emitters P1, P2, and P3. Then, as illustrated in FIG. 36E, a first electrode 394 which electrically comes into contact with the reflective electrode 350 exposed via the through-holes 371 may be formed on the protective layer 370.

Then, as illustrated in FIG. 36F, the support pad 400 may be removed from the light emitting structure 300. For example, the photoresist layer 410 may be removed by being dipped into a stripper solution. The stripper solution may include various organic/inorganic solvents capable of melting the photoresist. When the photoresist layer 410 is removed, the support layer 430 may also be removed from the light emitting structure 300. Accordingly, the light emitting device 10 at a chip level including the first, second, and third light emitters P1, P2, and P3 may be formed. Meanwhile, the first electrode 394 may also be directly formed on the reflective electrode 350.

FIGS. 37A and 37B are cross-sectional views of a light emitting device according to an eighth embodiment.

As illustrated in FIG. 37A, first conductive type semiconductor layers 510 of first, second, and third light emitters P1, P2, and P3 of a light emitting device 10 according to the eighth embodiment may be disposed to be separated from each other, and first electrodes 591, 592, and 593 which respectively come into contact with the first conductive type semiconductor layers 510 of first, second, and third light emitters P1, P2, and P3 may come into contact with different driving lines 45, 44, and 43, respectively. In this case, driving of the first, second, and third light emitters P1, P2, and P3 of the light emitting device 10 may be individually controlled through the driving lines 45, 44, and 43.

Also, a common line 41 of a panel configured to supply power to the first, second, and third light emitters P1, P2, and P3 may be supplied to the first, second, and third light emitters P1, P2, and P3 via second electrodes 594, and the second electrodes 594 which come into contact with second conductive type semiconductor layers 530 of the first, second, and third light emitters P1, P2, and P3 may be disposed to be separated from each other.

Specifically, the second electrodes 594 may be disposed to be separated so that the second electrodes 594 are disposed at a bottom surface of a light emitting structure 500 and respectively come into contact with reflective electrodes 561, 562, and 563 of the first, second, and third light emitters P1, P2, and P3. In this case, different second electrodes 594 which are respectively in contact with the reflective electrodes 561, 562, and 563 of the first, second, and third light emitters P1, P2, and P3 may be connected to a single common line 41. Meanwhile, as illustrated in FIG. 37B, the reflective electrodes 561, 562, and 563 of the first, second, and third light emitters P1, P2, and P3 may come into contact with a single second electrode 594, and the reflective electrodes 561, 562, and 563 of the first, second, and third light emitters P1, P2, and P3 may be electrically connected via the second electrode 594.

As described above, the light emitting device 10 according to the embodiment includes the first, second, and third light emitters P1, P2, and P3 which are individually driven, and the light emitting device 10 at a chip level may serve as each pixel of a display device. In this case, the first, second, and third light emitters P1, P2, and P3 may serve as subpixels of a pixel. Therefore, a high-resolution display device may be implemented.

The above-described light emitting device may be applied to an electric sign board or a mobile communication terminal and implement an image or may be applied to a traffic light, a vehicle headlight, and the like.

FIG. 38 is a view illustrating a mobile communication terminal including a panel in which the light emitting device according to an embodiment is disposed.

As illustrated in FIG. 38, a mobile communication terminal 1 may include a screen 2 configured to display an image and a case 3 configured to surround the screen 2. The screen 2 may include a panel, and the above-described light emitting device 10 may be disposed in each pixel of the panel. Also, the above-described light emitting device may be configured as a light emitting device package and used as a light source of a lighting system. For example, the above-described light emitting device may be used as a light source of an image display device or a light source of a lighting device or the like.

FIG. 39 is a conceptual view of a display device according to an embodiment of the present disclosure, FIG. 40 is a conceptual view of a light emitting device constituting pixels in FIG. 39, and FIG. 41 is a view showing a light emitting structure grown on a wafer.

Referring to FIG. 39, a display device may include an array substrate 200 on which a plurality of common lines 241 and driving lines 242 intersect, a panel 40 including a plurality of light emitting devices 10, a first driver 20 configured to apply a driving signal to the common lines 241, a second driver 30 configured to apply a driving signal to the driving lines 242, and a controller 50 configured to control the first driver 20 and the second driver 30. According to such a configuration, a separate backlight unit may be omitted.

The array substrate 200 may be a circuit board in which the plurality of light emitting devices 10 are mounted. The array substrate 200 may be a rigid substrate or a flexible substrate formed of a single layer or multiple layers. The common lines 241 and the driving lines 242 may be formed on the array substrate 200.

In pixel regions, the light emitting devices 10 may be mounted and serve as RGB pixels. The pixel regions may be defined by regions in which the plurality of common lines 241 and driving lines 242 intersect.

The common lines 241 may be electrically connected to the plurality of light emitting devices 10 disposed in a first direction. Hereinafter, the first direction refers to an X-direction, and a second direction refers to a Z-direction.

A method of electrically connecting the common lines 241 and the plurality of light emitting devices 10 is not particularly limited. For example, the common lines 241 and the light emitting devices 10 may be electrically connected using through-electrodes or lead electrodes of a substrate.

The driving lines 242 may be electrically connected to the plurality of light emitting devices 10 disposed in the Z-direction.

A method of electrically connecting the driving lines 242 and the plurality of light emitting devices 10 is not limited. For example, the driving lines 242 and the light emitting devices 10 may be electrically connected using through-electrodes or lead electrodes of a substrate.

A protective layer 46 may be disposed between the plurality of light emitting devices 10. The protective layer 46 may protect the light emitting devices 10 and circuit patterns of the array substrate 200.

The protective layer 46 may be formed of a material such as solder resist or formed of an insulating material. The protective layer 46 may include at least one of $SiO_2$, $Si_3N_4$, $TiO_2$, $Al_2O_3$, and MgO.

The protective layer 46 may include a black matrix material. When the protective layer 46 is formed of a black matrix material, the protective layer 146 may be implemented using carbon black, graphite, or poly pyrrole, for example.

The controller 50 may output a control signal to the first and second drivers 20 and 30 so that power is selectively applied to the common lines 241 and the driving lines 242. In this way, the plurality of light emitting devices 10 may be controlled.

The display device may be a large-screen electric sign board or a large-screen TV whose diagonal size is 100 inches or greater. Since pixels are implemented using LEDs in the embodiment, power consumption may be decreased, and a long service life may be provided with a low maintenance cost. Also, color purity and color reproduction may be excellent.

Referring to FIG. 40, a light emitting device 10 includes a substrate S, a first light emitter P1 configured to emit first light, a second light emitter P2 disposed on the substrate and configured to emit second light, and a third light emitter P3 disposed on the substrate and configured to emit third light.

The substrate S may include a first side surface S1 and a second side surface S2 which are parallel in the X-direction and a third side surface S3 and a fourth side surface S4 which are parallel in the Z-direction. The substrate S is not particularly limited as long as the substrate S is a configuration which supports the first to third light emitters.

The first light emitter P1 may emit light in the blue wavelength band, and the second light emitter P2 may emit light in the green wavelength band. The third light emitter P3 may emit light in the blue wavelength band or the red wavelength band.

An active layer of the third light emitter P3 may emit light in the blue wavelength band and emit light in the red wavelength band by a separate wavelength converting layer. The wavelength converting layer may be disposed in the light emitting device 10 or may be separately formed outside the light emitting device. However, embodiments are not necessarily limited thereto, and the active layer of the third light emitter P3 may also emit light in the red wavelength band.

The second light emitter P2 may be disposed to be longer than the first light emitter P1 and/or the third light emitter P3 in the Z-direction (W3>W5>W1). Widths of the first to third light emitters P1, P2, and P3 may be the same in the X-direction (W2=W4=W6), but embodiments are not necessarily limited thereto, and the widths may also differ from each other.

The ratio of areas between the first to third light emitters P1, P2, and P3 may be 1:3:3 or 1:3:2. That is, an area of the second light emitter P2 may be the greatest. Here, the ratio of areas between the first to third light emitters P1, P2, and P3 may be the ratio of areas between active layers of the light emitters.

The first light emitter P and the third light emitter P3 may be disposed to be spaced apart from the second light emitter P2 in the X-direction, and the first light emitter P and the third light emitter P3 may be disposed to be spaced apart in the X-direction. That is, the first light emitter P1 and the third light emitter P3 may be disposed on the same line in the Z-direction, and the second light emitter P2 may be disposed on a neighboring line. For example, the second light emitter P2 is illustrated as being disposed at the left side, and the first light emitter P1 and the third light emitter P3 are illustrated as being disposed at the right side, but embodiments are not necessarily limited thereto. The second light emitter P2 may be disposed at the right side while the first light emitter P1 and the third light emitter P3 are disposed at the left side.

Referring to FIG. 41, when a light emitting structure is grown on a wafer W, a process in which a light emitting structure in a partial region is removed and a light emitting structure having a different wavelength band is re-grown may be performed. According to such a process, for example, a light emitting structure line configured to emit light in a green wavelength band (hereinafter referred to as green line) and a light emitting structure line configured to emit light in a blue wavelength band (hereinafter referred to as blue line) may be alternately disposed.

During cutting of a wafer, when the wafer is cut so that the wafer includes at least one green line and at least one blue line, each light emitting device may have a green light emitter and a blue light emitter. In this case, the arrangement of light emitters in a light emitting device may vary according to whether the wafer is cut so that the green line is at the left side (A) or cut so that the green line is at the right side (B).

Then, a blue light emitter may be separated into two blue light emitters through etching, and a wavelength converting layer may be formed in one of the two blue light emitters so that a red light emitter is formed. Therefore, according to the embodiment, the first light emitter and the third light emitter may be disposed on the blue line while the second light emitter is disposed on the green line.

FIG. 42 is a view showing a state in which a plurality of light emitting devices are electrically connected to lines, FIG. 43 is a modified example of FIG. 42, and FIGS. 44 to 46 are views showing various pixel arrangement forms.

Referring to FIG. 42, a plurality of light emitting devices 10 may be disposed in the X-direction and the Z-direction and serve as pixels. In this case, first to third driving lines 243, 244, and 245 may be disposed at lower portions of the light emitting devices 10 and electrically connected thereto. However, embodiments are not limited thereto, and the first to third driving lines 243, 244, and 245 may also be disposed at upper portions of the light emitting devices 10. Description will be given below by assuming that the driving lines are disposed at the lower portions of the light emitting devices 10.

The first driving line 243 may be electrically connected to the second light emitter P2. The second driving line 244 may be electrically connected to the first light emitter P1. The third driving line 245 may be electrically connected to the third light emitter P3.

The light emitting device 10 may include a first-first electrode pad 244a configured to connect the first light emitter P1 and the second driving line 244, a first-second electrode pad 243a configured to connect the second light emitter P2 and the first driving line 243, and a first-third electrode pad 245a configured to connect the third light emitter P3 and the third driving line 245. The first-first to first-third electrode pads 244a, 243a, and 245a may be electrically connected to the respective light emitters via through-electrodes and the like.

According to the embodiment, since the first to third driving lines 243, 244, and 245 may be formed to be parallel in the Z-direction even when the first light emitter P1 and the third light emitter P3 are disposed in the Z-direction, circuit patterns are simplified. Therefore, a driving sequence of a driver IC may also be simplified.

According to the embodiment, the arrangement of the first to third light emitters P1, P2, and P3 may be the same in the plurality of light emitting devices 10. According to such a configuration, readability of a linear (straight-line) image may be excellent. However, embodiments are not necessarily limited thereto, and the arrangement of the first to third light emitters P1, P2, and P3 may be different in each light emitting device 10.

Referring to FIG. 43, the plurality of light emitting devices 10 may be distinguished as a first light emitting device (A) in which the second light emitter P2 is disposed at the left side and a second light emitting device (B) in which the second light emitter P2 is disposed at the right side based on the drawing. As described above with reference to FIG. 41, this may be determined according to a cutting position in a wafer.

In this case, the first light emitting device (A) or the second light emitting device (B) may be consecutively disposed in the X-direction, and the first light emitting device (A) and the second light emitting device (B) may be alternately disposed Z-direction. Generally, diagonal lines and curved lines account for a larger portion than straight lines in an image on a display implemented by pixels. According to such alternate arrangement, readability of a curved image may be improved.

In this case, the second light emitting device (B) may include, at a lower surface thereof, a second-first electrode pad 244b configured to connect the first light emitter P1 and the second driving line 244, a second-second electrode pad 243b configured to connect the second light emitter P2 and the first driving line 243, and a second-third electrode pad 245b configured to connect the third light emitter P3 and the third driving line 245. The second-first to second-third electrode pads 244b, 243b, and 245b may be electrically connected to respective light emitters via through-electrodes and the like. A structure of the electrode pads of the first light emitting device (A) is the same as that described above with reference to FIG. 42.

According to the embodiment, since the first to third driving lines 243, 244, and 245 may be formed to be parallel in the Z-direction even when positions of the light emitters of the first light emitting device (A) and the second light emitting device (B) are changed, circuit patterns are simplified. Therefore, a driving sequence of a driver IC may also be simplified.

Such alternate arrangement may be modified in various forms. In addition to a case in which the first light emitting device (A) and the second light emitting device (B) are alternately arranged in the Z-direction as illustrated in FIG. 44, the first light emitting device (A) and the second light emitting device (B) may be alternately arranged in the X-direction as illustrated in FIG. 45. Alternatively, the first light emitting device (A) and the second light emitting device (B) may be alternately arranged in both of the X-direction and the Z-direction.

FIG. 47 is a conceptual view of a light emitting device according to an embodiment of the present disclosure, and FIG. 48 is a modified example of FIG. 47.

Referring to FIG. 47, a light emitting device according to the embodiment includes a first conductive type semiconductor layer 110, a plurality of active layers 121, 122, and 123 disposed to be spaced apart on the first conductive type semiconductor layer 110, and a plurality of second conductive type semiconductor layers 131, 132, and 133 respectively disposed on the plurality of active layers 121, 122, and 123. FIG. 47 may be a cross-section of FIG. 40 when FIG. 40 is viewed along line I-I'.

The plurality of active layers 121, 122, and 123 may include a first active layer 121, a second active layer 122, and a third active layer 123 which are disposed to be spaced apart in a first direction. The second active layer 122 may emit light in a different wavelength band from those of light emitted by the first active layer 121 and the third active layer 123.

According to a reflective structure of a chip, light output from the plurality of active layers 121, 122, and 123 may be output upward or downward based on the drawings.

For example, the first active layer 121 may emit light in a blue wavelength band, and the second active layer 122 may emit light in a green wavelength band.

The third active layer 123 may emit light in a blue wavelength band. The light in a blue wavelength band emitted from the third active layer 123 may be converted to light in a red wavelength band by a wavelength converting layer. However, embodiments are not necessarily limited thereto, and the third active layer 123 may also emit light in a red wavelength band.

The first to third light emitters P1, P2, and P3 may independently include the active layers 121, 122, and 123 and second conductive type semiconductor layers 131, 132, and 133, respectively, and share the first conductive type semiconductor layer 110. According to such a configuration, crack formation in a light emitting structure may be prevented by the first conductive type semiconductor layer 110 whose thickness is relatively large. Further, a current distribution effect may be achieved. However, embodiments are not necessarily limited thereto, and first conductive type semiconductor layers 111, 112, and 113 of the light emitters P1, P2, and P3 may also be partitioned by etching as illustrated in FIG. 48.

Referring back to FIG. 47, common power may be applied to the first conductive type semiconductor layer 110, and driving power may be selectively applied to the plurality of second conductive type semiconductor layers 131, 132, and 133. According to the embodiment, only active layers to which a driving voltage is applied may emit light individually.

For example, the first light emitter P1 may emit blue light when power is input only to the second conductive type semiconductor layer 131 of the first light emitter P1 in a state in which power is input to the first conductive type semiconductor layer 110. Likewise, blue light and green light may be simultaneously emitted when power is applied to the second conductive type semiconductor layers 131 and 132 of the first light emitter P1 and the second light emitter P2.

Therefore, the light emitting device 10 may constitute a pixel of a display device, and the first to third light emitters P1, P2, and P3 may serve as RGB subpixels.

When pixels are implemented using the light emitting device according to the embodiment, a process of packaging three light emitting devices to configure RGB pixels may be omitted. Further, since light emitting device chips, which are smaller in size than RGB packages, are used, a panel with high resolution may be manufactured.

A height d2 of the second active layer 122 may be less than heights d1 and d3 of the first active layer 121 and the third active layer 123. The second light emitter P2 may be manufactured by etching and then re-growing a light emitting structure. Since the light emitting structure may be damaged during the re-growth, it is preferable that the re-growth time be minimized.

When a thickness of the re-grown first conductive type semiconductor layer is minimized, the re-growth time may be reduced. In this process, the height d2 of the second active layer 122 may be relatively decreased.

FIGS. 49A to 49G are views for describing a method of manufacturing the light emitting device according to an embodiment of the present disclosure.

Referring to FIG. 49A, a light emitting structure may be formed by sequentially forming a first conductive type semiconductor layer 110, an active layer 120, and a second conductive type semiconductor layer 130 in that order on a substrate 1.

The substrate 1 may be formed of a material selected from sapphire ($Al_2O_3$), SiC, GaAs, GaN, ZnO, Si, GaP, InP, and Ge, but embodiments are not limited thereto.

A buffer layer (not illustrated) may be further disposed between the first conductive type semiconductor layer 110 and the substrate 1. The buffer layer may reduce lattice mismatch between the substrate 1 and the light emitting structure disposed on the substrate 1.

The buffer layer may have a form in which group III and group V elements are combined or may include any one of GaN, InN, AlN, InGaN, AlGaN, InAlGaN, and AlInN. The buffer layer may be doped with a dopant, but embodiments are not limited thereto.

The first conductive type semiconductor layer 110, the active layer 120, and the second conductive type semiconductor layer 130 may be formed using methods such as MOCVD, CVD, PECVD, MBE, HVPE, and sputtering.

Then, a mask 2 is formed on an upper surface of the light emitting structure so as to expose a first region 3. A material of the mask 2 is not limited.

Referring to FIG. 49B, etching may be performed so that the light emitting structure is removed up to a portion of the first conductive type semiconductor layer 110. An etching depth 3a of the first conductive type semiconductor layer 110 may be in a range of about 100 nm to 400 nm.

In this case, a second mask 2a may be formed at a side surface of the first region 3 so that damages to the light emitting structure due to subsequent processes are prevented.

Referring to FIG. 49C, the re-growing includes re-growing a first conductive type semiconductor layer 11a of a second light emitter P2. A physical interface may be formed between the re-grown first conductive type semiconductor layer 111a and the first conductive type semiconductor layer 110 which is not etched yet, but embodiments are not necessarily limited thereto. The interface may disappear due to the re-growth.

A thickness of the re-grown first conductive type semiconductor layer 111a may be less than a thickness of the etched first conductive type semiconductor layer. Generally, since a growth temperature of n-GaN is relatively high, the light emitting structure which is not etched may be damaged. Particularly, a temperature is relatively high in a process of manufacturing a green light emitting structure. Therefore, it is preferable that the re-grown first conductive type semiconductor layer 111a be manufactured to have the minimum thickness. To minimize damages to the light emitting structure, it may be preferable that a growth temperature of a blue light emitting structure be increased and a growth temperature of the green light emitting structure be decreased.

A second active layer 122 may emit green light. That is, a composition of the second active layer 122 may differ from a composition of an unetched active layer. A second conductive type semiconductor layer 132 may be formed on the second active layer 122.

Referring to FIG. 49D, a thickness d2 of the first conductive type semiconductor layer of the second light emitter P2 may be 100 nm to 200 nm less than a thickness of an etched layer. As a result, the height d2 of the second active layer may be formed to be less than a height d1 of an active layer of a first light emitter. In this case, an active layer 123 configured to emit red light may be re-grown by etching the third light emitter P3.

Then, the mask may be removed to complete the manufacturing process. Side surfaces of the manufactured first to third light emitters P1, P2, and P3 may be re-etched as necessary to remove edge defects.

Referring to FIG. 49E, a plurality of second electrodes 161, 162, and 163 may be formed on the first to third light emitters P1, P2, and P3, respectively. Mesa etching may be simultaneously performed on the second electrodes 161, 162, and 163 after the second electrodes 161, 162, and 163 are formed on the light emitting structure in advance.

In this case, a side surface of the first conductive type semiconductor layer 110 may be isolation-etched (3e). The isolation-etching (3e) may include etching up to a thickness of a buffer layer.

Referring to FIG. 49F, the substrate 1 may be removed after a support pad 600 including a photoresist layer 610, an adhesive layer 620, and a support layer 630 is formed and fixed on the light emitting structure. The adhesive layer 620 may fix the photoresist layer 610 and the support layer 630. In this case, a method of removing the substrate 1 is not particularly limited. The substrate 1 may be removed using the LLO technique.

Then, a first electrode 150 is formed on the exposed first conductive type semiconductor layer 110. In this case, it is preferable that the first electrode 150 be formed after up to a buffer layer having relatively low conductivity is removed. When the above-described isolation-etching has been performed in advance, the light emitting device may be separated into a plurality of chips when the buffer layer is removed.

Any generally-used method of forming an electrode such as sputtering, coating, and depositing may be applied as a method of forming the first electrode 150. A reflective layer and an ohmic layer may be further formed during the formation of the first electrode 150.

Referring to FIG. 49G, after an adhesive tape 240 is attached to the first electrode 150, the photoresist layer may be removed, and the support pad may be detached. The photoresist layer may be removed by being dipped into a stripper solution. The stripper solution may include various organic/inorganic solvents capable of melting the photoresist. The adhesive tape 240 may be removed afterwards.

FIG. 50 is a plan view showing a light emitting device according to another embodiment of the present disclosure, and FIG. 51 is a cross-sectional view showing the light emitting device according to the other embodiment of the present disclosure.

Referring to FIGS. 50 and 51, a light emitting device according to the embodiment may be a flip chip type. The light emitting device includes first to third light emitters P1, P2, and P3, a protective layer 170 configured to cover the first to third light emitters P1, P2, and P3, a first electrode 194 electrically connected to a first conductive type semiconductor layer 110 via the protective layer 170, and a plurality of second electrodes 191, 192, and 193 electrically connected to a plurality of second conductive type semiconductor layers 131, 132, and 133 via the protective layer 170.

The protective layer 170 may be a substrate configured to support side surfaces and a lower portion of a light emitter. The protective layer 170 may be manufactured using a resin such as PC and PMMA. In this case, the protective layer 170 may include at least one of $SiO_2$, $Si_3N_4$, $TiO_2$, $Al_2O_3$, and MgO.

The protective layer 170 may serve as a light reflecting layer and/or a light absorbing layer. The protective layer 170 may include light reflecting particles to serve as the light reflecting layer and may include carbon black, graphite, and the like to serve as the light absorbing layer. However, embodiments are not necessarily limited thereto, and the light emitting device may further include a separate light reflecting layer.

The first electrode 194 may be electrically connected to the first conductive type semiconductor layer 110 via the protective layer 170. In this case, an ohmic electrode 164 may be disposed between the first conductive type semiconductor layer 110 and the first electrode 194.

The plurality of second electrodes 191, 192, and 193 may be electrically connected to a plurality of ohmic electrodes 161, 162, and 163 via the protective layer 170.

The light emitting device according to the embodiment may be applied to an electric sign board or a mobile communication terminal and implement an image or may be applied to a traffic light, a vehicle headlight, and the like.

When used as a backlight unit of an image display device, the light emitting device may be used as an edge type backlight unit or a direct type backlight unit. When used as a light source of a lighting device, the light emitting device may be used as a lighting device or a bulb type. The light emitting device may also be used as a light source of a mobile terminal.

The light emitting device may be a laser diode other than the above-described LED.

Like the above-described light emitting device, the laser diode may include a first conductive type semiconductor layer, an active layer, and a second conductive type semiconductor layer which have the above-described structures. Further, the laser diode uses an electroluminescence phenomenon in which light is emitted when a current is made to flow after a p-type first conductive type semiconductor and an n-type second conductive type semiconductor are joined. However, there are differences in terms of directionality and phase of light. That is, the laser diode uses the so-called "stimulated emission" phenomenon, a constructive interference phenomenon, and the like such that light having a single specific wavelength (monochromatic beam) may be emitted in the same direction with the same phase. Due to such a characteristic, the laser diode may be used for optical communication equipment, medical equipment, semiconductor process equipment, and the like.

Examples of a light receiving device may include a photodetector, which is a type of transducer configured to detect light and convert an intensity of the light to an electrical signal. Examples of the photodetector include a photoelectric cell (silicon, selenium), a photoconductive device (cadmium sulfide, cadmium selenide), a photodiode (PD) (for example, a PD having a peak wavelength in a visible blind spectral region or a true blind spectral region), a phototransistor, a photomultiplier tube, a photoelectric tube (vacuum, gas-filled), an infrared (IR) detector, and the like, embodiments are not limited thereto.

A semiconductor device such as a photodetector may be manufactured using a direct bandgap semiconductor which generally has excellent light conversion efficiency. There are various photodetector structures. Photodetectors having the most common structures include a pin type photodetector which uses a p-n junction, a schottky photodetector which uses a Schottky junction, a metal-semiconductor-metal (MSM) photodetector.

Like the above-described light emitting device, the photodiode may include a first conductive type semiconductor layer, an active layer, and a second conductive type semiconductor layer which have the above-described structures and may be formed of a p-n junction or pin structure. The photodiode is operated by applying a reverse bias or zero-bias, and when light is incident on the photodiode, electrons and holes are generated, and a current flows therethrough. In this case, the amplitude of the current may be almost proportional to the intensity of light incident on the photodiode.

The photoelectric cell or solar cell is a type of photodiode and may convert light to current. Like the above-described light emitting device, the solar cell may include a first conductive type semiconductor layer, an active layer, and a second conductive type semiconductor layer which have the above-described structures.

The above-described light emitting device may also be used as a rectifier of an electronic circuit through rectification characteristics of a general diode using a p-n junction and may be applied to a microwave circuit and applied to an oscillation circuit and the like.

The above-described semiconductor device is not necessarily implemented only with semiconductors and may further include metal materials according to circumstances. For example, a semiconductor device such as a light receiving device may be implemented using at least one of Ag, Al, Au, In, Ga, N, Zn, Se, P, and As or may be implemented using a semiconductor material doped with a p-type or n-type dopant or an intrinsic semiconductor material.

The embodiments of the present disclosure have been described above, but the embodiments are merely examples, and the present disclosure is not limited by the embodiments. Those of ordinary skill in the art to which the present disclosure pertains should understand that various modifications and applications not described above may be made within the scope not departing from essential features of the present embodiments. For example, the embodiments may be practiced by modifying each element specifically described in the embodiments. Differences related to such modifications and applications should be interpreted as belonging to the scope of the present disclosure defined by the appended claims.

The invention claimed is:

1. A semiconductor device comprising:
   a light emitting structure including a first conductive type semiconductor layer, a plurality of active layers disposed to be spaced apart on the first conductive type semiconductor layer, and a plurality of second conductive type semiconductor layers disposed on the plurality of active layers, respectively;
   a first electrode electrically connected to the first conductive type semiconductor layer; and
   a plurality of second electrodes electrically connected to the plurality of second conductive type semiconductor layers, respectively, wherein:
   the plurality of active layers include a first active layer, a second active layer, and a third active layer;
   the light emitting structure includes a first light emitter including the first active layer, a second light emitter including the second active layer, and a third light emitter including the third active layer;
   the first active layer emits light in a blue wavelength band while the second active layer emits light in a green wavelength band; and
   a height of the second active layer is smaller than a height of the first active layer and a height of the third active layer,
   wherein the first active layer, the second active layer and the third active layer are directly in contact with the first conductive type semiconductor.

2. The semiconductor device of claim 1, wherein:
   a height of the third active layer differs from heights of the first and second active layers; and
   the third active layer emits light in a red wavelength band.

3. The semiconductor device of claim 1, wherein:
   the first conductive type semiconductor layer includes a base part and a plurality of convex parts and concave parts disposed on the base part;
   the plurality of active layers are disposed on the plurality of convex parts; and
   a cross-sectional area of the base part progressively increases or decreases toward the active layers.

4. The semiconductor device of claim 3, wherein a thickness of the concave part is in a range of 10% to 60% of the maximum thickness of the light emitting structure.

5. The semiconductor device of claim 1, further comprising:
   a protective layer disposed on the light emitting structure and configured to expose one surface of the first conductive type semiconductor layer; and
   a wavelength converting layer and a color filter disposed on the one surface of the first conductive type semiconductor layer, wherein:
   the first electrode is disposed on one surface of the first conductive type semiconductor layer, and
   the plurality of second electrodes are electrically connected to the second conductivity type semiconductor layer through the protection layer, is electrically connected to the first conductive type semiconductor layer via the protective layer;

the plurality of second electrodes are electrically connected to the second conductive type semiconductor layers via the protective layer; and the first electrode and the second electrodes are disposed in a direction in which the second conductive type semiconductor layers are disposed with respect to the first, second, and third active layers.

6. The semiconductor device of claim 5,
wherein the first electrode and the plurality of second electrodes are disposed in a direction in which the second conductive type semiconductor layers are disposed with respect to the first, second, and third active layers.

7. The semiconductor device of claim 5, further comprising:
a reflective electrode disposed on the second conductive type semiconductor layer; and
a connecting electrode electrically connected to the first conductivity type semiconductor layer and disposed between the protective layer and the first conductive type semiconductor layer.

8. The semiconductor device of claim 7, wherein:
the protective layer includes a through-hole, and
the first electrode and the plurality of second electrodes are disposed in the through hole.

9. The semiconductor device of claim 7, wherein the reflective electrode is disposed on the first light emitter, the second light emitter, and the third light emitter, respectively.

10. The semiconductor device of claim 9, wherein the plurality of second electrodes are the reflective electrode of electrically connected to the first light emitter, the second light emitter, and the third light emitter integrally or separately.

11. The semiconductor device of claim 5, wherein the wavelength converting layer is disposed on the third light emitter.

12. The semiconductor device of claim 5, wherein the wavelength converting layer converts light of a blue wavelength band emitted from the first active layer into light of a red wavelength band.

13. The semiconductor device of claim 12, wherein the second light emitter is disposed between the first light emitter and the third light emitter.

14. The semiconductor device of claim 1, wherein:
the first light emitter and the third light emitter are disposed to be spaced apart from the second light emitter in a first direction;
the first light emitter and the third light emitter are disposed to be spaced apart in a second direction that is perpendicular to the first direction;
the second light emitter is longer than the first light emitter or the third light emitter in the second direction; and
the first light emitter emits light in a blue wavelength band, the second light emitter emits light in a green wavelength band, and the third light emitter emits light in a blue or red wavelength band.

15. The semiconductor device of claim 1,
wherein the second active layer is disposed between the first active layer and the third active layer.

16. The semiconductor device of claim 1, wherein the first electrode and the plurality of second electrodes are rotationally symmetric.

17. The semiconductor device of claim 1, wherein the first electrode and the plurality of second electrodes include a ferromagnetic material.

* * * * *